(12) United States Patent
Koike et al.

(10) Patent No.: US 7,141,444 B2
(45) Date of Patent: Nov. 28, 2006

(54) PRODUCTION METHOD OF III NITRIDE COMPOUND SEMICONDUCTOR AND III NITRIDE COMPOUND SEMICONDUCTOR ELEMENT

(75) Inventors: Masayoshi Koike, Aichi (JP); Yuta Tezen, Aichi (JP); Hiroshi Yamashita, Aichi (JP); Seiji Nagai, Aichi (JP); Toshio Hiramatsu, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/221,486

(22) PCT Filed: Mar. 12, 2001

(86) PCT No.: PCT/JP01/01928

§ 371 (c)(1),
(2), (4) Date: Dec. 23, 2002

(87) PCT Pub. No.: WO01/69663

PCT Pub. Date: Sep. 20, 2001

(65) Prior Publication Data

US 2003/0134446 A1    Jul. 17, 2003

(30) Foreign Application Priority Data

| Mar. 14, 2000 | (JP) | ............................. 2000-071351 |
| Mar. 14, 2000 | (JP) | ............................. 2000-071352 |
| Mar. 14, 2000 | (JP) | ............................. 2000-071353 |
| Mar. 31, 2000 | (JP) | ............................. 2000-099950 |

(51) Int. Cl.
*H01L 21/00* (2006.01)

(52) U.S. Cl. ........................... 438/34; 438/44; 438/481

(58) Field of Classification Search ................ 257/103; 438/34, 42, 41, 44, 341, 481
See application file for complete search history.

(56) References Cited

U.S. PATENT DOCUMENTS

| 5,185,290 | A | 2/1993 | Aoyagi et al. |
| 5,798,536 | A | 8/1998 | Tsutsui |
| 6,051,849 | A | 4/2000 | Davis et al. |
| 6,110,277 | A | 8/2000 | Braun |
| 6,121,121 | A | 9/2000 | Koide |
| 6,146,457 | A | 11/2000 | Solomon |
| 6,153,010 | A | 11/2000 | Kiyoku et al. |
| 6,274,518 | B1 | 8/2001 | Yuri et al. |
| 6,319,742 | B1 | 11/2001 | Hayashi et al. |
| 6,329,667 | B1 | 12/2001 | Ota et al. |
| 6,355,497 | B1 | 3/2002 | Romano et al. |
| 6,365,921 | B1 | 4/2002 | Watanabe et al. |

FOREIGN PATENT DOCUMENTS

| EP | 0 551 721 A2 | 7/1993 |
| EP | 0 779 666 A3 | 6/1997 |
| EP | 0 951 055 A2 | 10/1999 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 5-41536 | 2/1993 |
| JP | 5-110206 | 4/1993 |
| JP | 5-283744 | 10/1993 |
| JP | 5-343741 | 12/1993 |
| JP | 6-196757 | 7/1994 |
| JP | 7-249830 | 9/1995 |
| JP | 7-273367 | 10/1995 |
| JP | 8-64791 | 3/1996 |
| JP | 8-102549 | 4/1996 |
| JP | 8-116090 | 5/1996 |

| | | |
|---|---|---|
| JP | 8-222812 | 8/1996 |
| JP | 8-274411 | 10/1996 |
| JP | 9-162125 | 6/1997 |
| JP | 9-199759 | 7/1997 |
| JP | 10-65270 | 3/1998 |
| JP | 10-312971 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-274649 | 10/1999 |
| JP | 11-289109 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-21789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO97/11518 | 3/1997 |
| WO | WO 98/47170 | 10/1998 |
| WO | WO 99/65068 | 12/1999 |
| WO | WO 00/04615 | 1/2000 |
| WO | WO 00/55893 | 9/2000 |

OTHER PUBLICATIONS

Tsvetanka S. Zheleva, Pendo-Epitaxy A New Approach for Lateral Growth of Gallium Nitride Structures, mrs Internet J. Nitride Semicond. Res. 4SI, G38, (1999).
Japanese Office Action dated Mar. 14, 2006 for Japanese Application No. 2000-71352.
Japanese Office Action dated Mar. 14, 2006 for Japanese Application No. 2000-71353.
Japanese Office Action dated Mar. 14, 2006 for Japanese Application No. 2000-71351.
PCT Forms 338 and 409 (IPER) (PCT/JP02/05446) and translations thereof.
PCT Forms 338 and 409 (IPER) (PCT/JP02/02628) and translations thereof.
PCT Forms 338 and 409 (IPER) (PCT/JP02/01159) and translations thereof.
Ujiie et al., "Epitaxial Lateral Overgrowth of GaAs on a Si Substrate", Japanese Journal of Applied Physics vol. 28, No. 3, Mar. 1989, pp. L337-L339.
Partial Translation of the Office Action for Japanese Patent Application No. 9-311518 dated Jun. 10, 2003.
Wolf et al., "Silicon Processing for the VLSI Era," vol. 1, p. 5, Lattice Press, 1986.
Translation of PCT Forms 338 and 409 (PCT/JP01928).
Translation of PCT Forms 338 and 409 (PCT/JP01/01396).
Nam et al., "Lateral epitaxy of low defect density GaN layers via organometallic vapor phase epitaxy", pp. 2638-2640, Appl. Phys. Lett. 71 (18), Nov. 3, 1997.
Hiramatsu et al., "Selective area growth and epitaxial lateral overgrowth of GaN by metalorganic vapor epitaxy and hydride vapor phase epitaxy", pp. 104-111, Materials Science and Engineering B59 (1999).
Akasaki et al., "Effects of AlN Buffer Layer on Crystallographic Structure and on Electrical and Optical Properties of GaN and Ga1-xA1xN . . . Movpe" pp. 209-219, Journal of Crystal Growth 98 (1989) North-Holland, Amsterdam.
Yang et al., High quality GaN-InGaN heterostructures grown on (111) silicon substrates, pp. 3566-3568, Appl. Phys. Lett. 69 (23), Dec. 2, 1996.
Wolf et al., for the VLSI Era, vol. 1—Process Technology, p. 5, "Silicon: Single Crystal Growth and Wafer Preparation."
Luther et al., "Titanium and titanium nitride contacts to n-type gallium nitride ", Semicond. Sci. Technol. 13 (1998) pp. 1322-1327.
Dimitriadis et al., "Contacts of titanium nitride to—and p-type gallium nitride films", Solid-State Electronics 43 (1999), pp. 1969-1972.
Zheleva et al., "Pendeo-Epitaxy-A New Approach for Lateral Growth of Gallium Nitride Structures", MRS Internet J. Nitride Semicond. Res. 4SI, G3.38 (1999), 6 pages total.
PCT Form 210 (PCT/JP02/05446).
PCT Form 210 (PCT/JP02/02628).
PCT Form 210 ((PCT/JP02/01159).
PCT Form 210 (PCT/JP01/01928).
PCT Form 210 (PCT/JP01/02695).
PCT Form 210 (PCT/JP00/09120).
PCT Form 210 (PCT/JP01/01396).
PCT Form 210 (PCT/JP01/01178).
PCT Form 210 (PCT/JP01/01663).
PCT Form 210 (PCT/JP00/09121).
PCT Form 210 (PCT/JP00/09220).
PCT Form 338 (IPER) (PCT/JP01/02695).
PCT Form 338 (IPER) (PCT/JP01/01663).
PCT Form 338 (IPER) (PCT/JP09120).
PCT Form 409 (PCT/JP01/01928).
PCT Form 409 (PCT/JP01/01396).
Search Report (EP 27057) Jul. 18, 2000.
Search Report (EP 27279) Feb. 15, 2002.
PCT Form 338 (IPER) (PCT/JP00/09121).
Journal of Electronic Materials, vol. 28, No. 4 (Apr. 1999), A Joint Publication of The Minerals, Metals & Materials Society and the Institute of Electrical and Electronics Engineers, pp. 545-551.
III-Vs Review, Covering Advanced Semiconductors Worldwide, vol. 13, No. 3 (May/Jun. 2000), "GaN Crystals grow to 2", Magnetic Semiconductors, First 6" GaAs from ex-silicon fab", pp. 156-164.
Journal of Electronic Materials, vol. 28, No. 4 (1999), "Pendeo-Epitaxy: A New Approach for Lateral Growth of Gallium Nitride Films", Tsvetanka S. Zheleva et al., pp. L5-L8.

*Primary Examiner*—Sara Crane
(74) *Attorney, Agent, or Firm*—McGinn IP Law Group, PLLC

(57) ABSTRACT

A first Group III nitride compound semiconductor layer 31 is etched, to thereby form an island-like structure such as a dot-like, stripe-shaped, or grid-like structure, so as to provide a trench/mesa such that layer different from the first Group III nitride compound semiconductor layer 31 is exposed at the bottom portion of the trench. Thus, a second Group III nitride compound layer 32 can be epitaxially grown, laterally, with a top surface of the mesa and a sidewall/sidewalls of the trench serving as a nucleus, to thereby bury the trench and also grow the layer in the vertical direction. In this case, propagation of threading dislocations contained in the first Group III nitride compound semiconductor layer 31 can be prevented in the upper portion of the second Group III nitride compound semiconductor 32 that is formed through lateral epitaxial growth. Etching may be performed until a cavity portion is provided in the substrate. The layer serving as a nucleus of ELO may be doped with indium (In) having an atomic radius greater than that of gallium (Ga) serving as a predominant element. The first semiconductor layer may be a multi-component layer containing a plurality of numbers of repetitions of a unit of a buffer layer and a single-crystal layer.

10 Claims, 36 Drawing Sheets

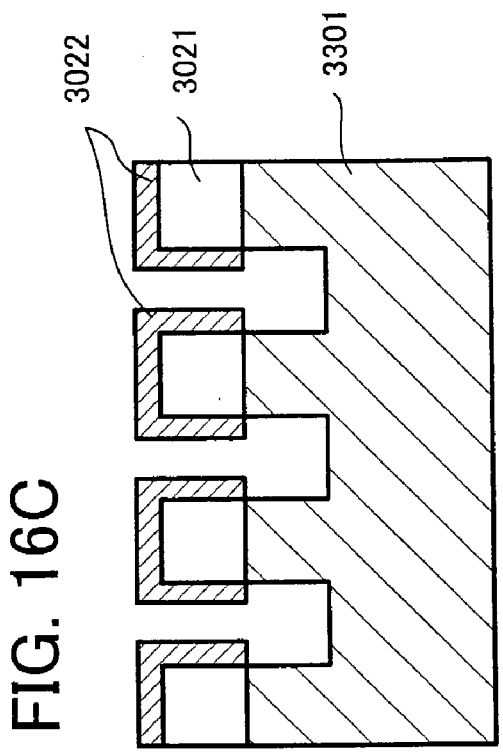
FIG. 16A
FIG. 16C
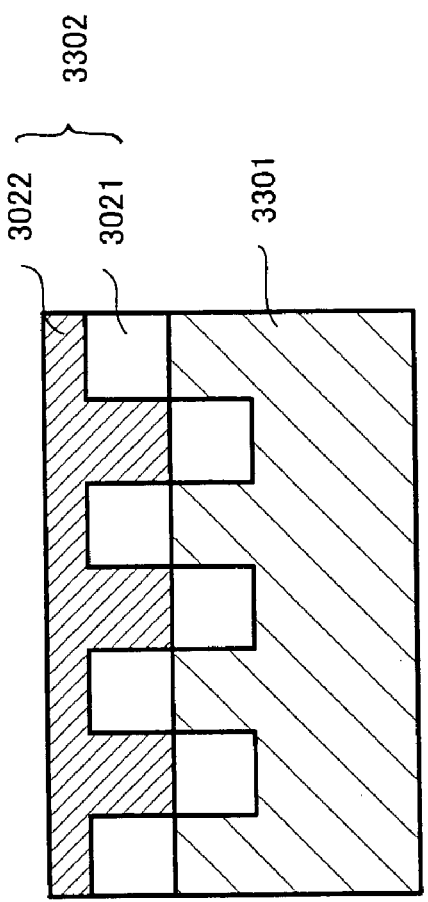
FIG. 16B
FIG. 16D

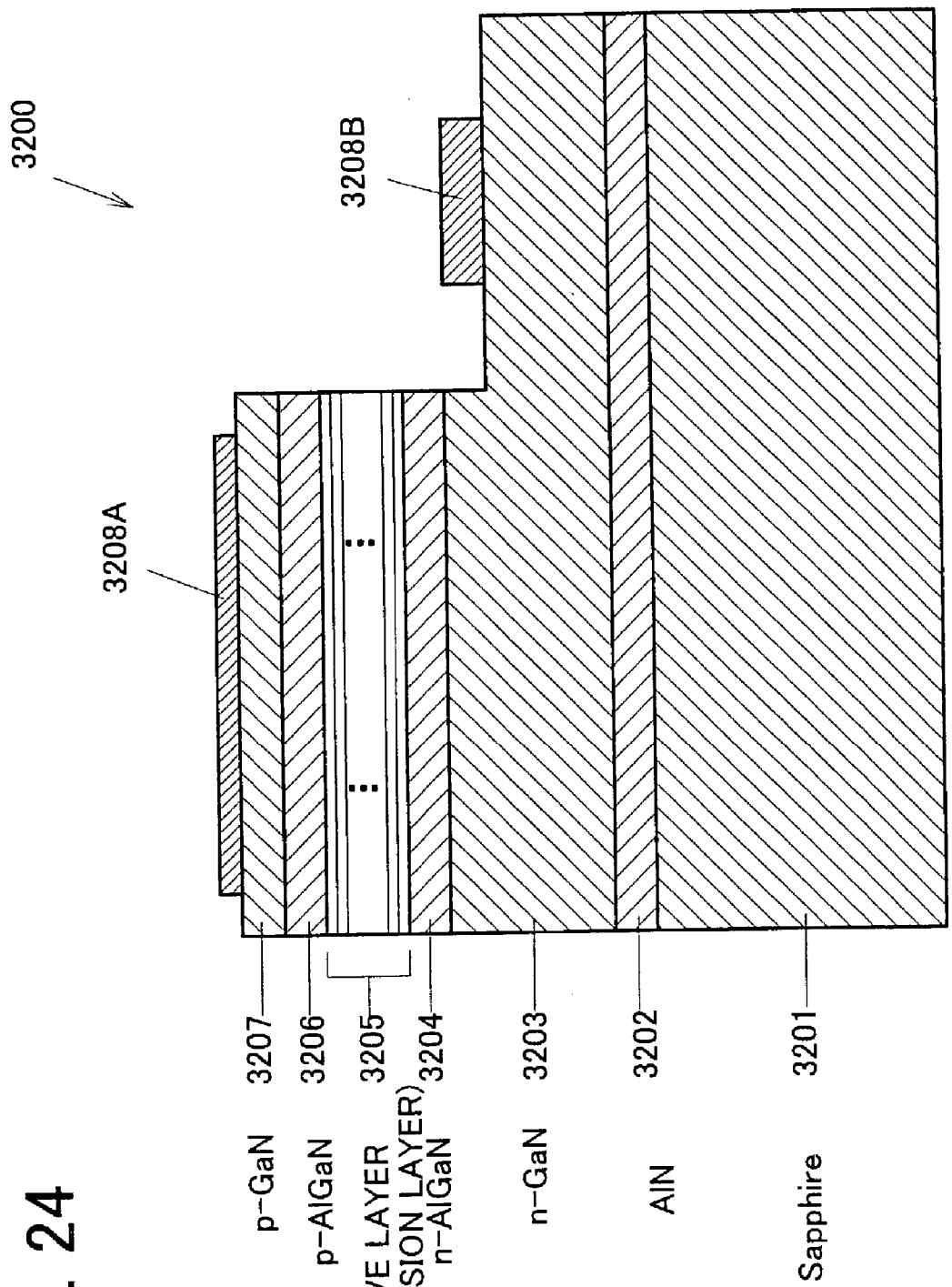

PRODUCTION METHOD OF III NITRIDE COMPOUND SEMICONDUCTOR AND III NITRIDE COMPOUND SEMICONDUCTOR ELEMENT

TECHNICAL FIELD

The present invention relates to a method for fabricating Group III nitride compound semiconductors, and to semiconductor devices. More particularly, the present invention relates to a method for fabricating Group III nitride compound semiconductors employing epitaxial lateral overgrowth (ELO), and to Group III nitride compound semiconductor devices produced by forming a device layer on a Group III nitride compound semiconductor fabricated through the aforementioned method. The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$). In the present specification, unless otherwise specified, "Group III nitride compound semiconductors" encompass Group III nitride compound semiconductors which are doped with an impurity so as to assume p-type or n-type conductivity.

BACKGROUND ART

Group III nitride compound semiconductor are direct-transition semiconductors exhibiting a wide range of emission spectra from UV to red light when used in a device such as a light-emitting device, and have been used in light-emitting devices such as light-emitting diodes (LEDs) and laser diodes (LDs). In addition, due to their broad band gaps, devices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconducting devices has been longed for from the environmental aspect. Generally, these Group III nitride compound semiconductors are formed on a sapphire substrate. In this connection, a buffer layer formed of a plurality of layers is also known as disclosed in Japanese Patent Application Laid-Open (kokai) No. 9-199759.

DISCLOSURE OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a sketch of FIG. 36. FIG. 36 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by stacking various types of Group III nitride compound semiconductors of interest on the Group III nitride compound semiconductor layer 93, threading dislocations further propagate upward, through the semiconductor device, from dislocation arrival points 902 on the surface of the Group III nitride compound semiconductor layer 93. Thus, according to conventional techniques, problematic propagation of dislocations cannot be prevented during formation of Group III nitride compound semiconductor layers.

In recent years, in order to prevent propagation of the threading dislocations, techniques employing lateral growth of crystal have been developed. According to the techniques, a mask partially provided with an array of slits, which is formed from a material such as silicon oxide or tungsten, is provided on a sapphire substrate or a Group III nitride compound semiconductor layer, and crystal growth is elicited to proceed laterally on the mask, with the slits serving as nuclei or seed. Among similar techniques is a technique called pendeo-epitaxial lateral overgrowth (pendeo-ELO), in which laterally growing portions are formed such that they are suspended above the surface of the substrate. In ELO employing a mask, the upper surface of the mask is positioned above the portions of the semiconductor layer which are exposed through the slits so as to serve as nuclei for crystal growth. Thus, crystal growth proceeds firstly upward from semiconductor of the slit portions serving as nuclei, and subsequently, turns around onto the upper surface of the mask, and progresses laterally thereon. As a result, considerable amounts of dislocations and considerable strain generate at the mask edges, and threading dislocations generated in these portions cause difficulties in reducing threading dislocations. The pendeo-ELO technique also involves a similar problem; since a mask is formed on the upper surface of a layer providing nuclei for crystal growth, when crystal growth proceeds around the edge portions onto the upper surface of the mask, problematic threading dislocations generate at the mask edges.

The present invention has been accomplished in an attempt to solve the aforementioned problems, and an object of the present invention is to fabricate a Group III nitride compound semiconductor with suppressed generation of threading dislocations.

The present invention provides an improvement in crystal quality by further reducing threading dislocations during ELO employing a mask or ELO not employing a mask.

In order to attain the aforementioned object, the invention drawn to a first feature provides a method for fabricating a Group III nitride compound semiconductor through epitaxial growth thereof on a substrate, which comprises etching an underlying layer comprising at least one layer of a Group III nitride compound semiconductor, the uppermost layer of the underlying layer being formed of a first Group III nitride compound semiconductor, to thereby form an island-like structure such as a dot-like, stripe-shaped, or grid-like structure, so as to provide a trench/mesa such that a different layer, the different layer being formed of a semiconductor different from the first Group III nitride compound semiconductor, is exposed at a bottom portion of the trench, and epitaxially growing, vertically and laterally, a second Group III nitride compound semiconductor, with a top surface of the mesa and a sidewall of the trench serving as a nucleus, the mesa and the trench being formed by etching the first Group III nitride compound semiconductor so as to form an island-like structure such as a dot-like, stripe-shaped, or grid-like structure. In the present specification, the term "underlying layer" is used so as to collectively encompass a Group III nitride compound semiconductor single layer and a multi-component layer containing at least one Group III nitride compound semiconductor layer. The expression "island-like structure" conceptually refers to the pattern of the upper portions of the mesas formed through etching, and does not necessarily refer to regions separated from one another. Thus, upper portions of the mesas may be continuously connected together over a considerably wide area, and such a structure may be obtained by forming the entirety of a wafer into a stripe-shaped or grid-like structure. The sidewall/sidewalls of the trench refers not only to a plane vertical to the substrate plane and the surface of a Group III nitride compound semiconductor, but also to an oblique plane. The trench may have a V-shaped cross-section. Unless otherwise specified, these definitions are equally applied to the below-appended claims.

The invention drawn to a second feature provides a method for fabricating a Group III nitride compound semiconductor as recited in connection with the first feature, wherein the width of the bottom portion of the trench is determined such that lateral growth from the sidewall/sidewalls for burying the trench proceeds faster than vertical growth at the surface of the different layer at which the bottom portion is exposed.

The invention drawn to a third feature provides a method for fabricating a Group III nitride compound semiconductor according to the invention as recited in connection with the first or second feature, wherein substantially all the sidewalls of the trench assume a {11-20} plane.

The invention drawn to a fourth feature provides a method for fabricating a Group III nitride compound semiconductor according to the invention as recited in connection with any one of the first to third features, wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to a fifth feature provides a method for fabricating a Group III nitride compound semiconductor according to the invention as recited in connection with any one of the first to fourth features, wherein the different layer is formed of a third Group III nitride compound semiconductor having a composition different from that of the first Group III nitride compound semiconductor.

The invention drawn to a sixth feature provides a Group III nitride compound semiconductor device, which is formed as an upper layer provided on a lateral-epitaxially grown portion of a Group III nitride compound semiconductor layer produced through a method for fabricating a Group III nitride compound semiconductor as recited in connection with any one of the first to fifth features.

The invention drawn to a seventh feature provides a Group III nitride compound semiconductor light-emitting device, which is produced by stacking, as an upper layer, a different Group III nitride compound semiconductor layer on a lateral-epitaxially grown portion of a Group III nitride compound semiconductor layer produced through a method for fabricating a Group III nitride compound semiconductor as recited in connection with any one of the first to fifth features.

The invention drawn to an eighth feature provides a method for fabricating a Group III nitride compound semiconductor as recited in connection with any one of the first to fifth features, further comprising removing substantially entire portions except for an upper layer formed on a portion provided through lateral epitaxial growth, to thereby obtain a Group III nitride compound semiconductor layer.

The invention drawn to a ninth feature provides a method for fabricating a Group III nitride compound semiconductor through epitaxial growth thereof on a substrate, which comprises forming on the substrate an underlying layer which comprises at least one layer of a Group III nitride compound semiconductor, the uppermost layer of the underlying layer being formed of a first Group III nitride compound semiconductor; etching the underlying layer and at least a portion of the surface of the substrate, to thereby form an island-like structure such as a dot-like, stripe-shaped, or grid-like structure, so as to provide a trench/mesa comprising an upper portion formed of the underlying layer provided on the surface of the substrate and a lower portion having no underlying layer and defining a cavity in the surface of the substrate; and epitaxially growing, vertically and laterally, a second Group III nitride compound semiconductor, with a top surface of the mesa and a sidewall of the trench serving as a nucleus, the mesa and the trench being formed by etching the first Group III nitride compound semiconductor so as to form an island-like structure such as a dot-like, stripe-shaped, or grid-like structure. In the present specification, the term "underlying layer" is used so as to collectively refer to a Group III nitride compound semiconductor single layer and a multi-component layer containing at least one Group III nitride compound semiconductor layer. The expression "island-like structure" conceptually refers to the pattern of the upper portions of the mesas formed through etching, and does not necessarily refer to regions separated from one another. Thus, upper portions of the mesas may be continuously connected together over a considerably wide area, and such a structure may be obtained by forming the entirety of a wafer into a stripe-shaped or-grid-like structure. The sidewall/sidewalls of the trench refers not only to a plane vertical to the substrate plane and the surface of a Group III nitride compound semiconductor, but also to an oblique plane.

Unless otherwise specified, these definitions are equally applied to the below-described features.

In the invention drawn to a tenth feature, substantially all the sidewalls of the trench assume a {11-20} plane.

The invention drawn to an eleventh feature provides a method for fabricating a Group III nitride compound semiconductor according to the invention as recited in connection with the ninth feature, wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to a twelfth feature provides a Group III nitride compound semiconductor device, which is formed as an upper layer provided on a lateral-epitaxially grown portion of a Group III nitride compound semiconductor layer produced through a method for fabricating a Group III nitride compound semiconductor as recited in connection with any one of the ninth to eleventh features.

The invention drawn to a thirteenth feature provides a Group III nitride compound semiconductor light-emitting device, which is produced by stacking, as an upper layer, a different Group III nitride compound semiconductor layer on a lateral-epitaxially grown portion of a Group III nitride compound semiconductor layer produced through a method for fabricating a Group III nitride compound semiconductor as recited in connection with any one of the ninth to eleventh features.

The invention drawn to a fourteenth feature provides a method for fabricating a Group III nitride compound semiconductor substrate including a method for fabricating a Group III nitride compound semiconductor as recited in connection with any one of the ninth to eleventh features and removing substantially entire portions except for an upper layer formed on a portion provided through lateral epitaxial growth, to thereby obtain a Group III nitride compound semiconductor substrate.

The invention drawn to a fifteenth feature provides a method for fabricating a Group III nitride compound semiconductor through epitaxial growth thereof on a substrate, which comprises forming on the substrate an underlying layer which comprises at least one layer of a Group III nitride compound semiconductor, the uppermost layer of the underlying layer being formed of a first Group III nitride compound semiconductor partially substituted or doped by an element having an atomic radius greater than that of a predominant element; etching the underlying layer, to thereby form an island-like structure such as a dot-like, stripe-shaped, or grid-like structure, so as to provide a trench/mesa; and epitaxially growing, vertically and laterally, a second Group III nitride compound semiconductor, with a top surface of the mesa and a sidewall of the trench serving as a nucleus, the mesa and the trench being formed by etching the first Group III nitride compound semiconductor so as to form an island-like structure such as a dot-like, stripe-shaped, or grid-like structure. In the present specification, the term "underlying layer" is used so as to collectively encompass a Group III nitride compound semiconductor single layer and a multi-component layer containing at least one Group III nitride compound semiconductor layer. The expression "island-like structure" conceptually refers to the pattern of the upper portions of the mesas formed through etching, and does not necessarily refer to regions separated from one another. Thus, upper portions of the mesas may be continuously connected together over a considerably wide area, and such a structure may be obtained by forming the entirety of a wafer into a stripe-shaped or grid-like structure. The sidewall/sidewalls of the trench refers not only to a plane vertical to the substrate plane and the surface of a Group III nitride compound semiconductor, but also to an oblique plane. The trench may have a V-shaped cross-section. Unless otherwise specified, these definitions are equally applied to the below-appended claims.

The invention drawn to a sixteenth feature provides a method for fabricating a Group III nitride compound semiconductor according to the invention as recited in connection with the fifteenth feature, wherein the semiconductor contains aluminum (Al) or gallium (Ga) as a predominant element and the element of a large atomic radius is indium (In) or thallium (Tl).

The invention drawn to a seventeenth feature provides a method for fabricating a Group III nitride compound semiconductor according to the invention as recited in connection with the fifteenth or sixteenth feature, wherein the semiconductor contains nitrogen (N) as a predominant element and the element of a large atomic radius is phosphorus (P), arsenic (As), antimony (Sb), or bismuth (Bi).

The invention drawn to an eighteenth feature provides a method for fabricating a Group III nitride compound semiconductor according to the invention as recited in connection with any one of the fifteenth to seventeenth features, wherein the width of the bottom portion of the trench and the depth of the trench are determined such that lateral growth from the sidewall/sidewalls for burying the trench proceeds faster than vertical growth from the bottom portion of the trench for burying the trench.

The invention drawn to a nineteenth feature provides a method for fabricating a Group III nitride compound semiconductor according to the invention as recited in connection with any one of the fifteenth to eighteenth features, wherein etching is performed so as to expose the surface of the substrate, to thereby form the bottom portion of the trench.

The invention drawn to a twentieth feature provides a method for fabricating a Group III nitride compound semiconductor according to the invention as recited in connection with any one of the fifteenth to nineteenth features, wherein substantially all the sidewalls of the trench assume a {11-20} plane.

The invention described in claim 21 provides a method for fabricating a Group III nitride compound semiconductor according to the invention as recited in connection with any one of the fifteenth to twentieth features, wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to a twenty-second feature provides a Group III nitride compound semiconductor device, which is formed as an upper layer provided on a lateral-epitaxially grown portion of a Group III nitride compound semiconductor layer produced through a method for fabricating a Group III nitride compound semiconductor as recited in connection with any one of the fifteenth to twenty-first features.

The invention drawn to a twenty-third feature provides a Group III nitride compound semiconductor light-emitting device, which is produced by stacking, as an upper layer, a different Group III nitride compound semiconductor layer on a lateral-epitaxially grown portion of a Group III nitride compound semiconductor layer produced through a method for fabricating a Group III nitride compound semiconductor as recited in connection with any one of the fifteenth to twenty-first features.

The invention drawn to a twenty-fourth feature provides a method for fabricating a Group III nitride compound semiconductor as recited in connection with any one of the fifteenth to twenty-first features, further comprising removing substantially entire portions except for an upper layer formed on a portion provided through lateral epitaxial growth, to thereby obtain a Group III nitride compound semiconductor layer.

The invention drawn to a twenty-fifth feature provides a method for fabricating a Group III nitride compound semiconductor through epitaxial growth thereof on a substrate, which comprises etching an underlying layer which comprises a multi-component layer including at least three layers of a Group III nitride compound semiconductor, the uppermost layer of the underlying layer being formed of a first Group III nitride compound semiconductor, to thereby form an island-like structure such as a dot-like, stripe-shaped, or grid-like structure and epitaxially growing, vertically and laterally, a second Group III nitride compound semiconductor, with a top surface of the mesa and a sidewall of the trench serving as a nucleus, the mesa and the trench being formed by etching the first Group III nitride compound semiconductor so as to form an island-like structure such as a dot-like, stripe-shaped, or grid-like structure. In the present specification, the term "underlying layer" collectively refers to layers that form one multi-component underlying layer, regardless of the depth of etching. The expression "island-like structure" conceptually refers to the pattern of the upper portions of the mesas formed through etching, and does not necessarily refer to regions separated from one another. Thus, upper portions of the mesas may be continuously connected together over a considerably wide area, and such a structure may be obtained by forming the entirety of a wafer into a stripe-shaped or grid-like structure. The sidewall/sidewalls of the trench refers not only to a plane vertical to the substrate plane and the surface of a Group III nitride compound semiconductor, but also to an oblique plane. The trench may have a V-shaped cross-section. Unless otherwise specified, these definitions are equally applied to the below-appended claims.

The invention drawn to a twenty-sixth feature provides a method for fabricating a Group III nitride compound semiconductor as recited in connection with the twenty-fifth feature, wherein the underlying layer comprises an arbitrary number of repetitions of a unit of a buffer layer comprising a Group III nitride compound semiconductor and formed at a temperature where single crystals cannot be grown and a Group III nitride compound semiconductor layer formed at a temperature where single crystals can be grown. As used herein, the expression "single crystals cannot be grown" refers to the case in which the formed semiconductor is amorphous or polycrystalline.

The invention drawn to a twenty-seventh feature provides a method for fabricating a Group III nitride compound semiconductor as recited in connection with the twenty-sixth feature, wherein the buffer layer is formed at 200–600° C. or 1000–1180° C.

The invention drawn to a twenty-eighth feature provides a method for fabricating a Group III nitride compound semiconductor as recited in connection with the twenty-sixth or twenty-seventh feature, wherein the buffer layer comprises $Al_xGa_{1-x}N$ ($0 \leq x \leq 1$).

The invention drawn to a twenty-ninth feature provides a method for fabricating a Group III nitride compound semiconductor according to the invention as recited in connection with any one of the twenty-fifth to twenty-eighth features, wherein etching is performed so as to expose the surface of the substrate, to thereby form the bottom portion of the trench.

The invention drawn to a thirtieth feature provides a method for fabricating a Group III nitride compound semiconductor as recited in connection with any one of the twenty-fifth to twenty-ninth features, wherein the width of the bottom portion of the trench and the depth of the trench are determined such that lateral growth from the sidewall/sidewalls for burying the trench proceeds faster than vertical growth from the bottom portion of the trench for burying the trench.

The invention drawn to a thirty-first feature provides a method for fabricating a Group III nitride compound semiconductor as recited in connection with any one of the twenty-fifth to thirtieth features, wherein substantially all the sidewalls of the trench assume a {11-20} plane.

The invention drawn to a thirty-second feature provides a method for fabricating a Group III nitride compound semiconductor according to the invention as recited in connection with any one of the twenty-fifth to thirty-first features, wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to a thirty-third feature provides a Group III nitride compound semiconductor device, which is formed as an upper layer provided on a lateral-epitaxially grown portion of a Group III nitride compound semiconductor layer produced through a method for fabricating a Group III nitride compound semiconductor as recited in connection with any one of the twenty-fifth to thirty-second features.

The invention drawn to a thirty-fourth feature provides a Group III nitride compound semiconductor light-emitting device, which is produced by stacking, as an upper layer, a different Group III nitride compound semiconductor layer on a lateral-epitaxially grown portion of a Group III nitride compound semiconductor layer produced through a method for fabricating a Group III nitride compound semiconductor as recited in connection with any one of the twenty-fifth to thirty-three features.

The invention drawn to a thirty-fifth feature provides a method for fabricating a Group III nitride compound semiconductor substrate including a method for fabricating a Group III nitride compound semiconductor as recited in connection with any one of the twenty-fifth to thirty-fourth features, further comprising removing substantially entire portions except for an upper layer formed on a portion provided through lateral epitaxial growth, to thereby obtain a Group III nitride compound semiconductor layer.

The invention drawn to a thirty-sixth feature provides a method for fabricating a Group III nitride compound semiconductor as recited in connection with the eighth feature or any one of the first to fifth features, wherein the different layer is a bottom portion of the cavity provided in the surface of the substrate.

The invention drawn to a thirty-seventh feature provides a Group III nitride compound semiconductor device as recited in connection with the sixth feature, wherein the different layer is a bottom portion of the cavity provided in the surface of the substrate.

The invention drawn to a thirty-eighth feature provides a method for fabricating a Group III nitride compound semiconductor as recited in connection with the eighth feature or any one of the first to fifth features, wherein the uppermost layer is partially substituted or doped by an element having an atomic radius greater than a predominant element.

The invention drawn to a thirty-ninth feature provides a Group III nitride compound semiconductor device as recited in connection with the sixth feature, wherein the uppermost layer is partially substituted or doped by an element having an atomic radius greater than a predominant element.

The invention drawn to a fortieth feature provides a method for fabricating a Group III nitride compound semiconductor as recited in connection with the eighth feature or any one of the first to fifth features, wherein the underlying layer comprises a multi-component layer in which the uppermost layer is formed of the first Group III nitride compound semiconductor.

The invention drawn to a forty-first feature provides a Group III nitride compound semiconductor device as recited in connection with the sixth feature, wherein the underlying layer comprises a multi-component layer in which the uppermost layer is formed of the first Group III nitride compound semiconductor.

The invention drawn to a forty-second feature provides a method for fabricating a Group III nitride compound semiconductor as recited in connection with the fourteenth feature or any one of the ninth to eleventh features, wherein the uppermost layer is partially substituted or doped by an element having an atomic radius greater than a predominant element.

The invention drawn to a forty-third feature provides a Group III nitride compound semiconductor device as recited in connection with the twelfth feature, wherein the uppermost layer is partially substituted or doped by an element having an atomic radius greater than a predominant element.

The invention drawn to a forty-fourth feature provides a method for fabricating a Group III nitride compound semiconductor as recited in connection with the thirty-fifth feature or any one of the twenty-fifth to thirty-second features, wherein the mesa/trench is provided by exposing the surface of the substrate through removal of the underlying layer or by removing the underlying layer, to thereby form a cavity portion in the substrate.

The invention drawn to a forty-fifth feature provides a Group III nitride compound semiconductor device as recited in connection with the thirty-third feature, wherein the mesa/trench is provided by exposing the surface of the substrate through removal of the underlying layer or by removing the underlying layer, to thereby form a cavity portion in the substrate.

The invention drawn to a forty-sixth feature provides a method for fabricating a Group III nitride compound semiconductor as recited in connection with the thirty-fifth feature or any one of the twenty-fifth to thirty-second features, wherein the uppermost layer is partially substituted or doped by an element having an atomic radius greater than a predominant element.

The invention drawn to a forty-seventh feature provides a Group III nitride compound semiconductor device as recited in connection with the thirty-third feature, wherein the uppermost layer is partially substituted or doped by an element having an atomic radius greater than a predominant element.

The invention drawn to a forty-eighth feature provides a method for fabricating a Group III nitride compound semiconductor as recited in connection with the thirty-sixth feature, wherein the uppermost layer is partially substituted or doped by an element having an atomic radius greater than a predominant element.

The invention drawn to a forty-ninth feature provides a Group III nitride compound semiconductor device as recited in connection with the thirty-seventh feature, wherein the uppermost layer is partially substituted or doped by an element having an atomic radius greater than a predominant element.

The invention drawn to a fiftieth feature provides a method for fabricating a Group III nitride compound semiconductor as recited in connection with the forty-second feature, wherein the underlying layer comprises a multi-component layer in which the uppermost layer is formed a first Group III nitride compound semiconductor.

The invention drawn to a fifty-first feature provides a Group III nitride compound semiconductor device as recited in connection with the forty-third feature, wherein the underlying layer comprises a multi-component layer in which the uppermost layer is formed of the first Group III nitride compound semiconductor.

The invention drawn to a fifty-second feature provides a method for fabricating a Group III nitride compound semiconductor as recited in connection with the thirty-eighth feature, wherein the underlying layer comprises a multi-component layer in which the uppermost layer is formed of the first Group III nitride compound semiconductor.

The invention drawn to a fifty-third feature provides a Group III nitride compound semiconductor device according to the invention as recited in connection with the thirty-ninth feature, wherein the underlying layer comprises a multi-component layer in which the uppermost layer is formed of the first Group III nitride compound semiconductor.

The invention drawn to a fifty-fourth feature provides a method for fabricating a Group III nitride compound semiconductor as recited in connection with the thirty-sixth feature, wherein the underlying layer comprises a multi-component layer in which the uppermost layer is formed of the first Group III nitride compound semiconductor.

The invention drawn to a fifty-fifth feature provides a Group III nitride compound semiconductor device as recited in connection with the thirty-seventh feature, wherein the underlying layer comprises a multi-component layer in which the uppermost layer is formed of the first Group III nitride compound semiconductor.

The invention drawn to a fifty-sixth feature provides a method for fabricating a Group III nitride compound semiconductor as recited in connection with the forty-eighth feature, wherein the underlying layer comprises a multi-component layer in which the uppermost layer is formed of the first Group III nitride compound semiconductor.

The invention drawn to a fifty-seventh feature provides a Group III nitride compound semiconductor device as recited in connection with the forty-ninth feature, wherein the underlying layer comprises a multi-component layer in which the uppermost layer is formed of the first Group III nitride compound semiconductor.

The invention drawn to a fifty-eighth feature provides a Group III nitride compound semiconductor light-emitting device according to the invention as recited in connection with any of the thirty-seventh, thirty-ninth, forty-first, forty-third, forty-fifth, forty-seventh, forty-ninth, fifty-first, fifty-third, and fifty-fifth features, which is a light-emitting device.

The outline of an example of the method for fabricating a Group III nitride compound semiconductor of the present invention will next be described with reference to FIG. 1. Although FIG. 1 illustrates layers accompanied by a substrate 1 and a buffer layer 2 so as to facilitate description and understanding of relevant dependent claims, the substrate 1 and the buffer layer 2 are not essential elements of the present invention, as the present invention is to produce, by the employment of a Group III nitride compound semiconductor having threading dislocations in the vertical direction, a Group III nitride compound semiconductor layer including a region in which threading dislocations in the vertical direction are reduced. The gist of the operation and effects of the present invention will next be described with reference to an embodiment in which a first Group III nitride compound semiconductor layer 31 having threading dislocations in the vertical direction (direction vertical to the substrate surface) is provided on the substrate 1 via the buffer layer 2. In this embodiment, the buffer layer 2 serves as the "different layer."

As shown in FIG. 1A, the first Group III nitride compound semiconductor layer 31 is formed on the buffer layer 2 and etched to thereby form an island-like structure such as a dot-like, stripe-shaped, or grid-like structure, so as to provide a trench/mesa such that the buffer layer 2 (the "different layer") is exposed at the bottom portion of the trench. Thus, a second Group III nitride compound layer 32 can be epitaxially grown, vertically and laterally, with a top surface of the mesa and a sidewall/sidewalls of the trench serving as a nucleus, to thereby bury the trench and also grow the layer upward. In this case, propagation of threading dislocations contained in the Group III nitride compound semiconductor layer 31 can be prevented in the upper portion of the second Group III nitride compound semiconductor 32 that is formed through lateral epitaxial growth, and a region in which treading dislocations are reduced is provided on the thus-buried trench (first feature). Thus, threading dislocations are not propagated in the vertical direction in the portion formed through lateral growth with a sidewall of the trench serving as a nucleus. If epitaxial growth yields no substantial discontinuity in the interface between the Group III nitride compound semiconductor layer 31 or the buffer layer 2 (different layer) and the second Group III nitride compound semiconductor 32, no electrical resistance attributed to a discontinuous portion is generated with respect to current flow in the vertical direction (direction normal to the surface of the substrate 1), as compared with a similar structure having a mask made of an insulator or the like. Furthermore, a stable structure can be fabricated.

When the second Group III nitride compound semiconductor 32 for burying the trench is not epitaxially grown from the buffer layer 2 (different layer); i.e., the bottom portion of the trench, in the vertical direction or the rate of such epitaxial growth is very low, there occurs much more rapid coalescence of lateral epitaxial growth fronts starting from the sidewalls of the trench facing to each other. In the upper portion of the thus-buried Group III nitride compound semiconductor 32, no threading dislocations are propagated from the buffer layer 2 (different layer), or the propagation is remarkably suppressed, to thereby provide a crystal region of remarkably high quality (second feature). In this case, as shown in FIG. 1C, cavities remain on the different layer, and over the cavities, growth fronts of the second Group III nitride compound semiconductor 32 grown from the two sidewalls of the trench, serving as nuclei, coalesce.

The aforementioned rapid lateral epitaxial growth can be readily attained when the sidewall formed of the Group III nitride compound semiconductor layer 31 assumes a {11-20} plane (third feature). During lateral epitaxial growth, at least an upper portion of the growth front may remain a {11-20} plane. When the first Group III nitride compound semiconductor and the second Group III nitride compound semiconductor have the same composition, rapid lateral epitaxial growth can be readily attained (fourth feature). When the different layer is formed of a third Group III nitride compound semiconductor having a composition different from that of the first Group III nitride compound semiconductor, vertical growth from the different layer can be minimized at an initial stage (fifth feature).

Through the procedure as described above, threading dislocations propagated from the first Group III nitride compound semiconductor layer 31 are prevented, to thereby provide a stable structure, and the second Group III nitride compound semiconductor 32 can be formed without increasing electrical resistance attributed to a discontinuous interface. Although FIG. 1 illustrates a sidewall of the trench vertical to the substrate plane, the present invention is not limited thereto, and the sidewall may be an oblique plane. The trench may have a V-shaped cross-section. These features are equally applied to the descriptions below.

By forming a device as an upper layer on a lateral-epitaxially grown portion of a Group III nitride compound semiconductor layer produced through the above step, a semiconductor device having a layer containing few defects and endowed with high mobility can be provided (sixth feature).

By stacking, as an upper layer, a light-emitting element on a lateral-epitaxially grown portion of a Group III nitride compound semiconductor layer produced through the above step, a light-emitting device endowed with improved service life and an improved LD threshold value can be provided (seventh feature).

By selectively separating, from the other layers, an upper layer formed on a portion provided through lateral epitaxial growth in the Group III nitride compound semiconductor layer obtained through the above step, there can be produced a high-crystallinity Group III nitride compound semiconductor in which crystal defects such as dislocations are remarkably suppressed (eighth feature). In this connection, for the sake of convenience in manufacture, the expression "removing substantially entire portions" does not exclude the case in which a portion containing threading dislocations is present to some extent.

The outline of another example of the method for fabricating a Group III nitride compound semiconductor of the present invention will next be described with reference to FIG. 12. Although FIG. 12 illustrates layers accompanied by a substrate 2001 and a buffer layer 2002 so as to facilitate description and understanding of the relevant invention as recited in connection with other features, the substrate 2001 and the buffer layer 2002 are not an essential element of the present invention, as the present invention is to produce, by the employment of a Group III nitride compound semiconductor having threading dislocations in the vertical direction, a Group III nitride compound semiconductor layer including a region in which threading dislocations in the vertical direction are reduced. The gist of the operation and effects of the present invention will next be described with reference to an embodiment shown in FIG. 12A, in which a first Group III nitride compound semiconductor layer 2031 having threading dislocations in the vertical direction (direction vertical to the substrate surface) is provided on the surface of substrate 2001 via the buffer layer 2002. In this embodiment, the underlying layer is formed of the buffer layer 2002 and the first Group III nitride compound semiconductor layer 2031.

As shown in FIG. 12B, the underlying layer and the substrate 2001 are etched, to thereby form an island-like structure such as a dot-like, stripe-shaped, or grid-like structure, so as to provide trenches/mesas. The bottom portion of each trench is the bottom of the cavity provided in the substrate 2001. As shown in FIG. 12C, a second Group III nitride compound layer 2032 is epitaxially grown, vertically and laterally, with the underlying layer comprising the buffer layer 2002 and the first Group III nitride compound semiconductor layer 2031 serving as a nucleus. In the above manner, the second Group III nitride compound layer 2032 is epitaxially grown, vertically and laterally, with the top surface 2031a of the mesa and the sidewall 2031b of the trench serving as a nucleus, to thereby bury the trench and provide a cavity to the top surface 2001a of the trench provided in the substrate 2001, while epitaxial growth is effected in the vertical direction. In this case, propagation of threading dislocations contained in the first Group III nitride compound semiconductor layer 2031 can be prevented in the upper portion of the second Group III nitride compound semiconductor layer 2032 that is formed through lateral epitaxial growth, and a region in which threading dislocations are reduced is provided in the thus-buried trench (ninth feature). Thus, lateral epitaxial growth is immediately attained, with the sidewall/sidewalls 2031b serving as a nucleus. Specifically, in conventional ELO employing a mask, the height of the sidewall is greater than that of the growth nucleus portion by an amount corresponding to the thickness of the mask, and crystal growth proceeds in the vertical direction for a length corresponding to the mask thickness, and then turns around onto the top surface of the mask, to thereby initiate lateral growth. As a result, growing crystals are strained at the edge of the mask where the growth direction is changed, to thereby induce dislocations. In the present invention, the second Group III nitride compound semiconductor layer 2032 is laterally grown above the trench in the substrate 2001, in a manner other than that in which growth direction is changed along the mask, to thereby remove strain from the crystals, suppressing generation of dislocations. Alternatively, growth may be performed such that a cavity is provided between the trench in the substrate 2001 and the second Group III nitride compound semiconductor layer 2032. Accordingly, strain induced from the trench in the substrate 2001 can be suppressed, to thereby form crystals of more excellent quality. In conventional ELO in which the direction of growth is changed along the mask, layers grown from the both sidewalls serving as nuclei coalesce at a center site. In this case, crystal axes of two layers are known to be slightly tilted from each other. Generation of such tilting can be prevented by providing a cavity between the trench in the substrate 2001 and the second Group III nitride compound semiconductor layer 2032. Thus, there can be provided a lateral growth layer of quality higher than that obtained in a conventional method.

The aforementioned rapid lateral epitaxial growth can be readily attained when the sidewall of the trench formed of the Group III nitride compound semiconductor layer 2031 assumes a {11-20} plane (tenth feature). During lateral epitaxial growth, at least an upper portion of the growth front may remain a {11-20} plane. When the first Group III nitride compound semiconductor and the second Group III nitride compound semiconductor have the same composition, rapid lateral growth can be readily attained (eleventh feature).

Through the procedure as described above there can be provided the second Group III nitride compound semiconductor 2032 in which threading dislocations propagated from the first Group III nitride compound semiconductor layer 2031 are prevented. Although FIG. 12 illustrates a sidewall of the trench vertical to the substrate plane, the present invention is not limited thereto, and the sidewall may be an oblique plane.

By forming a device element as an upper layer on a portion of a Group III nitride compound semiconductor layer that is formed through lateral epitaxial growth through the above step, there can be provided a semiconductor device having a layer containing few defects and endowed with high mobility (twelfth feature).

By stacking, as an upper layer, a light-emitting element on a portion of a Group III nitride compound semiconductor layer that is formed through the above step, there can be provided a light-emitting device endowed with improved service life and improved LD threshold value (thirteenth feature).

By selectively separating, from the other layers, an upper layer formed on a portion of the Group III nitride compound semiconductor layer that is provided through lateral epitaxial growth through the above step, there can be produced a high-crystallinity Group III nitride compound semiconductor in which crystal defects such as dislocations are remarkably suppressed (fourteenth feature). In this connection, for the sake of convenience in manufacture, the expression "removing substantially entire portions" does not exclude the case in which a portion containing threading dislocations is present to some extent.

The outline of another example of the method for fabricating a Group III nitride compound semiconductor of the present invention will next be described with reference to FIG. 19. Although FIG. 19 illustrates layers accompanied by a substrate 3001 and a buffer layer 3002 so as to facilitate description and understanding of the relevant invention as recited in connection with other features, the substrate 3001 and the buffer layer 3002 are not essential elements of the present invention, as the present invention is to produce, by the employment of a Group III nitride compound semiconductor having threading dislocations in the vertical direction, a Group III nitride compound semiconductor layer including a region in which threading dislocations in the vertical direction are reduced. The gist of the operation and effects of the present invention will next be described with reference to an embodiment in which a first Group III nitride compound semiconductor layer 3031 having threading dislocations in the vertical direction (direction vertical to the substrate surface) is provided on the surface of substrate 3001 via the buffer layer 3002.

The first Group III nitride compound semiconductor layer 3031 is partially substituted or doped-by an element having an atomic radius greater than a predominant element. This means that, when a gallium nitride (GaN) layer is formed, Group III elements such as indium (In), which have an atomic radius greater than that of gallium (Ga), and/or Group V elements such as phosphorus (P), which have an atomic radius greater than that of nitrogen (N), are introduced. Through this introduction, crystalline expansion strain induced by defects of nitrogen atoms can be compensated by compression strain, to thereby provide improved crystallinity of the first Group III nitride compound semiconductor layer 3031. As shown in FIG. 19A, the crystallinity-improved first Group III nitride compound semiconductor layer 3031 is etched, to thereby form an island-like structure such as a dot-like, stripe-shaped, or grid-like structure, so as to provide trenches/mesas such that the surface of the substrate 3001 is exposed at the bottom portion of the trench. Thus, a second Group III nitride compound layer 3032 can be epitaxially grown, vertically and laterally, with a top surface of the mesa and a sidewall/sidewalls of the trench having good crystallinity and serving as a nucleus, to thereby bury the trench and also grow the layer in the vertical direction. If no vertical growth occurs from the exposed surface of the substrate 3001 or the rate of vertical growth is low, propagation of threading dislocations contained in the Group III nitride compound semiconductor layer 3031 can be prevented in the portion of the second Group III nitride compound semiconductor layer 3032 that is formed through lateral epitaxial growth, and a region in which treading dislocations are reduced is provide on the buried trench (fifteenth, sixteenth, seventeenth, and eighteenth features).

When the upper portion provided on the top portion of the mesa is grown from a Group III nitride compound semiconductor layer which is doped by an element having an atomic radius greater than a predominant element, threading dislocations are remarkably suppressed, as compared with the case in which the semiconductor layer is not doped. Thus, through epitaxial growth, with the first Group III nitride compound semiconductor layer which is doped with an element of large atomic radius and has good crystallinity serving as a nucleus, overall threading dislocations can be reduced, and a Group III nitride compound semiconductor having a region in which threading dislocations are remarkably suppressed can be fabricated. This is because propagation of threading dislocations in a portion formed through lateral epitaxial growth is synergistically suppressed through lateral epitaxial growth, with a region containing few threading dislocations serving as a nucleus.

FIG. 19 does not illustrate vertical epitaxial growth of the second Group III nitride compound semiconductor 3032 from the surface of the substrate 3001 serving as the bottom portion of the trench. However, vertical growth may arbitrarily occur in accordance with conditions. Thus, threading dislocations are not propagated in the vertical direction in the portion formed through lateral growth, with a sidewall/sidewalls of the trench serving as a nucleus. If no substantial discontinuity in the interface between the first Group III nitride compound semiconductor layer 3031 and the second Group III nitride compound semiconductor 3032 is provided during epitaxial growth, no electrical resistance attributed to a discontinuous portion is generated with respect to current flow in the vertical direction (direction normal to the surface of the substrate 3001), as compared with a similar structure having a mask made of an insulator or the like. Furthermore, a stable structure can be fabricated. In addition, there can be prevented propagation of threading dislocations along an insulator generated by employing a mask made of an insulator or the like.

In connection with the trench/mesa formed through etching, the width of the bottom portion of the trench and the height of the mesa are determined such that lateral growth from the sidewall/sidewalls for burying the trench proceeds faster than vertical growth from the bottom portion of the trench for burying the trench. Briefly, it is important that the trench/mesa be designed on the basis of epitaxial conditions (eighteenth feature). Thus, if the surface of the substrate 3001 is not exposed, propagation of threading dislocations to the second Group III nitride compound semiconductor 3032 for burying the trench can be prevented through appropriate design of the trench/mesa and epitaxial conditions. The feature is described with reference to FIGS. 20 and 21. FIG. 20 shows the case in which the buffer layer 3002 is exposed to the bottom portion of the trench. FIG. 21 shows the case in which a first Group III nitride compound semiconductor layer 3031 serves as the bottom portion of the trench; i.e. the trench does not penetrate the first Group III nitride compound semiconductor layer 3031. As shown in FIGS. 20 and 21, even when vertical epitaxial growth occurs from the bottom portion of the trench, the width of the bottom portion of the trench and the height of the trench are determined such that lateral growth from the sidewall/sidewalls for burying the trench proceeds faster than vertical growth from the bottom portion of the trench, to thereby attain the object. Each of FIGS. 20 and 21 illustrates vertical epitaxial growth from the bottom portion of the trench. However, if no substantial vertical epitaxial growth occurs from the bottom portion of the trench, the feature of growth becomes similar to that of FIG. 19.

The aforementioned rapid lateral epitaxial growth can be readily attained when the sidewall formed of the Group III nitride compound semiconductor layer 3031 assumes a {11-20} plane (twentieth feature). During lateral epitaxial growth, at least an upper portion of the growth front may remain a {11-20} plane. When the first Group III nitride compound semiconductor and the second Group III nitride compound semiconductor have the same composition, rapid lateral epitaxial growth can be readily attained (twenty-first feature).

Through the procedure as described above, threading dislocations propagated from the first Group III nitride compound semiconductor layer 3031 are prevented, to thereby provide a stable structure, and the second Group III nitride compound semiconductor layer 3032 can be formed without increasing electrical resistance attributed to a discontinuous interface. Although FIG. 19 illustrates a sidewall of the trench vertical to the substrate plane, the present invention is not limited thereto, and the sidewall may be an oblique plane. The trench may have a V-shaped cross-section. These features are equally applied to the descriptions below.

By forming a device as an upper layer on a lateral-epitaxially grown portion of a Group III nitride compound semiconductor layer produced through the above step, a semiconductor device having a layer containing few defects and endowed with high mobility can be provided (twenty-second feature).

By stacking, as an upper layer, a light-emitting element on a portion of a Group III nitride compound semiconductor layer that is formed through lateral epitaxial growth through the above step, there can be provided a light-emitting device endowed with improved service life and an improved LD threshold value (twenty-third feature).

By selectively separating, from the other layers, an upper layer formed on a portion of the Group III nitride compound semiconductor layer that is formed through lateral epitaxial growth through the above step, there can be produced a high-crystallinity Group III nitride compound semiconductor in which crystal defects such as dislocations are remarkably suppressed (twenty-fourth feature).

In this connection, for the sake of convenience in manufacture, the expression "removing substantially entire portions" does not exclude the case in which a portion containing threading dislocations is present to some extent.

The outline of another example of the method for fabricating a Group III nitride compound semiconductor of the present invention will next be described with reference to FIG. 29. Although FIG. 29 illustrates layers accompanied by a substrate 4001 so as to facilitate description and understanding of relevant dependent claims, the substrate 4001 is not an essential element of the present invention, as the present invention is to produce, by the employment of a Group III nitride compound semiconductor having threading dislocations in the vertical direction, a Group III nitride compound semiconductor layer including a region in which threading dislocations in the vertical direction are reduced.

As shown in FIG. 29A, an underlying layer is formed on the substrate, the underlying layer comprising a plurality of numbers of repetitions of a unit of a buffer layer and a Group III nitride compound semiconductor layer epitaxially grown on the buffer layer. Since buffer layers 4021 and 4023 are formed at a temperature where single crystals cannot be grown, the buffer layers 4021 and 4023 stop threading dislocations, to thereby form a high-crystallinity uppermost layer of a Group III nitride compound semiconductor layer 4031, in which threading dislocations are more suppressed is near the top surface of the layer. The thus-formed underlying layer 4020 is etched, to thereby form an island-like structure such as a dot-like, stripe-shaped, or grid-like structure, so as to provide a trench/mesa such that the surface of the substrate 4001 is exposed at the bottom portion of the trench (FIG. 29A). Thus, a second Group III nitride compound layer 4032 can be epitaxially grown, vertically and laterally, from a high-crystallinity Group III nitride compound semiconductor layer 4031, with a top surface of the mesa and a sidewall of the trench serving as a nucleus, to thereby bury the trench and also grow the layer in the vertical direction. If no vertical growth occurs from the exposed surface of the substrate 4001, or the rate of vertical growth is small, propagation of threading dislocations contained in the Group III nitride compound semiconductor layer 4031 can be prevented in the portion of the second Group III nitride compound semiconductor layer 4032 that is formed through lateral epitaxial growth, to thereby provide, on the buried trench, a region in which treading dislocations are reduced (twenty-fifth, twenty-sixth, and twenty-ninth features).

When a Group III nitride compound semiconductor layer serving as the upper portion provided on the top portion of the mesa is formed on the underlying layer comprising a multi-component layer, threading dislocations are remarkably suppressed, as compared with the case in which the underlying layer is not provided. Thus, through epitaxial growth, with the uppermost high-crystallinity first Group III nitride compound semiconductor layer of the Group III nitride compound semiconductor underlying layer comprising an arbitrary number of repetitions of a unit of a single-crystal layer and a buffer layer formed at a temperature where single crystals cannot be grown serving as a nucleus, overall threading dislocations can be reduced, and a Group III nitride compound semiconductor having a region in which threading dislocations are remarkably suppressed can be fabricated. This is because propagation of threading dislocations in a portion formed through lateral epitaxial growth is synergistically suppressed through lateral epitaxial growth, with a region containing few threading dislocations serving as a nucleus.

FIG. 29 does not illustrate vertical epitaxial growth of the second Group III nitride compound semiconductor 4032 from the bottom portion of the trench. However, vertical growth may arbitrarily occur in accordance with conditions. Thus, threading dislocations do not propagate in the vertical direction in the portion formed through lateral growth, with a sidewall/sidewalls of the trench serving as a nucleus. If no substantial discontinuity in the interface between the first Group III nitride compound semiconductor layer 4031 and the second Group III nitride compound semiconductor 4032 is provided during epitaxial growth, no electrical resistance attributed to a discontinuous portion is generated with respect to current flow in the vertical direction (direction normal to the surface of the substrate 4001), as compared with a similar structure having a mask made of an insulator or the like. Furthermore, a stable structure can be fabricated. In addition, there can be prevented propagation of threading dislocations along an insulator generated by employing a mask made of an insulator or the like.

The buffer layer constituting the underlying layer is preferably formed at a comparatively low temperature; i.e., 200–600° C., or contrary, at high temperature; i.e., 1000–1180° C. By employing such temperatures, a single-crystal layer in which threading dislocations are readily propagated is not formed, to thereby suppress threading dislocations (twenty-seventh feature).

When the buffer layer is formed by use of an aluminum (Al)-containing Group III nitride compound semiconductor, a polycrystalline layer can be readily formed. By employing the buffer layer, threading dislocations in a single-crystal layer serving as a nucleus for lateral epitaxial growth can be suppressed, providing a great synergistic effect (twenty-eighth feature).

In connection with the trench/mesa formed through etching, the width of the bottom portion of the trench and the height of the mesa are determined such that lateral growth from the sidewall/sidewalls for burying the trench proceeds faster than vertical growth from the bottom portion of the trench for burying the trench. Briefly, it is important that the trench/mesa be designed on the basis of epitaxial conditions (thirtieth feature). Thus, if the surface of the substrate 4001 is not exposed, propagation of threading dislocations to the second Group III nitride compound semiconductor 4032 for burying the trench can be prevented through appropriate design of the trench/mesa and epitaxial conditions. The feature is described with reference to FIGS. 30 and 31. FIG. 30 shows the case in which the buffer layer 4023, which is directly provided beneath the uppermost Group III nitride compound semiconductor layer 4031, is exposed to the bottom portion of the trench. FIG. 31 shows the case in which the uppermost Group III nitride compound semiconductor layer 4031 serves as the bottom portion of the trench; i.e. the trench does not penetrate the first Group III nitride compound semiconductor layer 4031. As shown in FIGS. 30 and 31, even when vertical epitaxial growth occurs from the bottom portion of the trench, the width of the bottom portion of the trench and the height of the mesa are determined such that lateral epitaxial growth from the sidewall/sidewalls of the trench for burying the trench proceeds faster than vertical growth from the bottom portion of the trench, to thereby attain the object. Each of FIGS. 30 and 31 illustrates vertical epitaxial growth from the bottom portion of the trench. However, if no substantial vertical epitaxial growth occurs from the bottom portion of the trench, the feature of growth becomes similar to that of FIG. 29.

The aforementioned rapid lateral epitaxial growth can be readily attained when the sidewall formed of the Group III nitride compound semiconductor layer 4031 assumes a {11-20} plane (thirty-first feature). During lateral epitaxial growth, at least an upper portion of the growth front may remain a {11-20} plane. When the first Group III nitride compound semiconductor and the second Group III nitride compound semiconductor have the same composition, rapid lateral growth can be readily attained (thirty-second feature).

Through the procedure as described above, threading dislocations propagated from the first Group III nitride compound semiconductor layer 4031 are prevented, to thereby provide a stable structure, and the second Group III nitride compound semiconductor 4032 can be formed without increasing electrical resistance attributed to a discontinuous interface. Although FIG. 29 illustrates a sidewall of the trench vertical to the substrate plane, the present invention is not limited thereto, and the sidewall of the trench may be an oblique plane. The trench may have a V-shaped cross-section. These features are equally applied to the descriptions below.

By forming a device as an upper layer on a lateral-epitaxially grown portion of a Group III nitride compound semiconductor layer produced through the above step, a semiconductor device having a layer containing few defects and endowed with high mobility can be provided (thirty-third feature).

By stacking, as an upper layer, a light-emitting element on a lateral-epitaxially grown portion of a Group III nitride compound semiconductor layer produced through the above step, a light-emitting device endowed with improved service life and an improved LD threshold value can be provided (thirty-fourth feature).

By selectively separating, from the other layers, an upper layer formed on a portion provided through lateral epitaxial growth in the Group III nitride compound semiconductor layer obtained through the above step, there can be produced a high-crystallinity Group III nitride compound semiconductor in which crystal defects such as dislocations are remarkably suppressed (thirty-fifth feature). In this connection, for the sake of convenience in manufacture, the expression "removing substantially entire portions" does not exclude the case in which a portion containing threading dislocations is present to some extent.

BRIEF DESCRIPTION OF THE DRAWINGS

FIG. 16 is a series of sectional views showing the steps of fabricating a Group III nitride compound semiconductor light-emitting device according to a fourteenth embodiment of the present invention;

FIG. 24 is a sectional view showing the structure of a Group III nitride compound semiconductor light-emitting device according to a twenty-first embodiment of the present invention;

BEST MODE FOR CARRYING OUT THE INVENTION

First Preferred Mode for Carrying out the Invention

Figure 1A:
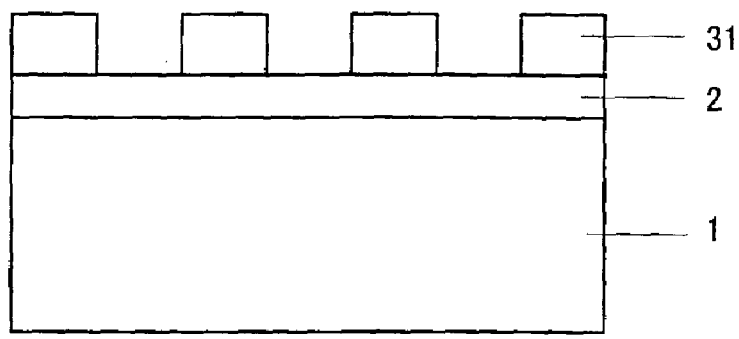
FIG. 1 is a series of sectional views showing the steps of fabricating a Group III nitride compound semiconductor according to a first embodiment of the present invention.
Figure 1B:
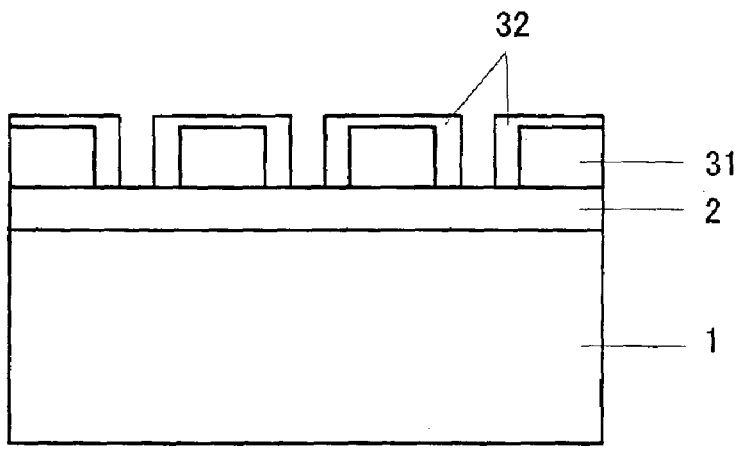
Figure 1C:
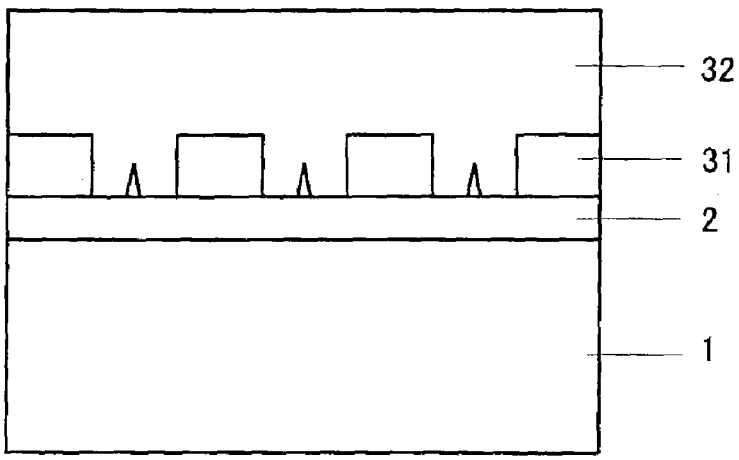

FIG. 1 schematically shows a mode for carrying out a method for fabricating a Group III nitride compound semiconductor of the present invention. FIG. 1 shows an example in which a buffer layer 2 is a "different layer." A substrate 1, the buffer layer 2 (a different layer), and a first Group III nitride compound semiconductor layer 31 are formed, followed by undergoing etching to form trenches (FIG. 1A). As a result of etching, mesas and trenches are formed; the unetched surface forms the tops of the mesas; and sidewalls and bottom portions (bottom surfaces) of the trenches are formed. The sidewalls are, for example, {11-20} planes. Next, under conditions of lateral epitaxial growth, a second Group III nitride compound semiconductor 32 is epitaxially grown while the sidewalls of the trenches and the top surfaces of the mesas serve as nuclei. A metal-organic growth process enables easy lateral epitaxial growth while the growth fronts remain the {11-20} planes. Portions of the second Group III nitride compound semiconductor 32 which are laterally grown from the sidewalls of the trenches are free from propagation of threading dislocation from the different layer (buffer layer) 2 (FIG. 1B). The form of etching and lateral epitaxial growth conditions are determined such that the fronts of lateral growth extending from the opposite sidewalls of the trenches coalesce above the bottoms of the trenches, whereby threading dislocation is suppressed in the regions of the second Group III nitride compound semiconductor 32 formed above the bottoms of the trenches (FIG. 1C).

Figure 2A:
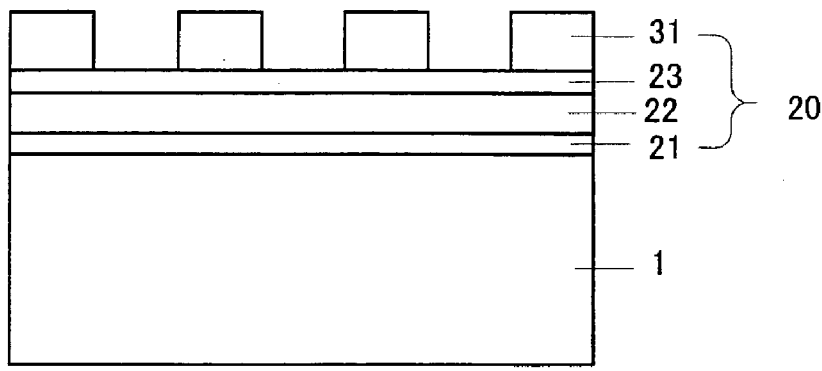
FIG. 2 is a series of sectional views showing the steps of fabricating a Group III nitride compound semiconductor according to a second embodiment of the present invention.
Figure 2B:
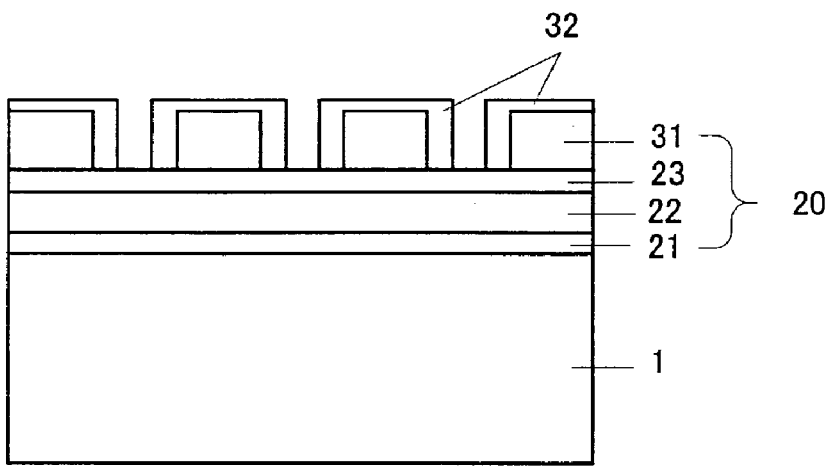
Figure 2C:
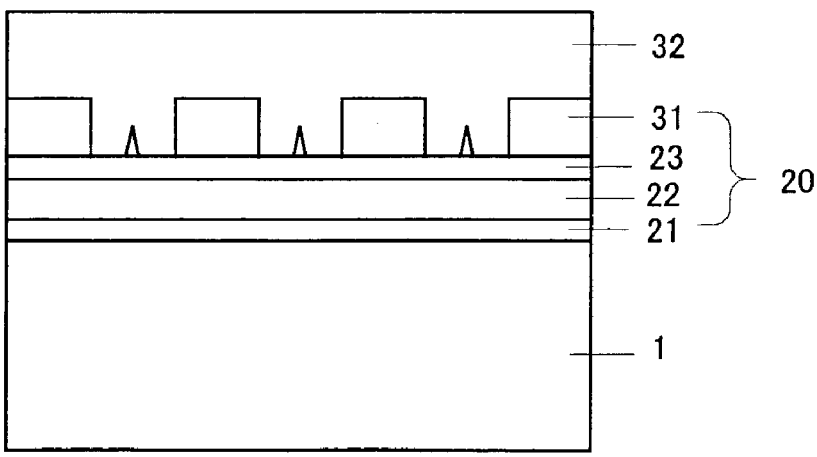
Figure 3A:
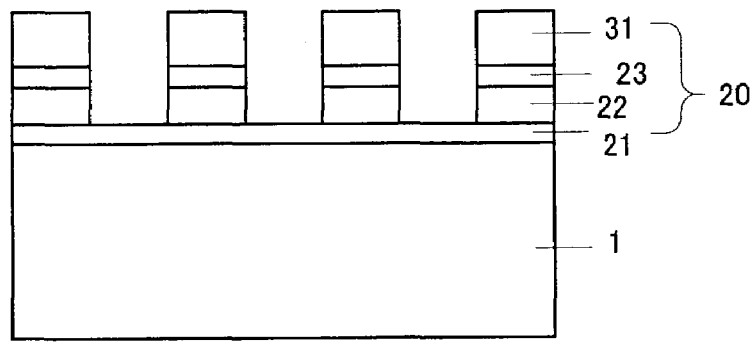
FIG. 3 is a series of sectional views showing the steps of fabricating a Group III nitride compound semiconductor according to a third embodiment of the present invention.
Figure 3B:
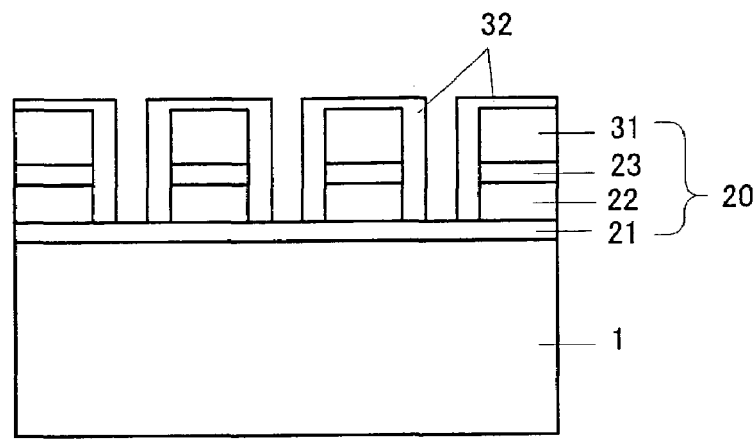
Figure 3C:
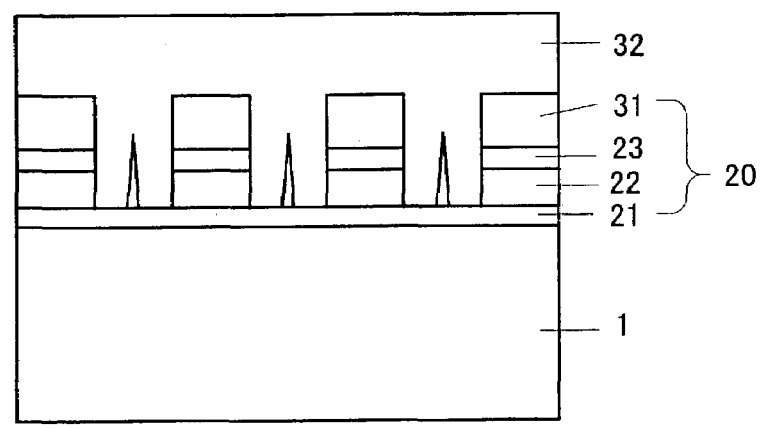

As shown in FIG. 2, an underlying layer may comprise a plurality of numbers of repetitions of a unit of a buffer layer formed on a substrate and a Group III nitride compound semiconductor layer grown epitaxially on the buffer layer. FIG. 2 shows an example in which a buffer layer 21, a Group III nitride compound semiconductor 22, a buffer layer 23, and a Group III nitride compound semiconductor 31 are sequentially formed and the Group III nitride compound semiconductor 31 is etched such that the buffer layer 23 is exposed at the bottoms of the trenches. Furthermore, a fabrication method may be such that, in a step corresponding to the step of FIG. 2A, etching is performed deeper than the thickness of the Group III nitride compound semiconductor layer 31 until the buffer layer 21 is exposed at the bottoms of the trenches (FIG. 3). In either case, portions of the Group III nitride compound semiconductor layer 32 formed above the bottoms of the trenches are formed primarily through lateral epitaxial growth while the Group III nitride compound semiconductor layer 31, which is the top layer of the mesas, serves as a nucleus, thereby becoming regions in which threading dislocation of vertical propagation is suppressed. Other effects to be yielded are similar to those described previously in relation to the case of FIG. 1.

Second Preferred Mode for Carrying out the Invention

FIG. 12 schematically shows a mode for carrying out a method for fabricating a Group III nitride compound semiconductor of the present invention. A buffer layer 2002 and a first Group III nitride compound semiconductor layer 2031 are formed on a substrate 2001 to thereby form an underlying layer (FIG. 12A). The underlying layer and the substrate 2001 are etched to form mesas and trenches (FIG. 12B). Next, a second Group III nitride compound semiconductor layer 2032 is formed through lateral epitaxial growth (FIG. 12C). FIG. 12C assumes that lateral epitaxial growth fronts are, for example, {11-20} planes; however, the present invention is not limited thereto. In the lateral growth step of FIG. 12C), through optimization of growth temperature and pressure and the III/V ratio of material to be supplied, lateral growth can be very faster than vertical growth. Lateral epitaxial growth conditions are determined such that the fronts of lateral growth proceeding while the underlying layer formed on the top surfaces of the mesas serves as a nucleus coalesce above the trenches etched in the substrate 2001, whereby threading dislocation is suppressed in regions of the second Group III nitride compound semiconductor 2032 formed above the trenches etched in the substrate 2001 (FIG. 12D).

Third Preferred Mode for Carrying out the Invention

FIG. 19 schematically shows a mode for carrying out a method for fabricating a Group III nitride compound semiconductor of the present invention. FIG. 19 shows an example in which gallium nitride (GaN) doped with an element of large atomic radius; specifically, indium (In), is formed on a substrate 3001 via a buffer layer 3002. FIG. 19 shows an example in which the surface of the substrate 3001 is exposed at the bottoms of trenches (FIG. 19A). The substrate 3001, the buffer layer 3002, and a first Group III nitride compound semiconductor (GaN) layer 3031 doped with indium (In) are formed. Since the first Group III nitride compound semiconductor (GaN) layer 3031 is doped with indium (In), whose atomic radius is greater than that of gallium (Ga), which is a predominant component element of the layer, the layer 3031 exhibits significantly good crystallinity, since compression strain compensates crystalline expansion strain induced through defects of nitrogen atoms. Then, etching is performed to form trenches (FIG. 19A). As a result of etching, mesas and trenches are formed; the unetched surface forms the tops of the mesas; and sidewalls and bottom portions (bottom surfaces) of the trenches where the surface of the substrate 3001 is exposed are formed. The sidewalls are, for example, {11-20} planes. Next, under conditions of lateral epitaxial growth, a second Group III nitride compound semiconductor 3032 is epitaxially grown while the sidewalls of the trenches and the top surfaces of the mesas, which exhibit good crystallinity, serve as nuclei. A metal-organic growth process enables easy lateral epitaxial growth while the growth fronts remain {11-20} planes. Portions of the second Group III nitride compound semiconductor 3032 which are laterally grown from the sidewalls of the trenches are free from propagation of threading dislocation from the surface of the substrate 3001 (FIG. 19B). The form of etching and lateral epitaxial growth conditions are determined such that the fronts of lateral growth extending from the opposite sidewalls of the trenches, which exhibit good crystallinity, coalesce above the bottoms of the trenches, whereby threading dislocation is suppressed in the regions of the second Group III nitride compound semiconductor 3032 formed above the bottoms of the trenches through etching (FIG. 19C). When the substrate 3001 is exposed, in contrast to the cases to be described next where the substrate 3001 is not exposed, the first Group III nitride compound semiconductor layer can assume a smaller thickness.

Figure 19A:
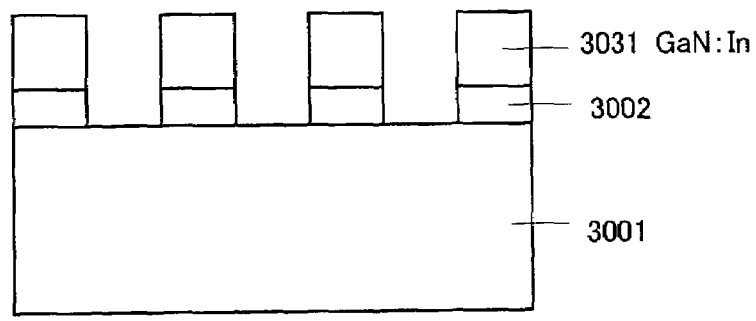
FIG. 19 is a series of sectional views showing the steps of fabricating a Group III nitride compound semiconductor according to a sixteenth embodiment of the present invention.
Figure 19B:
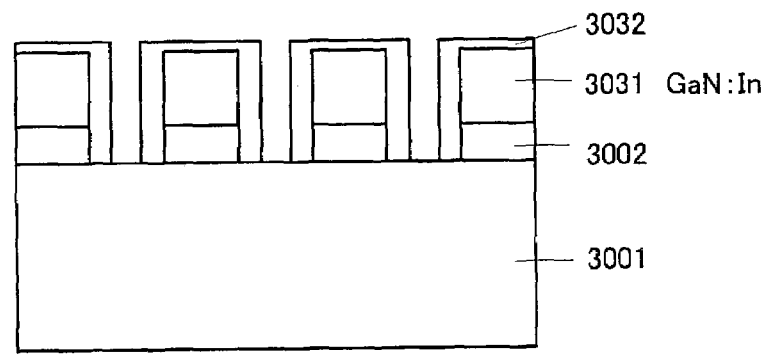
Figure 19C:
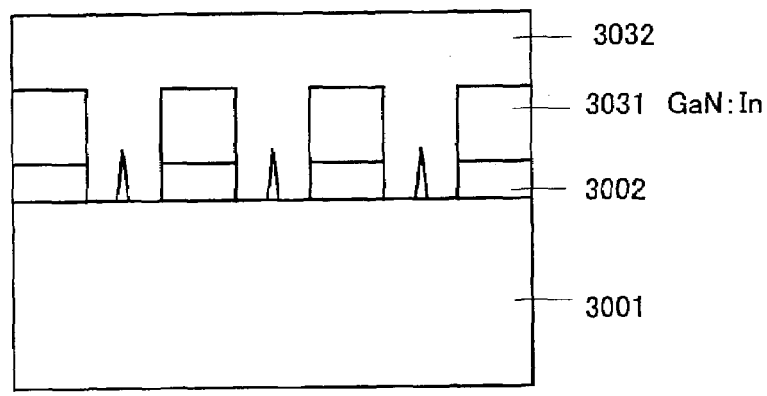
Figure 19D:
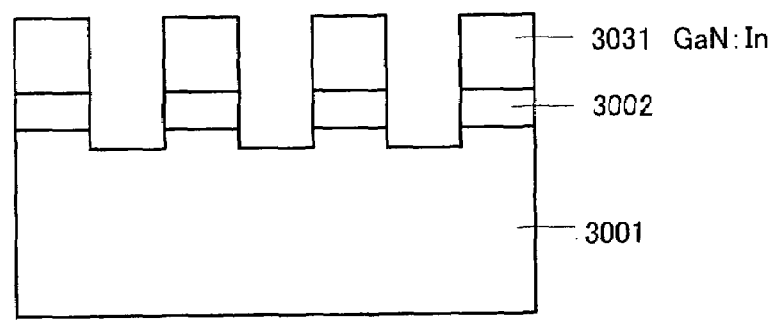
Figure 20A:
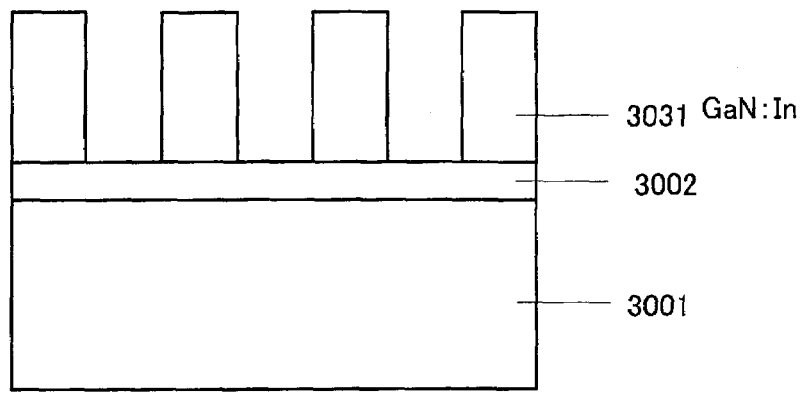
FIG. 20 is a series of sectional views showing the steps of fabricating a Group III nitride compound semiconductor according to a seventeenth embodiment of the present invention.
Figure 20B:
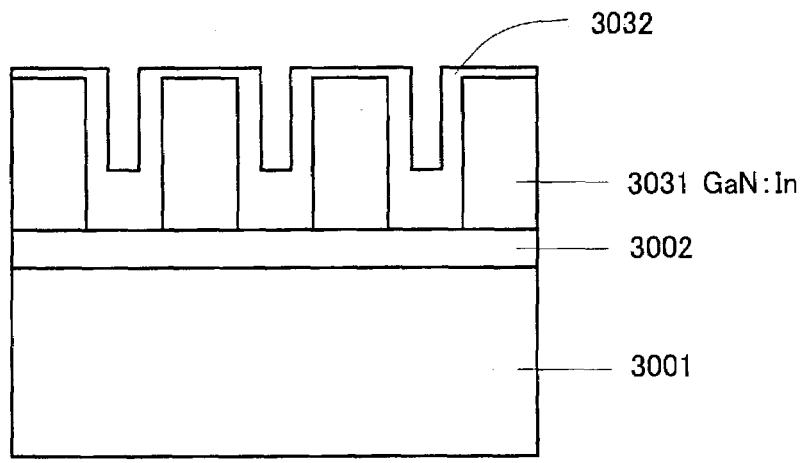
Figure 20C:
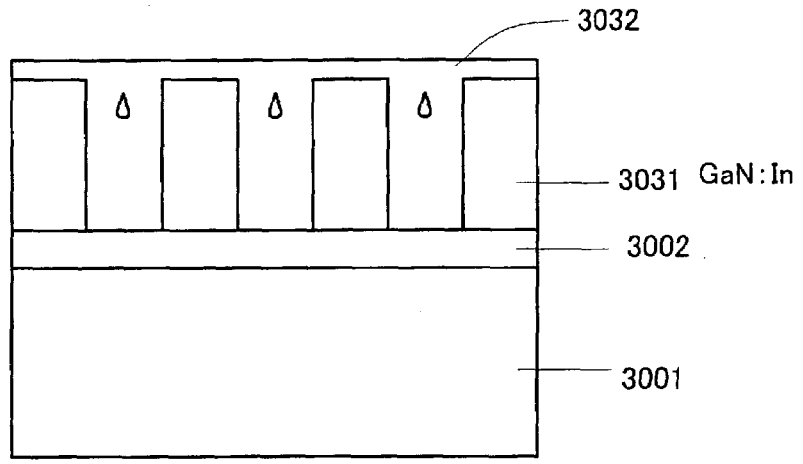
Figure 21A:
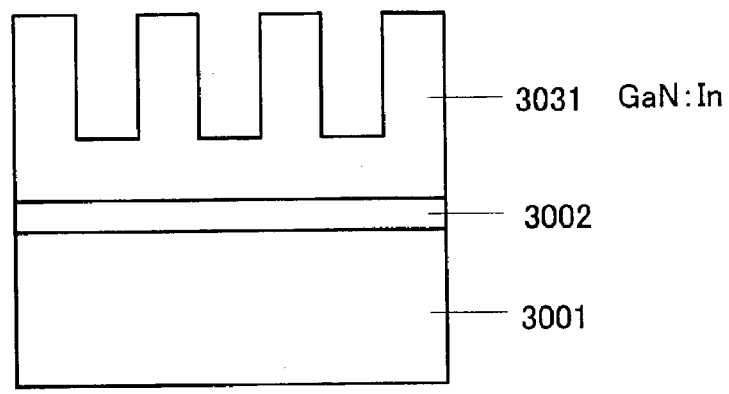
FIG. 21 is a series of sectional views showing the steps of fabricating a Group III nitride compound semiconductor according to an eighteenth embodiment of the present invention.
Figure 21B:
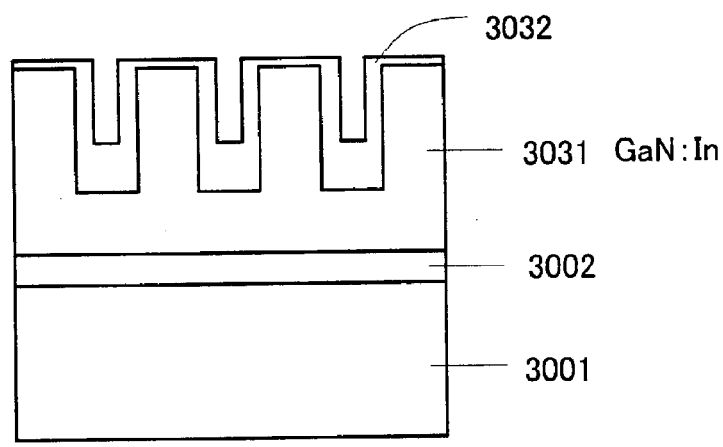
Figure 21C:
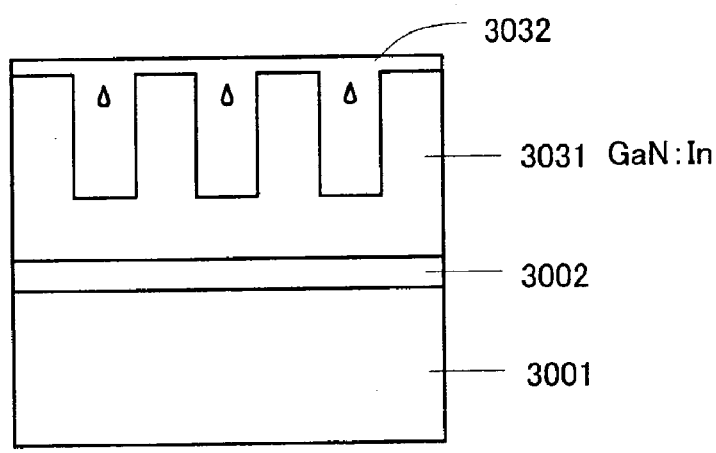
Figure 22A:
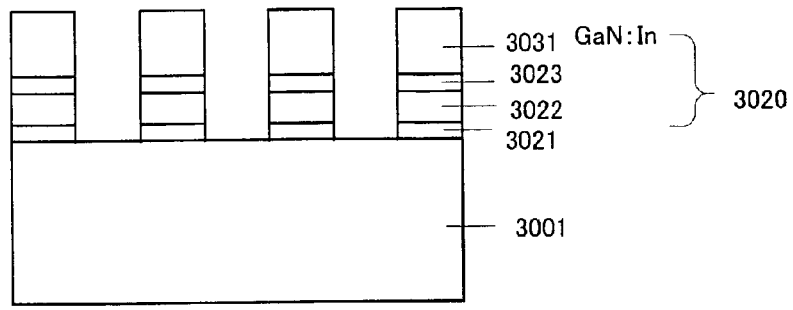
FIG. 22 is a series of sectional views showing the steps of fabricating a Group III nitride compound semiconductor according to a nineteenth embodiment of the present invention.
Figure 22B:
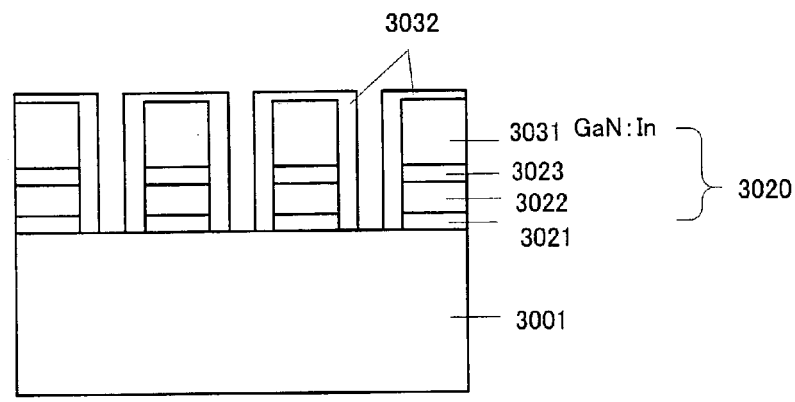
Figure 22C:
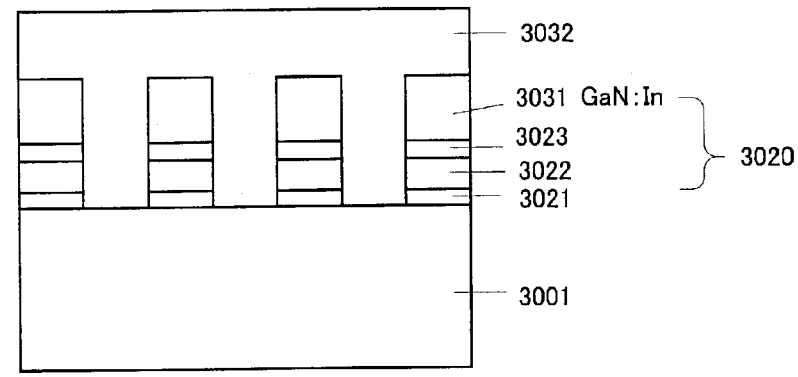

As shown in FIG. 20, a fabrication method may be such that, in a step corresponding to the step of FiG. 19A, etching is performed as deep as the thickness of the Group III nitride compound semiconductor layer 3031 doped with an element of large atomic radius, so as to expose the buffer layer 3002 at the bottoms of the trenches (FIG. 20A). Also, as shown in FIG. 21, a fabrication method may employ shallow etching such that the bottoms of the trenches are formed in the first Group III nitride compound semiconductor layer 3031 doped with an element of large atomic radius (FIG. 21A). Furthermore, as shown in FIG. 22, an underlying layer may comprise a plurality of repetitions of a unit of a buffer layer formed on a substrate and a Group III nitride compound semiconductor layer grown epitaxially on the buffer layer. FIG. 22 shows an example in which a buffer layer 3021, a Group III nitride compound semiconductor 3022, a buffer layer 3023, and a Group III nitride compound semiconductor 3031 doped with an element of large atomic radius are sequentially formed and the Group III nitride compound semiconductor 3031 is etched such that the substrate 3001 is exposed at the bottoms of the trenches. In any one of the above cases, portions of the Group III nitride compound semiconductor layer 3032 formed above the bottoms of the trenches are formed primarily through lateral epitaxial growth while the Group III nitride compound semiconductor layer 3031, which is the top layer of the mesas and is doped with an element of large atomic radius, serves as a nucleus, thereby becoming regions in which threading dislocation of vertical propagation is suppressed. Other effects to be yielded are similar to those described previously in relation to the case of FIG. 19.

Fourth Preferred Mode for Carrying out the Invention

FIG. 29 schematically shows a mode for carrying out a method for fabricating a Group III nitride compound semiconductor of the present invention. An underlying layer formed on a substrate comprises repetitions of a buffer layer and a Group III nitride compound semiconductor layer grown epitaxially on the buffer layer. As shown in FIG. 29, a first buffer layer 4021, a Group III nitride compound semiconductor 4022, a second buffer layer 4023, and a Group III nitride compound semiconductor 4031 are sequentially formed to thereby form the underlying layer. The underlying layer 4020 is etched to form mesas and trenches. FIG. 29 shows an example in which the surface of the substrate 4001 is exposed at the bottoms of the trenches (FIG. 29A). The unetched surface forms the tops of the mesas, and sidewalls and bottom portions (bottom surfaces) of the trenches are formed. The sidewalls are, for example, {11-20} planes. Next, under conditions of lateral epitaxial growth, a second Group III nitride compound semiconductor 4032 is epitaxially grown while the sidewalls of the trenches and the top surfaces of the mesas serve as nuclei. A metal-organic growth process enables easy lateral epitaxial growth while the growth fronts maintain the {11-20} planes. Thus, when lateral growth from the sidewalls of the trenches progresses while vertical growth from the surface of the substrate 4001 is absent or very slow, threading dislocation hardly propagates to the second Group III nitride compound semiconductor 4032 from the bottoms of the trenches (FIG. 29B). The form of etching and lateral epitaxial growth conditions are determined such that the fronts of lateral growth extending from the opposite sidewalls of the trenches coalesce above the bottoms of the trenches, whereby threading dislocation is suppressed to a significantly high degree in the regions of the second Group III nitride compound semiconductor 4032 formed above the bottoms of the trenches (FIG. 29C). In contrast to the cases to be described next where the substrate 4001 is not exposed, the first Group III nitride compound semiconductor layer can assume a smaller thickness.

Figure 30A:
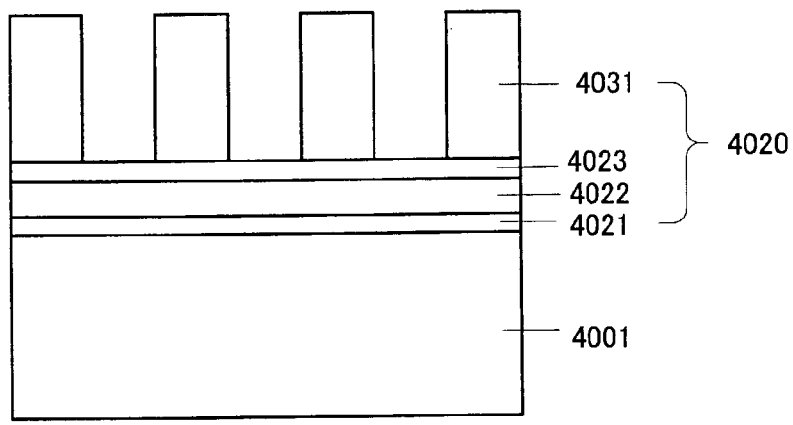
FIG. 30 is a series of sectional views showing the steps of fabricating a Group III nitride compound semiconductor according to a twenty-sixth embodiment of the present invention.
Figure 30B:
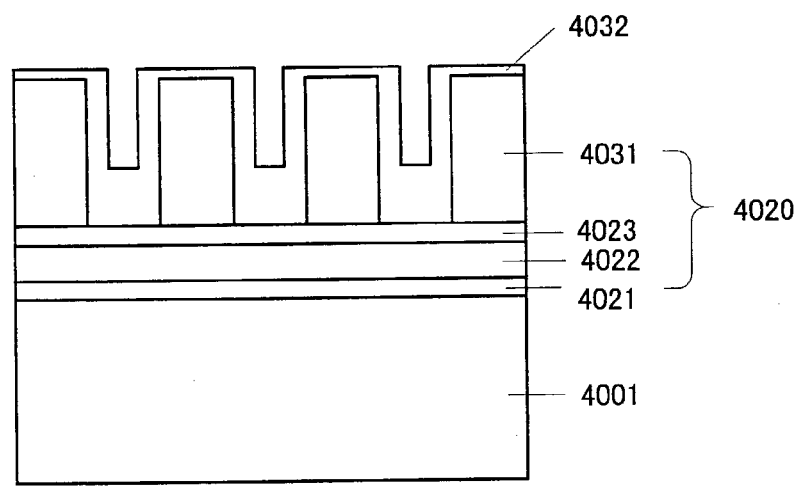
Figure 30C:
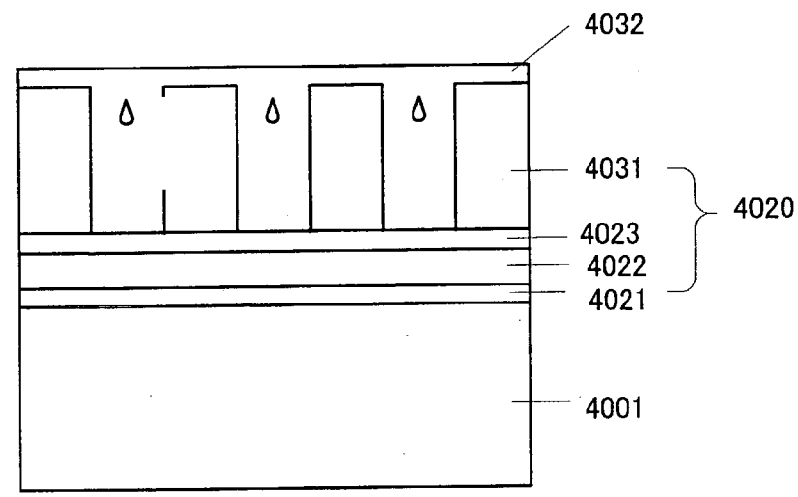
Figure 31A:
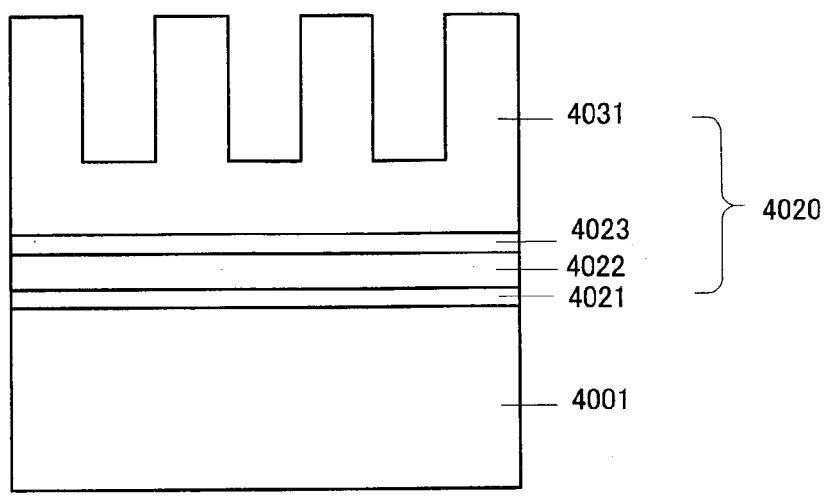
FIG. 31 is a series of sectional views showing the steps of fabricating a Group III nitride compound semiconductor according to a twenty-seventh embodiment of the present invention.
Figure 31B:
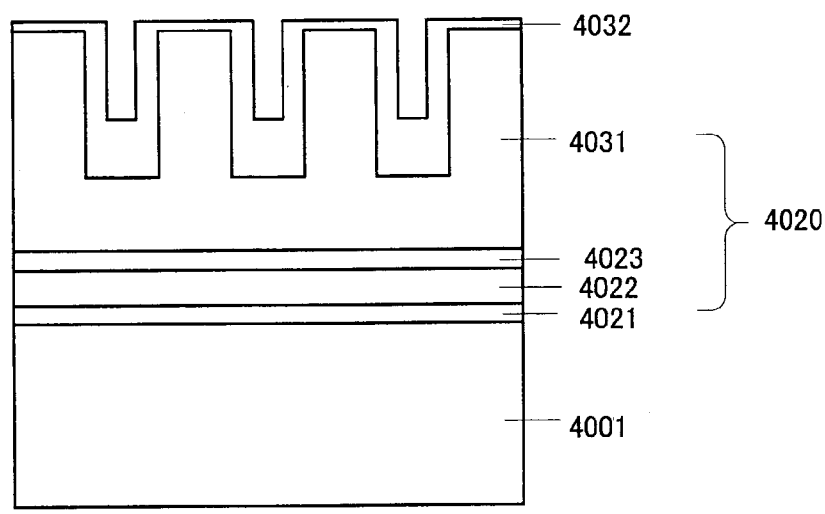
Figure 31C:
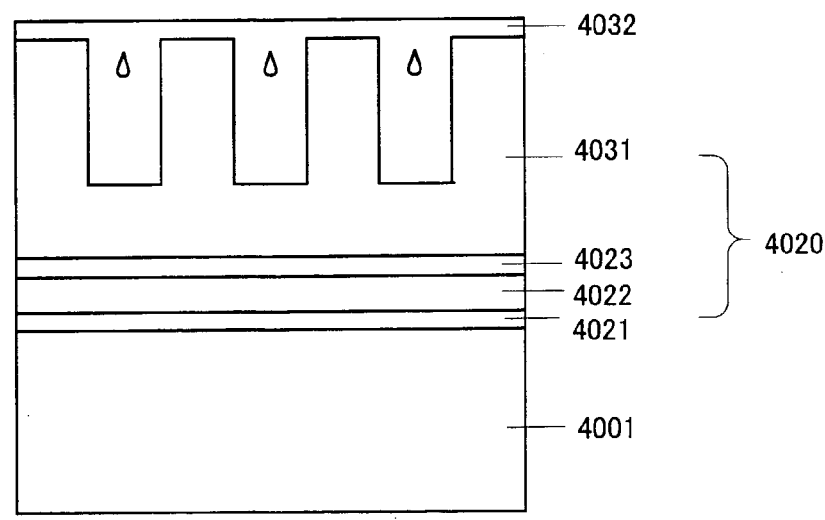

As shown in FIG. 30, the second buffer layer 4023 may be exposed at the bottoms of the trenches. Furthermore, a fabrication method may be such that, in a step corresponding to the step of FIG. 30A, etching is performed shallower than the thickness of the Group III nitride compound semiconductor layer 4031 such that the bottoms of the trenches are formed in the Group III nitride compound semiconductor layer 4031 (FIG. 31). In either case, portions of the Group III nitride compound semiconductor layer 4032 formed above the bottoms of the trenches are formed primarily through lateral epitaxial growth while the Group III nitride compound semiconductor layer 4031, which is the top layer of the mesas, serves as a nucleus, thereby becoming regions in which threading dislocation of vertical propagation is suppressed. Other effects to be yielded are similar to those described previously in relation to the case of FIG. 29. Notably, when vertical growth from the bottoms of the trenches is unavoidable, the relationship between the depth and the width of the trenches is designed such that the trenches are filled through lateral epitaxial growth before being filled through vertical growth.

The above-described first through fourth modes for carrying out the invention allow selections and modifications to be described below. The description appearing below is common to the first through fourth modes for carrying out the invention.

1. Types of Substrate

When a laminate including a substrate and a Group III nitride compound semiconductor is to be formed, the substrate may be an inorganic crystalline substrate of sapphire, silicon (Si), silicon carbide (SiC), spinel ($MgAl_2O_4$), ZnO, MgO, or the like, and a Group III-V compound semiconductor, such as a gallium phosphide or gallium arsenide semiconductor, or a Group III nitride compound semiconductor, such as a gallium nitride (GaN) semiconductor, may be used.

2. Process of Growing and Buffer Layer

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to impart good crystallinity to the layer, a buffer layer is preferably formed for the purpose of correcting lattice mismatch with the sapphire substrate. When a substrate of another material is to be used, employment of a buffer layer is also preferred. A buffer layer is preferably of a Group III nitride compound semiconductor $Al_xGa_yIn_{1-x-y}N$ formed at low temperature ($0 \leq x \leq 1$, $0 \leq y \leq 1$, $0 \leq x+y \leq 1$), more preferably of $Al_xGa_{1-x}N$ ($0 \leq x \leq 1$). This buffer layer may be a single layer or a multi-component layer comprising layers of different compositions. A buffer layer may be formed at a low temperature of 380–420° C. or by MOCVD at a temperature of 1000–1180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200–600° C., more preferably 300–500° C., most preferably 350–450° C. When physical vapor deposition, such as sputtering, is employed, the thickness of a buffer layer is preferably 100–3000 angstroms, more preferably 100–400 angstroms, most preferably 100–300 angstroms. A multi-component layer may comprise, for example, alternating $Al_xGa_{1-x}N$ ($0 \leq x \leq 1$) layers and GaN layers. Alternatively, a multi-component layer may comprise alternating layers of the same composition formed at a temperature of not higher than 600° C. and at a temperature of not lower than 1000° C. Of course, these arrangements may be combined. Also, a multi-component layer may comprise three or more different types of Group III nitride compound semiconductors $Al_xGa_yIn_{1-x-y}N$ ($0 \leq x \leq 1$, $0 \leq y \leq 1$, $0 \leq x+y \leq 1$). Generally, a buffer layer is amorphous and an intermediate layer is monocrystalline. Repetitions of unit of a buffer layer and an intermediate layer may be formed, and the number of repetitions is not particularly limited. The greater the number of repetitions, the greater the improvement in crystallinity.

3. Materials

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately 1/100 to 1/1000. In the case of an underlying layer comprising two or more repetitions of a buffer layer and a Group III nitride compound semiconductor layer, the Group III nitride compound semiconductor layers are further preferably doped with an element greater in atomic radius than a predominant component element. In the case where a light-emitting device is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

4. Lateral Growth

Preferably, the front of lateral epitaxial growth is perpendicular to a substrate. However, lateral epitaxial growth may progress while slant facets with respect to the substrate are maintained. In this case, trenches may have a V-shaped cross section.

Preferably, lateral epitaxial growth progresses such that at least an upper portion of the front of lateral epitaxial growth is perpendicular to the surface of a substrate. More preferably, growth fronts are {11-20} planes of a Group III nitride compound semiconductor.

The depth and width of trenches to be etched may be determined such that lateral epitaxial growth fills the trenches. Alternatively, a gap may be present between the bottoms of trenches and a laterally grown semiconductor. Conditions of etching are determined while utilizing the phenomenon that vertical growth from the surface of a substrate or from a layer, such as a buffer layer, that differs from a layer to be grown through ELO does not take place or is very slow in at least the initial stage of growth.

In the third and fourth modes for carrying out the invention, most preferably, the trenches are etched such that the substrate is exposed at the bottoms of the trenches. Also, as in the fourth mode for carrying out the invention, etching may extend deep into the substrate. By contrast, as in the first mode for carrying out the invention, etching may be terminated within the underlying layer so as not to expose the substrate; i.e., so as to expose the buffer layer formed on the substrate or the buffer layer formed within the underlying layer. When a layer different from a semiconductor layer to be grown through ELO is formed from AlN, $Al_xGa_{1-x}N$, or $Al_xGa_yIn_{1-x-y}N$ ($x \neq 0$) and the first Group III nitride compound semiconductor is a GaN semiconductor, the different layer formed from AlN, $Al_xGa_{1-x}N$, or $Al_xGa_yIn_{1-x-y}N$ ($x \neq 0$) serves favorably as a stopper layer during plasma etching involving chlorine in the form of, for example, $Cl_2$ or $BCl_3$. This is also applicable when the different layer is the top buffer layer of an underlying layer comprising an arbitrary number of repetitions of a unit of a buffer layer and a Group III nitride compound semiconductor layer. Thus, there can be easily established conditions for accelerating lateral growth from the sidewalls of the first Group III nitride compound semiconductor layer while vertical growth from the different layer is suppressed. Thus, the design of trenches can be facilitated, and the trenches can be rendered shallow.

When the crystal orientation of a Group III nitride compound semiconductor layer to be formed on a substrate can be predicted, masking or etching in the form of stripes perpendicular to the a-plane ({11-20} plane) or the in-plane ({1-100} plane) of the Group III nitride compound semiconductor layer is favorable. The aforementioned etching or mask patterns may be island-like or grid-like or may assume other forms. The front of lateral epitaxial growth may be perpendicular or oblique to the surface of a substrate. In order for the a-plane; i.e., the {11-20} plane, of a Group III nitride compound semiconductor layer to become the front of lateral epitaxial growth, the longitudinal direction of stripes must, for example, be perpendicular to the in-plane; i.e., the {1-100} plane, of the Group III nitride compound semiconductor layer. For example, when the surface of a substrate is the a-plane or the c-plane of sapphire, the in-plane of sapphire usually matches the a-plane of a Group III nitride compound semiconductor layer formed on the substrate. Thus, etching is performed according to the arrangement of the planes. In the case of a point-like, grid-like, or island-like etching, planes that define an outline (sidewalls) are preferably {11-20} planes.

5. Etching

An etching mask may comprise a polycrystalline semiconductor, such as polycrystalline silicon or polycrystalline nitride semiconductor; an oxide or nitride, such as silicon oxide ($SiO_x$), silicon nitride ($SiN_x$), titanium oxide ($TiO_x$), or zirconium oxide ($ZrO_x$); or a high-melting-point metal, such as titanium (Ti) or tungsten (W); or may assume the form of a multi-layer film thereof. The etching mask may be formed by a vapor phase growth process, such as vapor deposition, sputtering, or CVD, or other processes.

Reactive ion beam etching (RIE) is preferred, but any other etching process may be employed. When trenches having sidewalls oblique to the surface of a substrate are to be formed, anisotropic etching is employed. By means of anisotropic etching, trenches are formed such that the trenches have a V-shaped cross section.

6. Devices

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer assumes a multi-quantum well (MQW) structure, a single-quantum well (SQW) structure, a homo-structure, a single-hetero-structure, or a double-hetero-structure, or may be formed by means of, for example, a pin junction or a pn junction.

7. Preparation of Substrate

The above-described Group III nitride compound semiconductor having regions where threading dislocation is suppressed can be formed into a Group III nitride compound semiconductor substrate through removal of, for example, the substrate 1, the buffer layer 2, and portions of the Group III nitride compound semiconductor where threading dislocation is not suppressed. The thus-formed substrate allows formation of a Group III nitride compound semiconductor device thereon or may be used as a substrate for forming a greater Group III nitride compound semiconductor crystal.

The removal can be performed by mechanochemical polishing or any other appropriate process.

The present invention will next be described with reference to specific embodiments. The embodiments will be described while mentioning a method for fabricating a light-emitting device. However, the present invention is not limited to the embodiments to be described below. The present invention discloses a method for fabricating a Group III nitride compound semiconductor applicable to fabrication of any device.

In all the embodiments to be described below, the Group III nitride compound semiconductor of the present invention was fabricated by metal-organic vapor phase epitaxy (hereinafter called "MOVPE"). Typical gases used include ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), cyclopentadienylmagnesium ($Mg(C_5H_5)_2$, hereinafter called "$Cp_2Mg$"), and silane ($SiH_4$).

[First Embodiment]

FIG. 1 shows the steps of the present embodiment. A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, a buffer layer 2 of AlN having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer 31 having a thickness of approximately 0.5 μm.

By use of a hard bake resist mask, stripe-shaped trenches each having a width of 1 μm and a depth of 0.5 μm were selectively dry-etched at intervals of 1 μm by reactive ion beam etching (RIE). As a result, mesas of the GaN layer 31 each having a width of 1 μm and a height of 0.5 μm and trenches each having a width of 1 μm and having the buffer-layer 2 exposed at the bottom thereof were alternatingly formed (FIG. 1A). At this time, the {11-20} planes of the GaN layer 31 were caused to serve as the sidewalls of the trenches of a depth of 0.5 μm.

Next, while the temperature of the sapphire substrate 1 was maintained at 1150° C., $H_2$ (20 L/min), $NH_3$ (10 L/min), and TMG (2 μmol/min) were introduced to thereby form a GaN layer 32 through lateral epitaxial growth performed while the sidewalls of the trenches of a depth of 0.5 μm; i.e., the {11-20} planes of the GaN layer 31, serve as nuclei. At this time, vertical epitaxial growth hardly took place from the top surfaces of the mesas and from the surface of the buffer layer 2 exposed at the bottoms of the trenches (FIG. 1B). Lateral epitaxial growth was performed while the {11-20} planes primarily served as the growth fronts, thereby filling the trenches and thus establishing a flat top surface (FIG. 1C). Subsequently, $H_2$ (20 L/min), $NH_3$ (10 L/min), and TMG (300 μmol/min) were introduced to thereby grow the GaN layer 32 such that the total thickness of the GaN layer 31 and the. GaN layer 32 becomes 3 μm. In contrast to portions of the GaN layer 32 formed above the top surfaces of the mesas, portions of the GaN layer 32 formed above the bottoms of the trenches extending as deep as 0.5 μm through the GaN layer 31 exhibited significant suppression of threading dislocation.

[Second Embodiment]

The present embodiment used an underlying layer comprising a plurality of layers as shown in FIG. 2. A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, a first AlN layer (first buffer layer) 21 having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer (intermediate layer) 22 having a thickness of approximately 0.3 μm. Next, the temperature was dropped to 400° C., and $H_2$ (10 L/min), $NH_3$ (5 L/min), and TMA (20 μmol/min) were supplied for approximately 3 minutes to thereby form a second AlN layer (second buffer layer) 23 having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer 31 having a thickness of approximately 0.5 μm. Thus was formed an underlying layer 20 comprising the first AlN layer (first buffer layer) 21 having a thickness of approximately 40 nm, the GaN layer (intermediate layer) 22 having a thickness of approximately 0.3 μm, the second AlN layer (second buffer layer) 23 having a thickness of approximately 40 nm, and the GaN layer 31 having a thickness of approximately 0.5 μm. Generally, a buffer layer is amorphous and an intermediate layer is monocrystalline. Repetitions of a buffer layer and an intermediate layer may be formed, and the number of repetitions is not particularly limited. The greater the number of repetitions, the greater the improvement in crystallinity.

Next, by use of a hard bake resist mask, stripe-shaped trenches each having a width of 1 μm and a depth of 0.5 μm were selectively dry-etched at intervals of 1 μm by reactive ion beam etching (RIE). As a result, mesas of the GaN layer 31 each having a width of 1 μm and a height of 0.5 μm and trenches each having a width of 1 μm and having the second AlN layer 23 exposed at the bottom thereof were alternatingly formed (FIG. 2). At this time, the {11-20} planes of the GaN layer 31 were caused to serve as the sidewalls of the trenches of a depth of 0.5 μm.

Next, while the temperature of the sapphire substrate 1 was maintained at 1150° C., $H_2$ (20 L/min), $NH_3$ (10 L/min), and TMG (2 μmol/min) were introduced to thereby form a GaN layer 32 through lateral epitaxial growth performed while the sidewalls of the trenches of a depth of 0.5 μm; i.e., the {11-20} planes of the GaN layer 31, serve as nuclei. At this time, vertical epitaxial growth hardly took place from the top surfaces of the mesas and from the surface of the second AlN layer 23 (a different layer) exposed at the bottoms of the trenches. Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 μmol/min) were introduced to thereby grow the GaN layer 32 such that the total thickness of the GaN layer 31 and the GaN layer 32 becomes 3 μm. In contrast to portions of the GaN layer 32 formed above the top surfaces of the mesas, portions of the GaN layer 32 formed above the bottoms of the trenches extending as deep as 0.5 μm through the GaN layer 31 exhibited significant suppression of threading dislocation.

[Third Embodiment]

As in the second embodiment, an underlying layer 20 comprising a first AlN layer (first buffer layer) 21 having a thickness of approximately 40 nm, a GaN layer (intermediate layer) 22 having a thickness of approximately 0.3 μm, a second AlN layer (second buffer layer) 23 having a thickness of approximately 40 nm, and a GaN layer 31 having a thickness of approximately 0.5 μm was formed on a sapphire substrate 1. Subsequently, etching to a depth of approximately 0.8 μm was performed to thereby alternatingly form mesas whose top layer is the GaN layer 31 and which each has a width of 1 μm and a height of 0.8 μm, and trenches each having a width of 1 μm and having the first AlN layer 21 exposed at the bottom thereof (FIG. 3). At this time, the {11-20} planes of the GaN layer 31, the second AlN layer (second buffer layer) 2, and the GaN layer (intermediate layer) 22 were caused to serve as the sidewalls of the trenches of a depth of 0.8 μm. As in the second embodiment, lateral epitaxial growth was performed while the {11-20} planes primarily served as the growth fronts, thereby establishing a flat top surface. Subsequently, the GaN layer 32 was grown such that the total thickness of the GaN layer 31 and the GaN layer 32 becomes 3 μm. In contrast to portions of the GaN layer 32 formed above the top surfaces of the mesas, portions of the GaN layer 32 formed above the bottoms of the trenches extending as deep as approximately 0.8 μm through the GaN layer 31, the second AlN layer (second buffer layer) 23, and the GaN layer (intermediate layer) 22 exhibited significant suppression of threading dislocation.

[Fourth Embodiment]

Figure 4A:
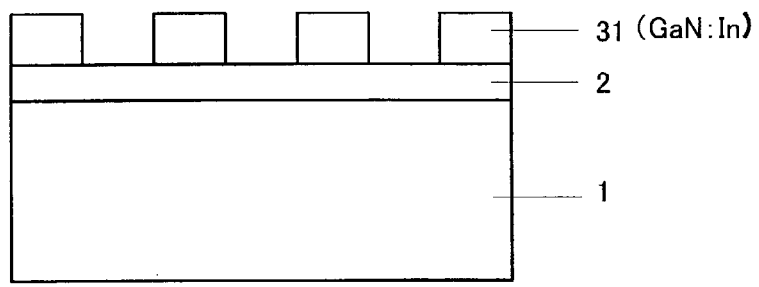
FIG. 4 is a series of sectional views showing the steps of fabricating a Group III nitride compound semiconductor according to a fourth embodiment of the present invention.
Figure 4B:
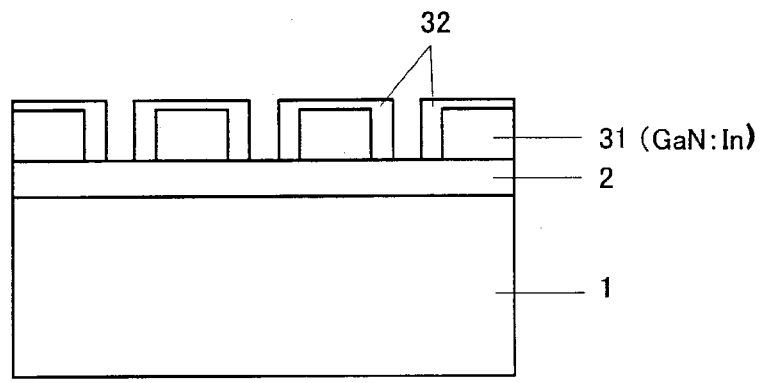
Figure 4C:
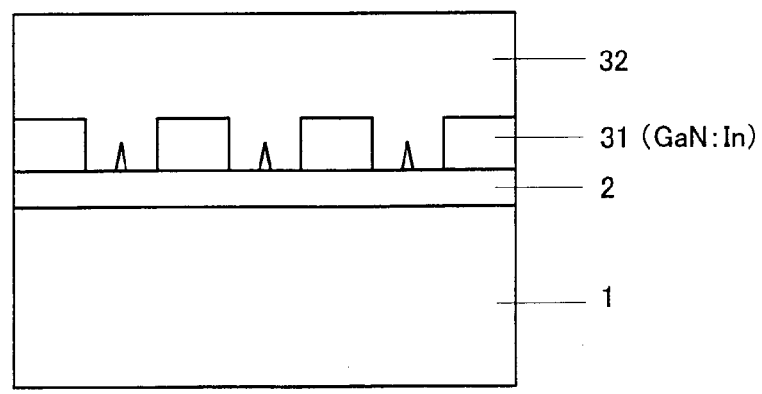

According to the present embodiment, the first to third embodiments were modified such that, in formation of the GaN layer 31, the GaN layer 31 was doped with TMI to become a GaN:In layer 31. The dosage of indium (In) was approximately $1\times10^{16}/cm^3$. Subsequently, etching and lateral epitaxial growth of GaN were performed in a manner substantially similar to that of the first to third embodiments (FIG. 4). The GaN layer 32 which was laterally grown while the GaN:In layer 31 served as a nucleus exhibited a slightly lower degree of threading dislocation than did the first embodiment. Portions of the GaN layer 32 grown vertically above the GaN:In layer 31 exhibited threading dislocation reduced to approximately 1/100 that of the first to third embodiments.

Similarly, the first to third embodiments were modified such that the AlN layers 21 and 22 and the GaN layer (intermediate layer) 22 were doped with indium (In). Furthermore, the first to third embodiments were modified such that the laterally grown GaN layer 32 was doped with indium (In). These modified embodiments exhibited reduction in threading dislocation to approximately 1/100 as compared with the first to third embodiments.

[Fifth Embodiment]

Figure 5:
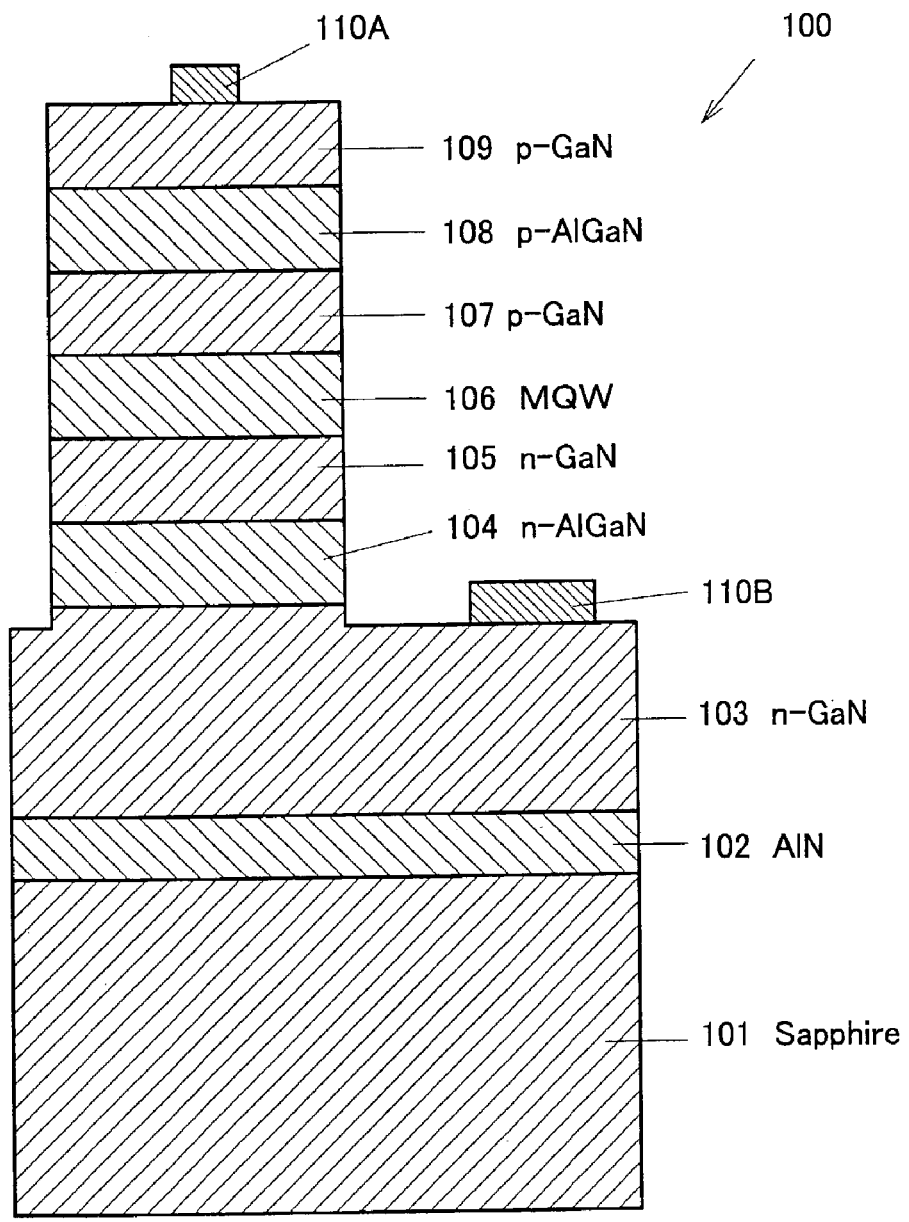
FIG. 5 is a sectional view showing the structure of a Group III nitride compound semiconductor light-emitting device according to a fifth embodiment of the present invention.

On a wafer formed in a manner similar to that of the first embodiment, a laser diode (LD) 100 shown in FIG. 5 was formed in the following manner. Notably, in formation of the GaN layer 32, silane ($SiH_4$) was introduced so as to form a silicon (Si)-doped n-type GaN layer serving as the GaN layer 32. For the sake of simplified illustration, the drawing merely illustrates a GaN layer 103 to inclusively represent the GaN layer 31 and the GaN layer 32.

On a wafer comprising a sapphire substrate 101, a buffer layer 102 of AlN, and the two-layered GaN layer 103 consisting of a GaN layer and an n-type GaN layer, an n-clad layer 104 of silicon (Si)-doped $Al_{0.08}Ga_{0.92}N$, an n-guide layer 105 of silicon (Si)-doped GaN, an MQW-structured light-emitting layer 106, a p-guide layer 107 of magnesium (Mg)-doped GaN, a p-clad layer 108 of magnesium (Mg)-doped $Al_{0.08}Ga_{0.92}N$, and a p-contact layer 109 of magnesium (Mg)-doped GaN were formed. Next, an electrode 110A of gold (Au) was formed on the p-contact layer 109. Etching was partially performed until the two-layered GaN layer 103 consisting of the GaN layer and the n-type GaN layer was exposed. On the exposed GaN layer 103, an electrode 110B of aluminum (Al) was formed. An essential portion of the laser diode (LD) 100 was formed on the lateral epitaxial growth regions of the GaN layer 103; i.e., above the regions where threading dislocation is suppressed. The thus-formed laser diode (LD) 100 exhibited the significant improvement of device life and light-emitting efficiency.

[Sixth Embodiment]

Figure 6:
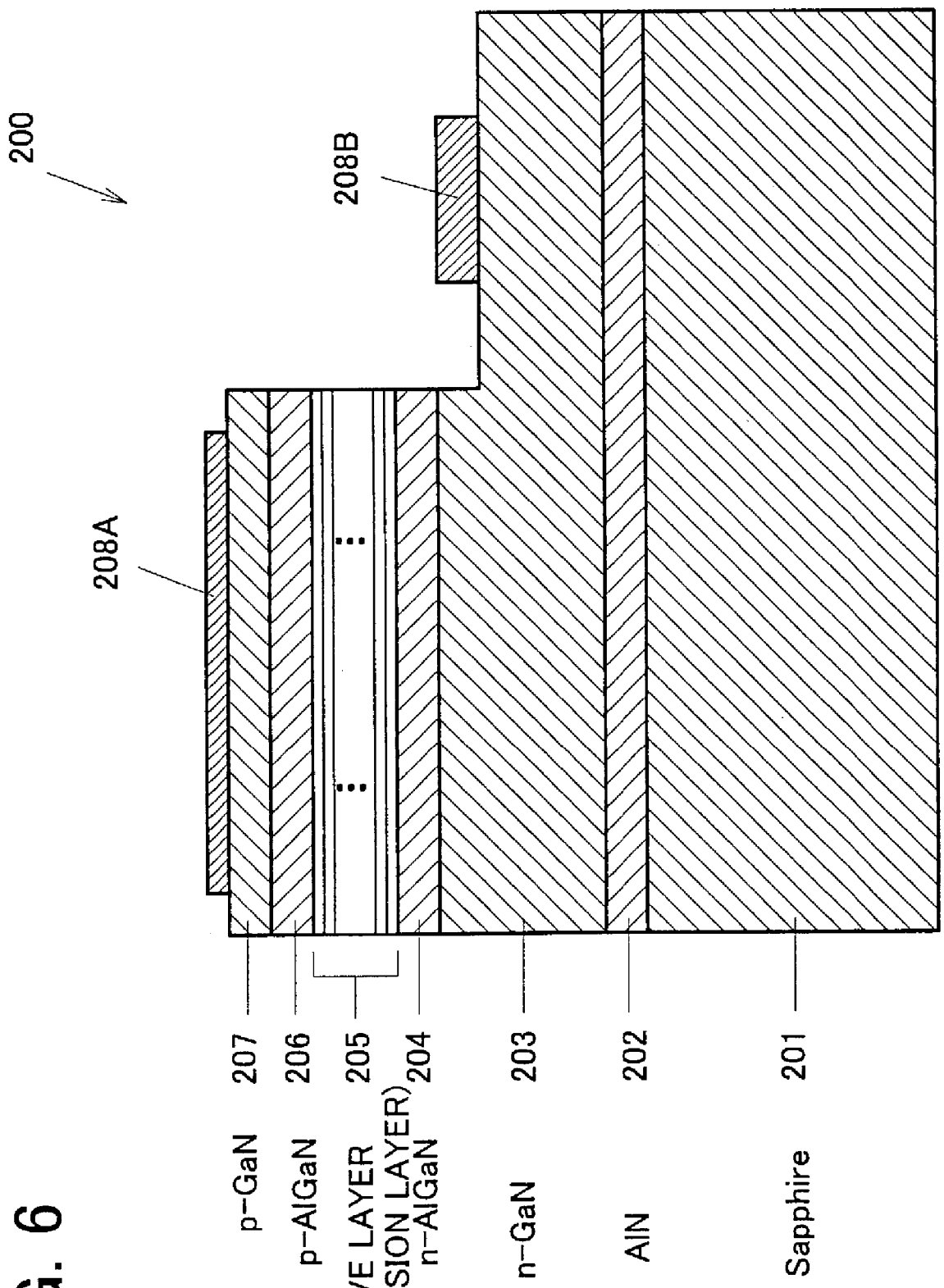
FIG. 6 is a sectional view showing the structure of a Group III nitride compound semiconductor light-emitting device according to a sixth embodiment of the present invention.

On a wafer formed in a manner similar to that of the first embodiment, a light-emitting diode (LED) 200 shown in FIG. 6 was formed in the following manner. Notably, in formation of the GaN layer 32, silane ($SiH_4$) was introduced so as to form a silicon (Si)-doped n-type GaN layer serving as the GaN layer 32. For the sake of simplified illustration, the drawing merely illustrates a GaN layer 203 to inclusively represent the GaN layer 31 and the GaN layer 32.

On a wafer comprising a sapphire substrate 201, a buffer layer 202 of AlN, and the two-layered GaN layer 203 consisting of a GaN layer and an n-type GaN layer, an n-clad layer 204 of silicon (Si)-doped $Al_{0.08}Ga_{0.92}N$, a light-emitting layer 205, a p-clad layer 206 of magnesium (Mg)-doped $Al_{0.08}Ga_{0.92}N$, and a p-contact layer 207 of magnesium (Mg)-doped GaN were formed. Next, an electrode 208A of gold (Au) was formed on the p-contact layer 207. Etching was partially performed until the two-layered GaN layer 203 consisting of the GaN layer and the n-type GaN layer was exposed. On the exposed GaN layer 203, an electrode 208B of aluminum (Al) was formed. The thus-formed light-emitting diode (LED) 200 exhibited the significant improvement of device life and light-emitting efficiency.

[Seventh Embodiment]

Figure 7A:
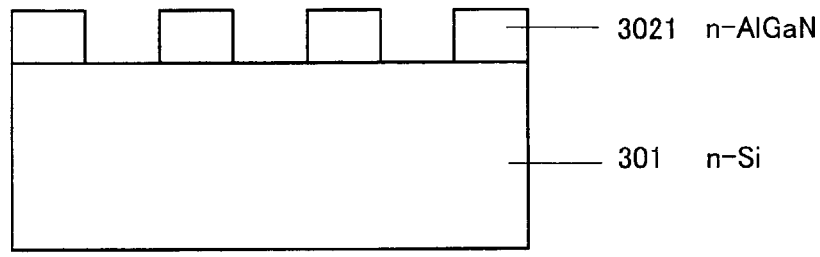
FIG. 7 is a series of sectional views partially showing the steps of fabricating a Group III nitride compound semiconductor light-emitting device according to a seventh embodiment of the present invention.

The present embodiment used an n-type silicon (Si) substrate. On the n-type silicon (Si) substrate 301, a silicon (Si)-doped $Al_{0.15}Ga_{0.85}N$ layer 3021 having a thickness of 0.5 µm was formed at a temperature of 1150° C. through supply of $H_2$ (10 L/min), $NH_3$ (10 L/min), TMG (100 µmol/min), TMA (10 µmol/min), and silane ($SiH_4$) diluted with $H_2$ gas to 0.86 ppm (0.2 µmol/min). Next, by use of a hard bake resist mask, stripe-shaped trenches each having a width of 1 µm and a depth of 0.5 µm were selectively dry-etched at intervals of 1 µm by reactive ion beam etching (RIE). As a result, mesas of the n-$Al_{0.15}Ga_{0.85}N$ layer 3021 each having a width of 1 µm and a height of 0.5 µm and trenches each having a width of 1 µm and having the n-type silicon substrate 301 exposed at the bottom thereof were alternatingly formed (FIG. 7A). At this time, the {11-20} planes of the n-$Al_{0.15}Ga_{0.85}N$ layer 3021 were caused to serve as the sidewalls of the trenches of a depth of 0.5 µm.

Figure 7B:
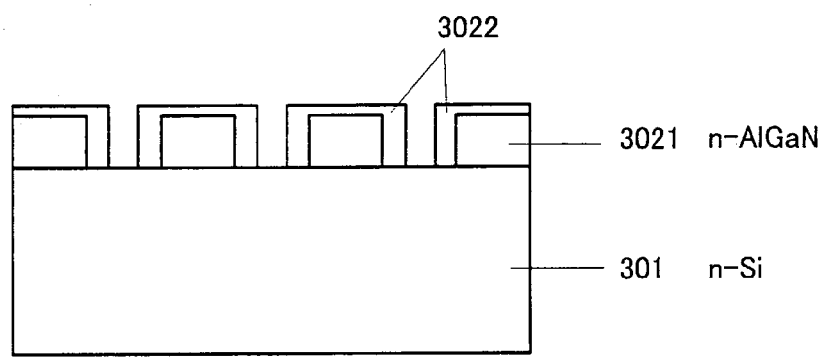
Figure 7C:
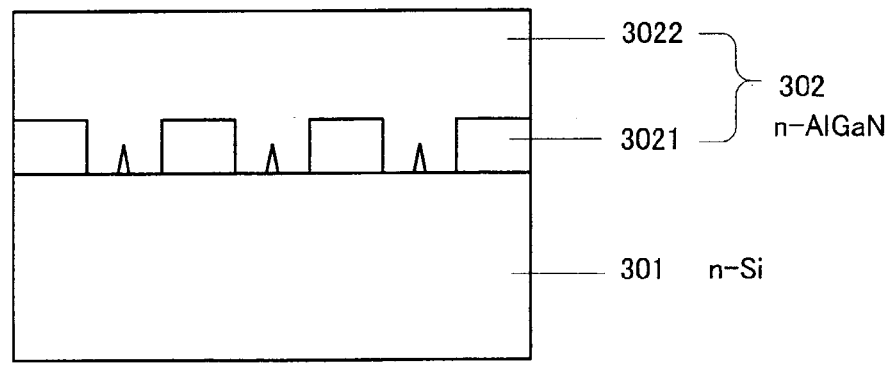

Next, while the temperature of the n-type silicon substrate 301 was maintained at 1150° C., $H_2$ (20 L/min), $NH_3$ (10 L/min), TMG (2 µmol/min), TMA (0.2 µmol/min), and silane ($SiH_4$) diluted with $H_2$ gas (4 mol/min) were introduced to thereby form an n-$Al_{0.15}Ga_{0.85}N$ layer 3022 through lateral epitaxial growth performed while the sidewalls of the trenches of a depth of 0.5 µm; i.e., the {11-20} planes of the n-$Al_{0.15}Ga_{0.85}N$ layer 3021, serve as nuclei. At this time, vertical epitaxial growth hardly took place from the top surfaces of the mesas and from the bottoms of the trenches (FIG. 7B). Lateral epitaxial growth was performed while the {11-20} planes primarily served as the growth fronts, thereby filling the trenches and thus establishing a flat top surface. Subsequently, $H_2$ (10 L/min), $NH_3$ (10 L/min), TMG (100 µmol/min), TMA (10 µmol/min), and silane ($SiH_4$) diluted with $H_2$ gas (0.2 µmol/min) were introduced to thereby grow the n-$Al_{0.15}Ga_{0.85}N$ layer 3022 such that the total thickness of the n-$Al_{0.15}Ga_{0.85}N$ layer 3021 and the n-$Al_{0.15}Ga_{0.85}N$ layer 3022 becomes 2 µm (FIG. 7C). Hereinafter, the n-$Al_{0.15}Ga_{0.85}N$ layer 3021 and the n-$Al_{0.15}Ga_{0.85}N$ layer 3022 having a total thickness of 2 µm are inclusively represented by an n-$Al_{0.15}Ga_{0.85}N$ layer 302.

Figure 8:
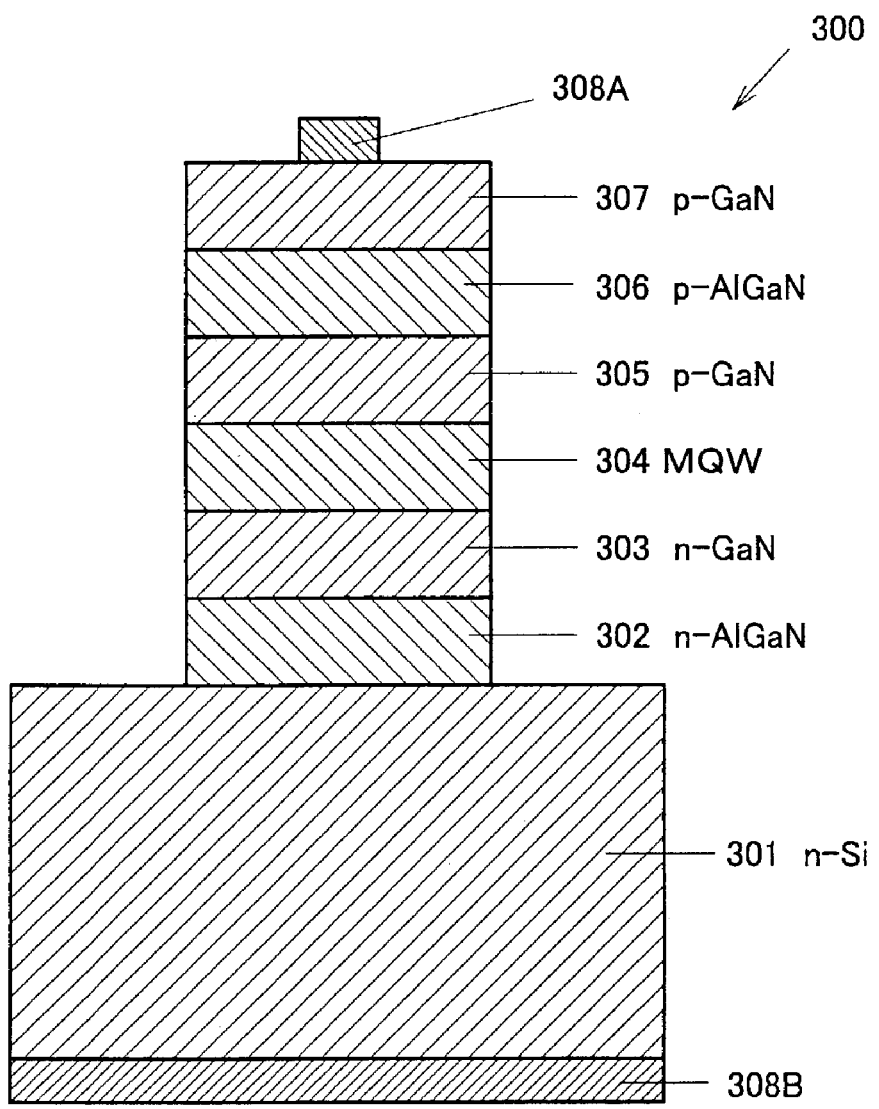
FIG. 8 is a sectional view showing the structure of the Group III nitride compound semiconductor light-emitting device according to the seventh embodiment of the present invention.

On the n-$Al_{0.15}Ga_{0.85}N$ layer 302 formed on the n-type silicon substrate 301, an n-guide layer 303 of silicon (Si)-doped GaN, an MQW-structured light-emitting layer 304, a p-guide layer 305 of magnesium (Mg)-doped GaN, a p-clad layer 306 of magnesium (Mg)-doped $Al_{0.08}Ga_{0.92}N$, and a p-contact layer 307 of magnesium (Mg)-doped GaN were formed. Next, an electrode 308A of gold (Au) was formed on the p-contact layer 307, and an electrode 308B of aluminum (Al) was formed on the back side of the silicon substrate 301 (FIG. 8). An essential portion of the laser diode (LD) 300 was formed above the lateral epitaxial growth regions of the n-$Al_{0.15}Ga_{0.85}N$ 302; i.e., above the regions where threading dislocation is suppressed. The thus-formed laser diode (LD) 300 exhibited the significant improvement of device life and light-emitting efficiency.

[Eighth Embodiment]

Figure 9:
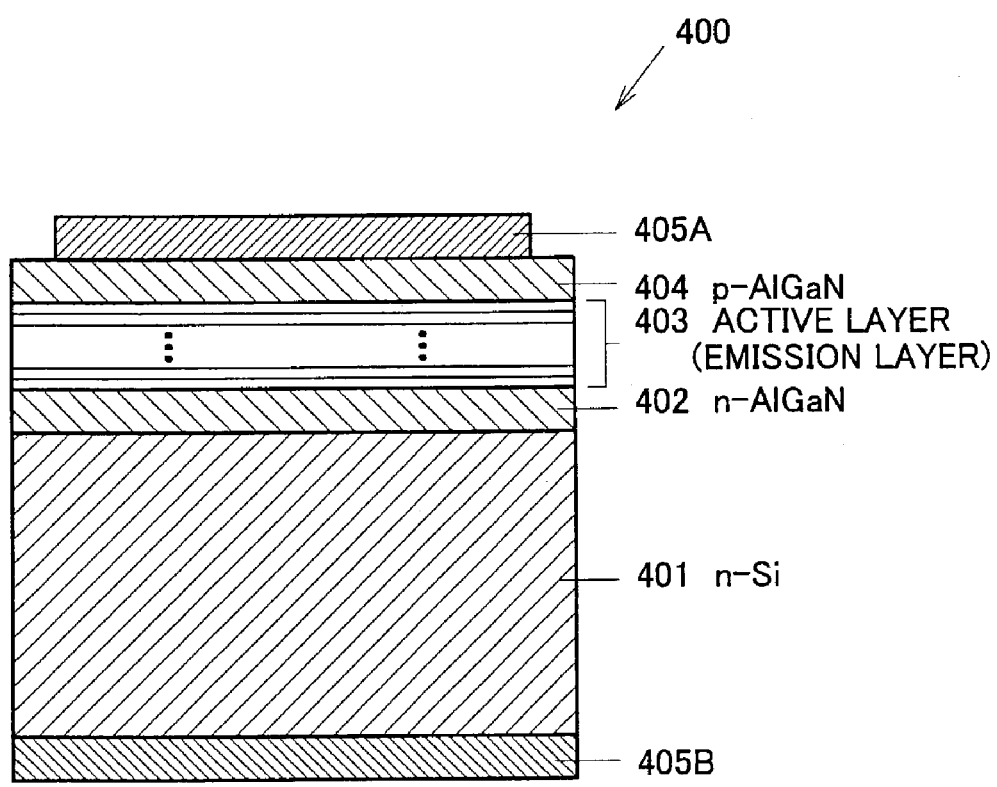
FIG. 9 is a sectional view showing the structure of a Group III nitride compound semiconductor light-emitting device according to an eighth embodiment of the present invention.

The present embodiment used an n-type silicon (Si) substrate. As in the seventh embodiment which used a wafer comprising the n-type silicon substrate 301 and the n-$Al_{0.15}Ga_{0.85}N$ layer 302 formed thereon, the present embodiment prepared a wafer comprising an n-type silicon substrate 401 and an n-$Al_{0.15}Ga_{0.85}N$ layer 402 formed on the substrate 401. On the wafer, a light-emitting layer 403 and a p-clad layer 404 of magnesium (Mg)-doped $Al_{0.15}Ga_{0.85}N$ were formed. Next, an electrode 405A of gold (Au) was formed on the p-clad layer 404, and an electrode 405B of aluminum (Al) was formed on the back side of the silicon substrate 401 (FIG. 9). The thus-formed light-emitting diode (LED) 400 exhibited the significant improvement of device life and light-emitting efficiency.

[Ninth Embodiment]

Figure 10A:
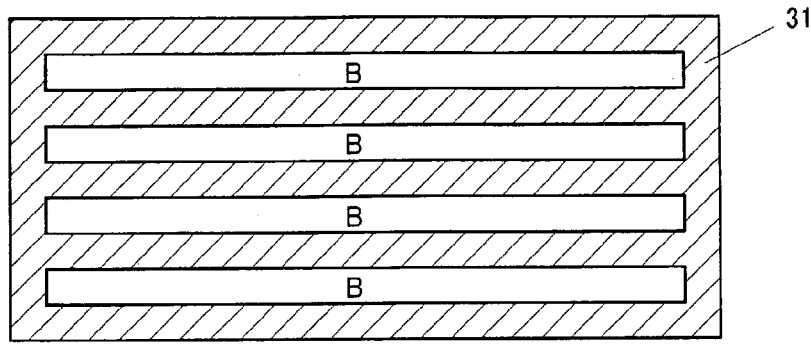
FIG. 10 is a schematic view showing an example of etching of a first Group III nitride compound semiconductor according to a ninth embodiment of the present invention.
Figure 10B:
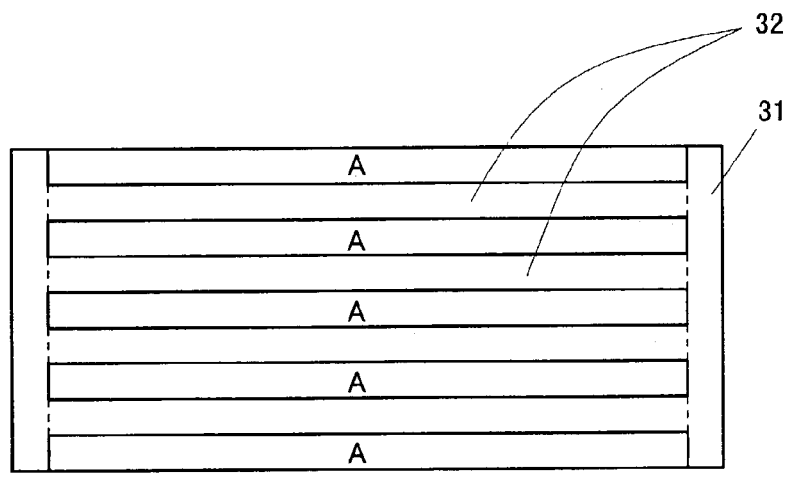
Figure 10C:
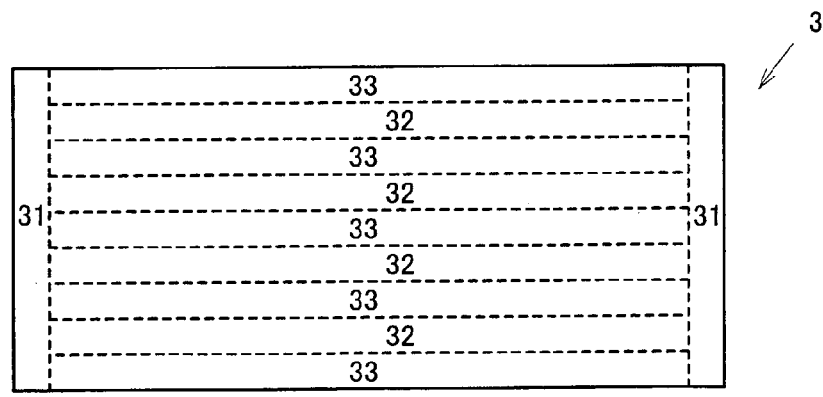

The regions of the second GaN layer 32 where threading dislocation is not reduced may be etched, followed by lateral epitaxial growth of a GaN layer. FIG. 10 schematically shows locations of the first GaN layer 31 and the second GaN layer 32 to be etched. As shown in FIG. 10A, etching is performed in the form of stripes so as to form mesas of the GaN layer 31 (hatched in FIG. 10) and trenches denoted by letter B. As shown in FIG. 10B, etching is performed in the form of stripes so as to form trenches denoted by letter A and mesas of the GaN layer 32 which fill the trenches denoted by letter B in FIG. 10A. While the thus-formed mesas of the second GaN layer 32 serve as nuclei, a GaN layer 33 is formed through lateral epitaxial growth. As a result, as shown in FIG. 10C, there are formed regions denoted by reference numeral 31 where threading dislocation is propagated from the GaN layer 31, regions denoted by reference numeral 32 which are upper portions of the GaN layer 32 formed through lateral epitaxial growth and where threading dislocation is suppressed, and regions denoted by reference numeral 33 which are upper portions of the GaN layer 33 formed through lateral epitaxial growth and where threading dislocation is suppressed. Thus, regions of reduced threading dislocation can be formed over the substantially entire surface of a wafer. Notably, the depth of etching of the GaN layer 32 is not particularly limited. Similarly, a Group III nitride compound semiconductor substrate in which threading dislocation is suppressed over the entire surface thereof can be obtained. Notably, when the GaN layer 33 is to be laterally grown while mesas of the GaN layer 32 formed through etching serve as nuclei, the present invention is not limited to the lateral overgrowth process described herein. For example, a mask may be formed on the bottoms of trenches so as to shut off vertical growth from the bottom, to thereby enhance reliability of lateral overgrowth.

[Modification of Etching]

Figures 11A, 11B:
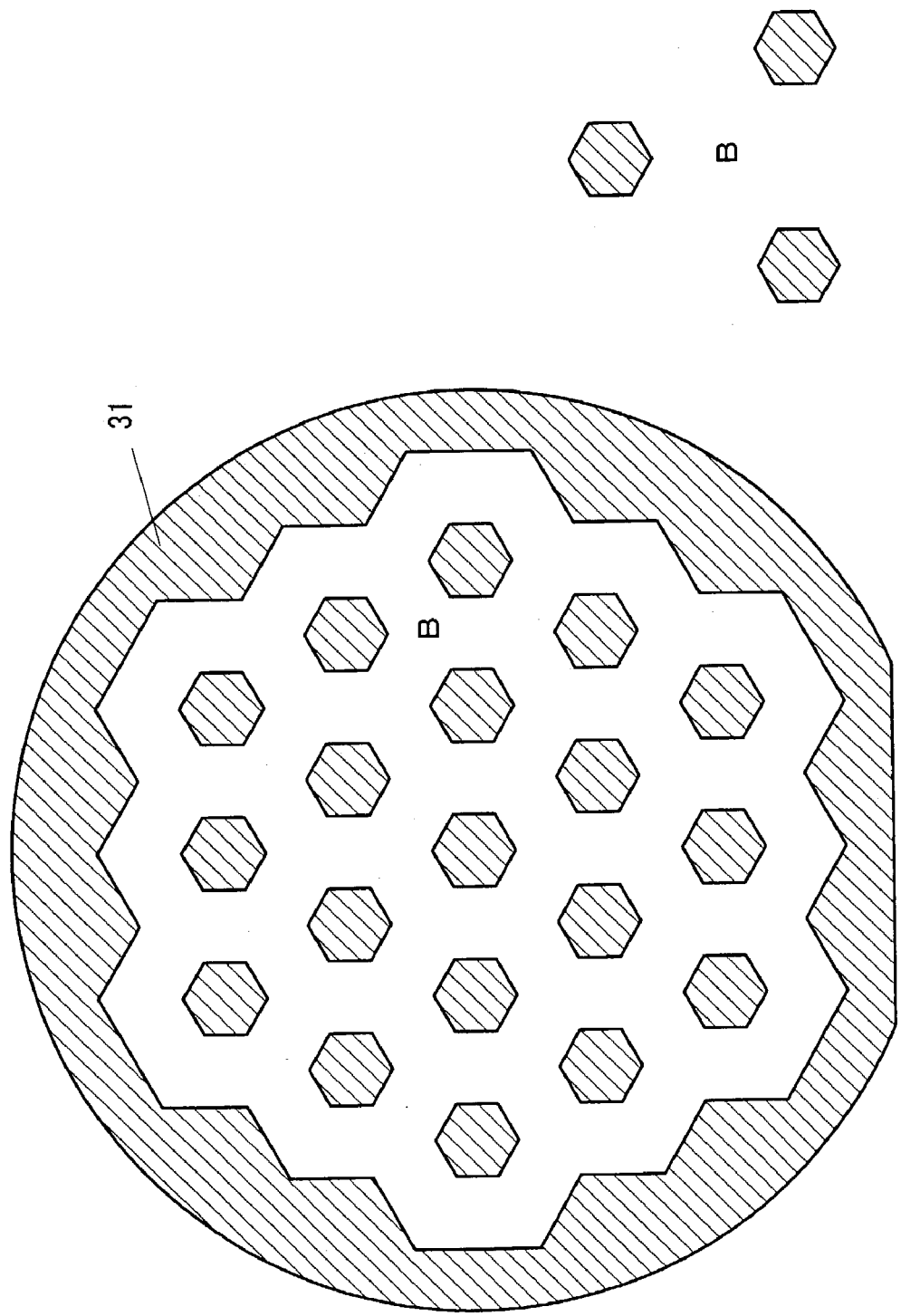
FIG. 11 is a schematic view showing another example of etching of a first Group III nitride compound semiconductor.
Figure 12A:
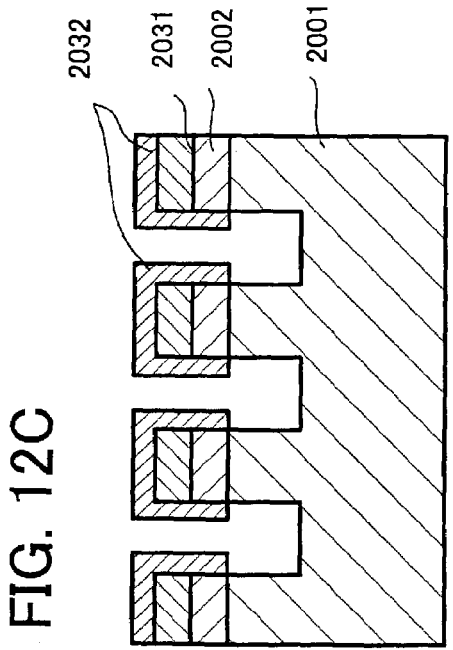
FIG. 12 is a series of sectional views showing the steps of fabricating a Group III nitride compound semiconductor according to a tenth embodiment of the present invention.
Figure 12B:
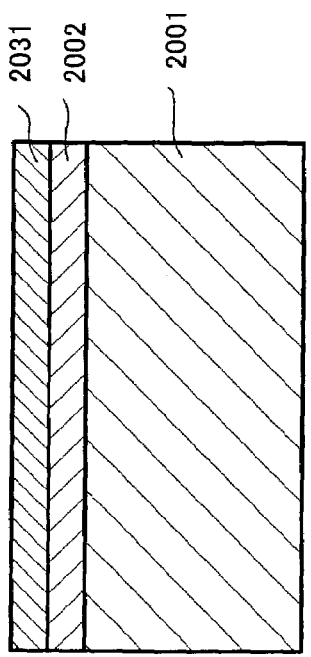
Figure 12C:
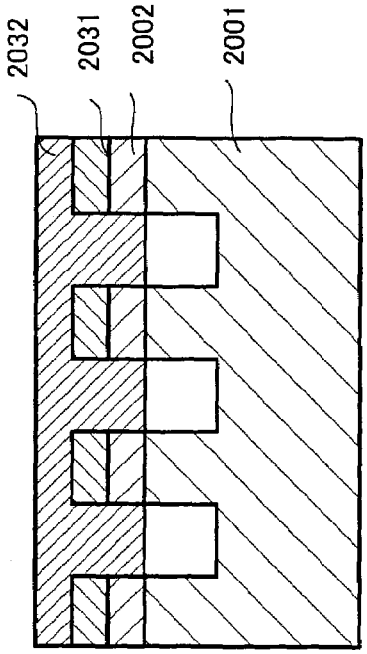
Figure 12D:
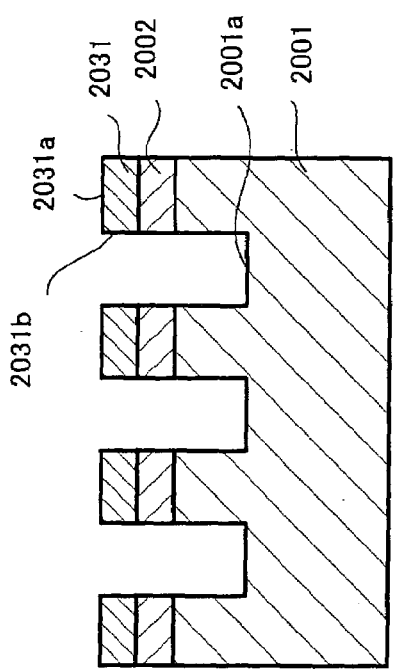
Figure 13A:
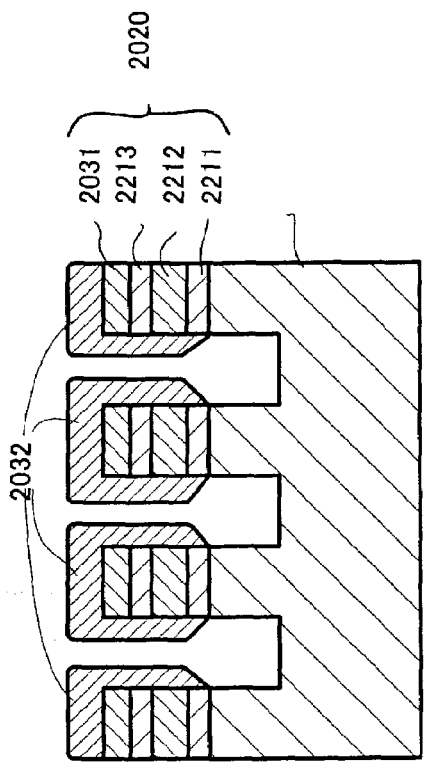
FIG. 13 is a series of sectional views showing the steps of fabricating a Group III nitride compound semiconductor according to an eleventh embodiment of the present invention.
Figure 13B:
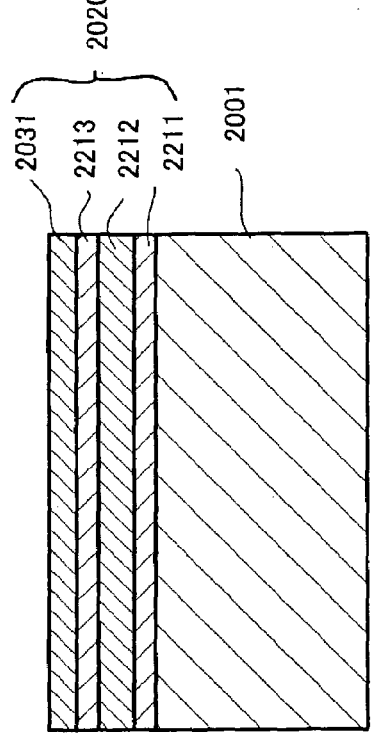
Figure 13C:
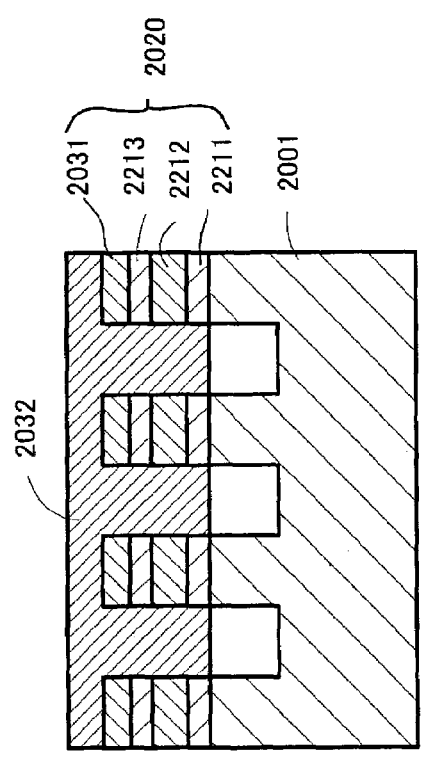
Figure 13D:
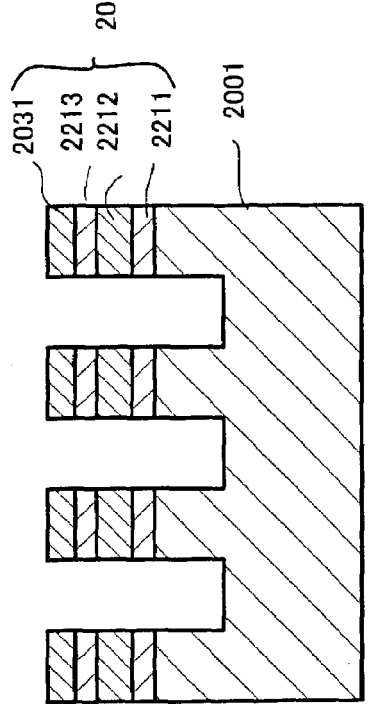

In the first embodiment to the ninth embodiment described above, the following etching was performed. FIG. 11 shows an example in which island-like mesas are formed by means of three groups of {11-20} planes. To facilitate understanding, the schematic view of FIG. 11A includes a peripheral region formed by means of three groups of {11-20} planes. In actuality, tens of millions of island-like mesas may be formed per wafer. In FIG. 11A, the area of the bottoms of the trenches B is 3 times the area of the top surfaces of the island-like mesas. In FIG. 11B, the area of the bottoms of the trenches B is 8 times the area of the top surfaces of the island-like mesas.

[Tenth Embodiment]

The present embodiment used an underlying layer comprising a buffer layer 2002 and a Group III nitride compound semiconductor layer 2031 as shown in FIG. 12. A monocrystalline sapphire substrate 2001 was prepared such that the a-plane thereof cleaned through organic cleaning and heat treatment serves as the main surface thereof. Temperature was dropped to 400° C., and H$_2$ (10 L/min), NH$_3$ (5 L/min), and TMA (20 µmol/min) were supplied for approximately 3 minutes to thereby form, on the sapphire substrate 2001, a buffer layer 2002 of AlN having a thickness of approximately 40 nm. Next, while the temperature of the sapphire substrate 2001 was maintained at 1000° C., H$_2$ (20 L/min) was introduced to thereby form an underlying layer comprising the buffer layer 2002 of AlN having a thickness of approximately 40 nm and a GaN layer 2031 having a thickness of approximately 1.5 µm.

Next, the underlying layer comprising the buffer layer 2002 and the GaN layer 2031 having a thickness of approximately 1.5 µm and the sapphire substrate 2001 were etched by reactive ion etching (RIE), thereby forming stripe-shaped trenches each having a width of 10 µm and a depth of 1.7 µm and arranged at intervals of 10 µm. As a result, mesas each having a width of 10 µm and the trenches extending by a depth of 0.2 µm into the sapphire substrate 2001 were alternatingly formed. At this time, the {11-20} planes of the GaN layer 2031 were caused to serve as the sidewalls of the trenches of a depth of 1.5 µm. Next, while the temperature of the sapphire substrate 2001 was maintained at 1150° C., H$_2$ (20 L/min), NH$_3$ (10 L/min), and TMG (5 µmol/min) were introduced to thereby form a GaN layer 2032 through lateral epitaxial growth. Lateral epitaxial growth was performed while the underlying layer formed at the top portions of the mesas served as nuclei, thereby filling upper portions of the trenches located above portions of the trenches formed in the sapphire substrate 2001 and thus establishing a flat top surface. Subsequently, H$_2$ (20 L/min), NH$_3$ (10 L/min), and TMG (300 µmol/min) were introduced to thereby grow the GaN layer 2032 such that the GaN layer 2032 has a thickness of 3 µm. In contrast to portions of the GaN layer 2032 formed above the top surfaces of the mesas, portions of the GaN layer 2032 formed above the 0.2 µm-depth portions of the trenches formed in the sapphire substrate 2001 exhibited significant suppression of threading dislocation.

[Eleventh Embodiment]

The present embodiment used an underlying layer comprising repetitions of a buffer layer and a monocrystalline Group III nitride compound semiconductor layer as shown in FIG. 13. A monocrystalline sapphire substrate 2001 was prepared such that the a-plane thereof cleaned through organic cleaning and heat treatment serves as the main surface thereof. Temperature was dropped to 400° C., and H$_2$ (10 L/min), NH$_3$ (5 L/min), and TMA (20 µmol/min) were supplied for approximately 3 minutes to thereby form, on the sapphire substrate 2001, a first AlN layer 2211 having a thickness of approximately 40 nm. Next, while the temperature of the sapphire substrate 2001 was maintained at 1000° C., H$_2$ (20 L/min), NH$_3$ (10 L/min), and TMG (300 µmol/min) were introduced to thereby form a GaN layer 2212 having a thickness of approximately 0.3 µm. Next, the temperature was dropped to 400° C., and H$_2$ (10 L/min), NH$_3$ (5 L/min), and TMA (20 µmol/min) were supplied for approximately 3 minutes to thereby form a second AlN layer 2213 having a thickness of approximately 40 nm. Next, while the temperature of the sapphire substrate 2001 was maintained at 1000° C., H$_2$ (20 L/min), NH$_3$ (10 L/min), and TMG (300 µmol/min) were introduced to thereby form a GaN layer 2031 having a thickness of approximately 1.5 µm. Thus was formed an underlying layer 2020 comprising the first AlN layer 2211 having a thickness of approximately 40 nm, the GaN layer 2212 having a thickness of approximately 0.3 µm, the second AlN layer 2213 having a thickness of approximately 40 nm, and the GaN layer 2031 having a thickness of approximately 1.5 µm.

Next, trenches are etched by RIE in a manner-similar to that of the tenth embodiment. The trenches were caused to extend by a depth of 0.2 µm into the sapphire substrate 2001. Next, while the temperature of the sapphire substrate 2001 was maintained at 1150° C., H$_2$ (20 L/min), NH$_3$ (10 L/min), and TMG (5 µmol/min) were introduced to thereby form a GaN layer 2032 through lateral epitaxial growth. Lateral epitaxial growth was performed while the underlying layer 2020 formed at the top portions of the mesas served as nuclei, thereby filling upper portions of the trenches located above portions of the trenches formed in the sapphire substrate 2001 and thus establishing a flat top surface. Subsequently, H$_2$ (20 L/min), NH$_3$ (10 L/min), and TMG (300 µmol/min) were introduced to thereby grow the GaN layer 2032 such that the GaN layer 2032 has a thickness of 3 µm. In contrast to portions of the GaN layer 2032 formed above the top surfaces of the mesas, portions of the GaN layer 2032 formed above the 0.2 µm-depth portions of the trenches formed in the sapphire substrate 2001 exhibited significant suppression of threading dislocation.

[Twelfth Embodiment]

Figure 14:
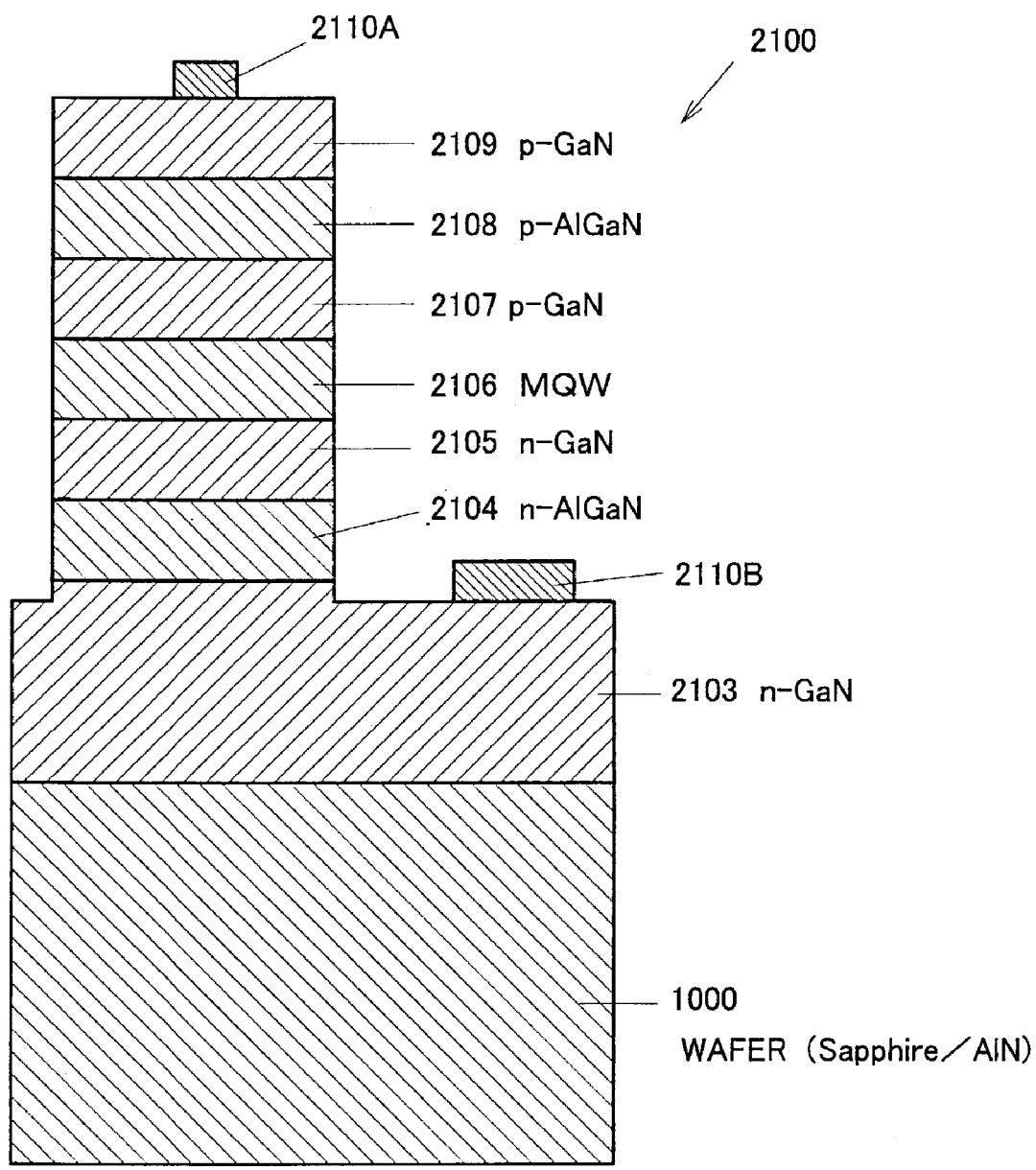
FIG. 14 is a sectional view showing the structure of a Group III nitride compound semiconductor light-emitting device according to a twelfth embodiment of the present invention.

On a wafer formed in a manner similar to that of the tenth embodiment, a laser diode (LD) 2100 shown in FIG. 14 was formed in the following manner. Notably, in formation of the GaN layer 2032, silane (SiH$_4$) was introduced so as to form a silicon (Si)-doped n-type GaN layer serving as the GaN layer 2032. For the sake of simplified illustration, the drawing merely illustrates a wafer 1000 to inclusively represent the trenched sapphire substrate 2001, the buffer layer 2002, the GaN layer 2031, and portions of the GaN layer 2032 as high as the buffer layer 2002 and the GaN layer 2031 as well as illustrates a GaN layer 2103 to represent the remaining portion of the GaN layer 2032.

On the n-type GaN layer 2103 formed on the wafer layer 1000 comprising the trenched sapphire substrate, the AlN buffer layer, the GaN layer 2031, and portions of the n-type GaN layer 2032 as high as the AlN buffer layer and the GaN layer 2031, an n-clad layer 2104 of silicon (Si)-doped $Al_{0.08}Ga_{0.92}N$, an n-guide layer 2105 of silicon (Si)-doped GaN, an MQW-structured light-emitting layer 2106, a p-guide layer 2107 of magnesium (Mg)-doped GaN, a p-clad layer 2108 of magnesium (Mg)-doped $Al_{0.08}Ga_{0.92}N$, and a p-contact layer 2109 of magnesium (Mg)-doped GaN were formed. Next, an electrode 2110A of gold (Au) was formed on the p-contact layer 2109. Etching was partially performed until the three-layered GaN layer 2103 consisting of the two-layered GaN layer and the n-type GaN layer was exposed. On the exposed GaN layer 2103, an electrode 2110B of aluminum (Al) was formed. The thus-formed laser diode (LD) exhibited the significant improvement of device life and light-emitting efficiency.

[Thirteenth Embodiment]

Figure 15:
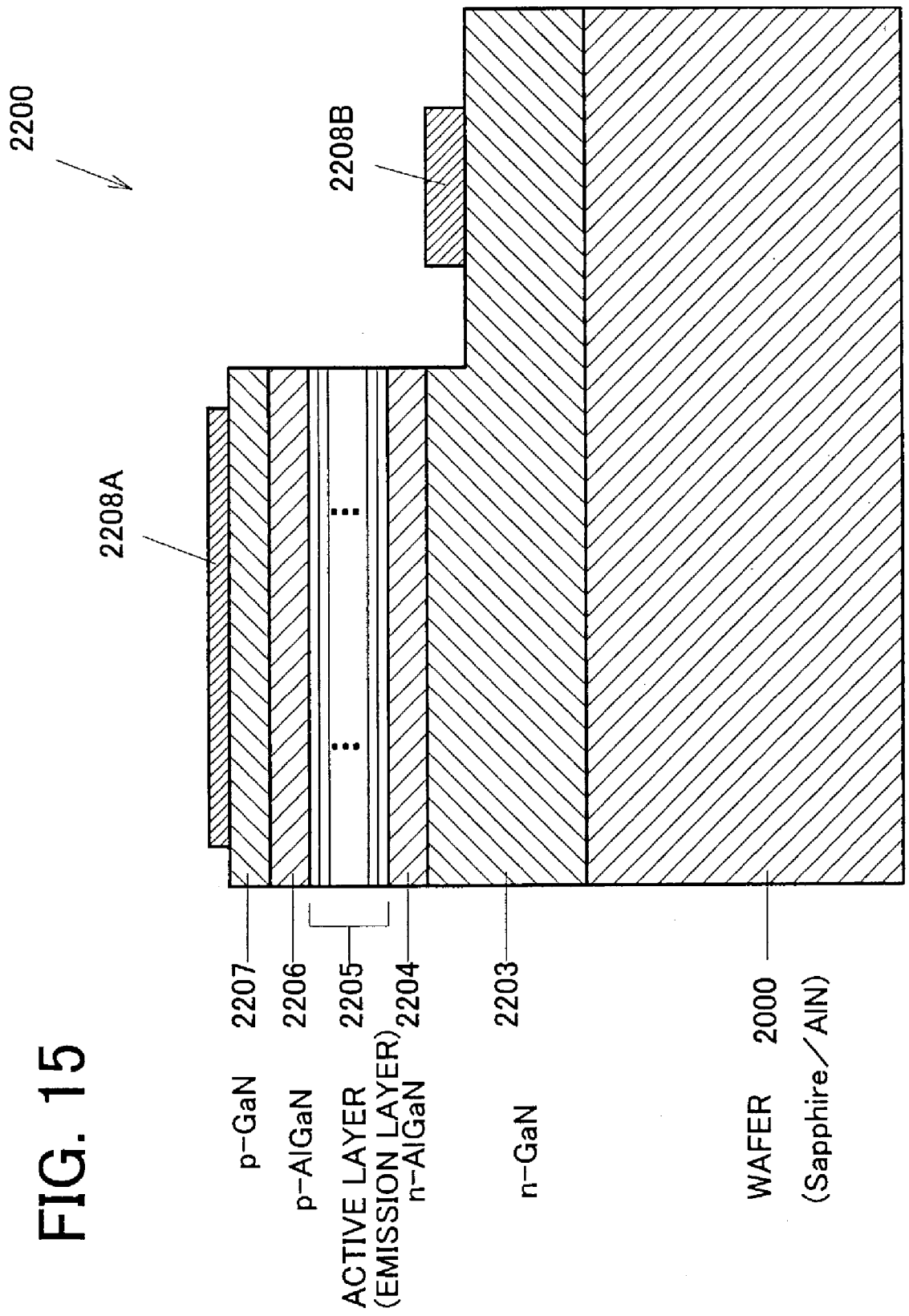
FIG. 15 is a sectional view showing the structure of a Group III nitride compound semiconductor light-emitting device according to a thirteenth embodiment of the present invention.

On a wafer formed in a manner similar to that of the twelfth embodiment, a light-emitting diode (LED) 2200 shown in FIG. 15 was formed in the following manner. For the sake of simplified illustration, the drawing merely illustrates a wafer 2000 to inclusively represent the trenched sapphire substrate 2001, the buffer layer 2002, the GaN layer 2031, and portions of the GaN layer 2032 as high as the buffer layer 2002 and the GaN layer 2031 as well as illustrates a GaN layer 2203 to represent the remaining portion of the GaN layer 2032.

On the n-type GaN layer 2203 formed on the wafer layer 2000 comprising the trenched sapphire substrate, the AlN buffer layer, the GaN layer 2031, and portions of the GaN layer 2032 as high as the AlN buffer layer and the GaN layer 2031, an n-clad layer 2204 of silicon (Si)-doped $Al_{0.08}Ga_{0.92}N$, a light-emitting layer 2205, a p-clad layer 2206 of magnesium (Mg)-doped $Al_{0.08}Ga_{0.92}N$, and a p-contact layer 2207 of magnesium (Mg)-doped GaN were formed. Next, an electrode 2208A of gold (Au) was formed on the p-contact layer 2207. Etching was partially performed until the two-layered GaN layer 2203 consisting of the GaN layer and the n-type GaN layer was exposed. On the exposed GaN layer 2203, an electrode 2208B of aluminum (Al) was formed. The thus-formed light-emitting diode (LED) exhibited the significant improvement of device life and light-emitting efficiency.

[Fourteenth Embodiment]

The present embodiment used a silicon (Si) substrate. A laterally grown layer was obtained in a manner similar to that of the tenth embodiment shown in FIG. 12. Specifically, as shown in FIG. 16, on an n-type silicon (Si) substrate 3301, a silicon (Si)-doped $Al_{0.15}Ga_{0.85}N$ layer 3021 having a thickness of 1.5 μm was formed at a temperature of 1150° C. through supply of $H_2$ (10 L/min), $NH_3$ (10 L/min), TMG (100 μmol/min), TMA (10 μmol/min), and silane ($SiH_4$) diluted with $H_2$ gas to 0.86 ppm (0.2 μmol/min). Next, by use of a hard bake resist mask, stripe-shaped trenches each having a width of 10 μm and a depth of 1.7 μm were selectively dry-etched at intervals of 10 μm by reactive ion beam etching (RIE). As a result, mesas each having a width of 10 μm and the trenches extending by a depth of 0.2 μm into the silicon substrate 3301 were alternatingly formed. At this time, the {11-20} planes of the n-$Al_{0.15}Ga_{0.85}N$ layer 3021 were caused to serve as the sidewalls of 1.5 μm-depth portions of the trenches. Next, while the temperature of the silicon substrate 3301 was maintained at 1150° C., $H_2$ (20 L/min), $NH_{13}$ (10 L/min), TMG (5 μmol/min), TMA (0.5 μmol/min), and silane ($SiH_4$) diluted with $H_2$ gas (0.01 μmol/min) were introduced to thereby grow an n-$Al_{0.15}Ga_{0.85}N$ layer 3022 vertically from the top surfaces of the mesas and laterally from the sidewalls of the trenches of $Al_{0.15}Ga_{0.85}N$ layer 3021. Lateral epitaxial growth was performed while the surfaces of upper portions of the mesas primarily served as nuclei, thereby filling upper portions of the trenches located above portions of the trenches formed in the substrate and thus establishing a flat top surface. Subsequently, $H_2$ (10 L/min), $NH_3$ (10 L/min), TMG (100 μmol/min), TMA (10 μmol/min), and silane ($SiH_4$) diluted with $H_2$ gas (0.2 μmol/min) were introduced to thereby grow the n-$Al_{0.15}Ga_{0.85}N$ layer 3022 to a thickness of 3 μm. Hereinafter, the trenched silicon substrate 3301 and the n-$Al_{0.15}Ga_{0.85}N$ layer 3302 are inclusively represented by a wafer 3000 (FIG. 17).

Figure 17:
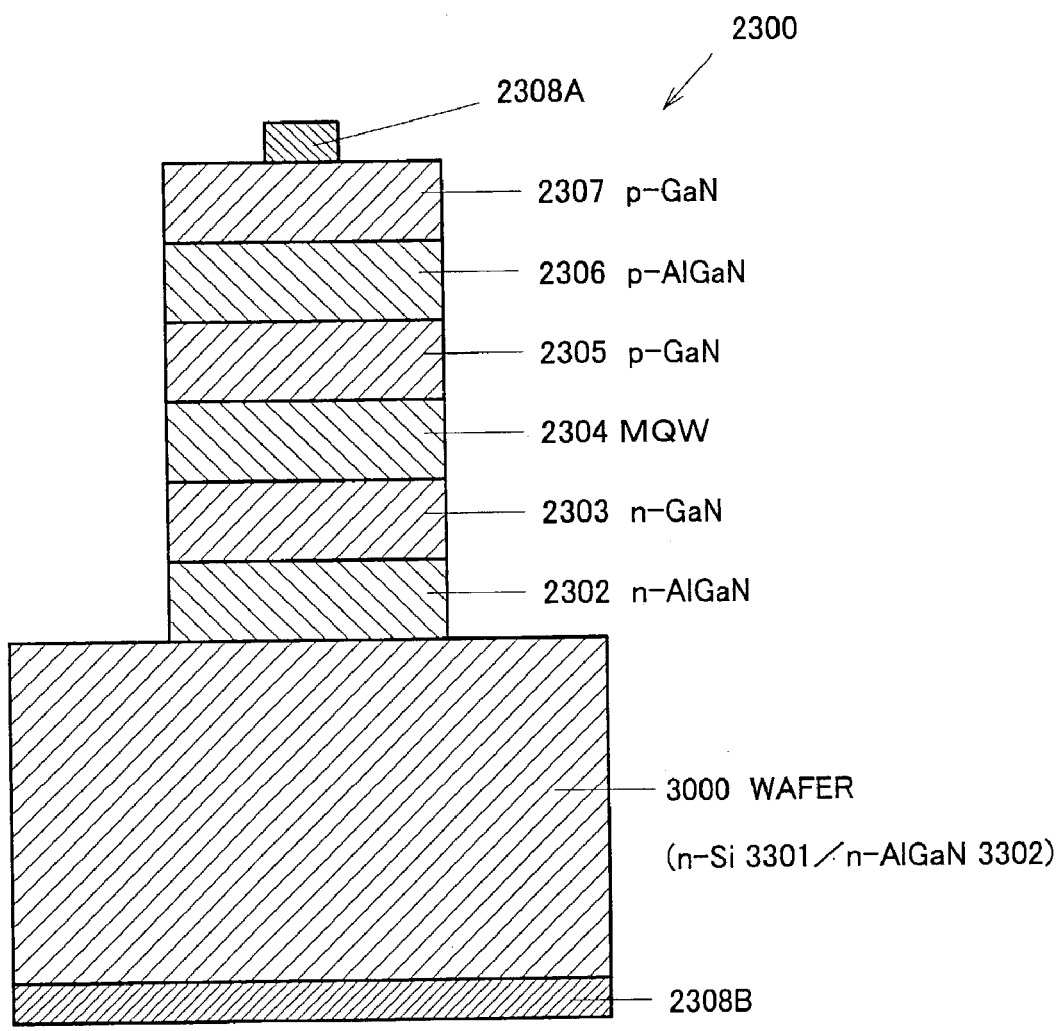
FIG. 17 is a sectional view showing the structure of the Group III nitride compound semiconductor light-emitting device according to the fourteenth embodiment of the present invention.

As shown in FIG. 17, on the wafer 3000 (the trenched silicon substrate 3301 and the n-$Al_{0.15}Ga_{0.85}N$ layer 3302 formed on the substrate 3301), n-clad layer 2302 of [n-$Al_{0.15}Ga_{0.85}N$]n-$Al_{0.08}Ga_{0.92}N$ an n-guide layer 2303 of silicon (Si)-doped GaN, an MQW-structured light-emitting layer 2304, a p-guide layer 2305 of magnesium (Mg)-doped GaN, a p-clad layer 2306 of magnesium (Mg)-doped $Al_{0.08}Ga_{0.92}N$, and a p-contact layer 2307 of magnesium (Mg)-doped GaN were formed. Next, an electrode 2308A of gold (Au) was formed on the p-contact layer 2307, and an electrode 2308B of aluminum (Al) was formed on the back side of the silicon substrate 3301. The thus-formed laser diode (LD) 2300 of FIG. 17 exhibited the significant improvement of device life and light-emitting efficiency.

[Fifteenth Embodiment]

Figure 18:
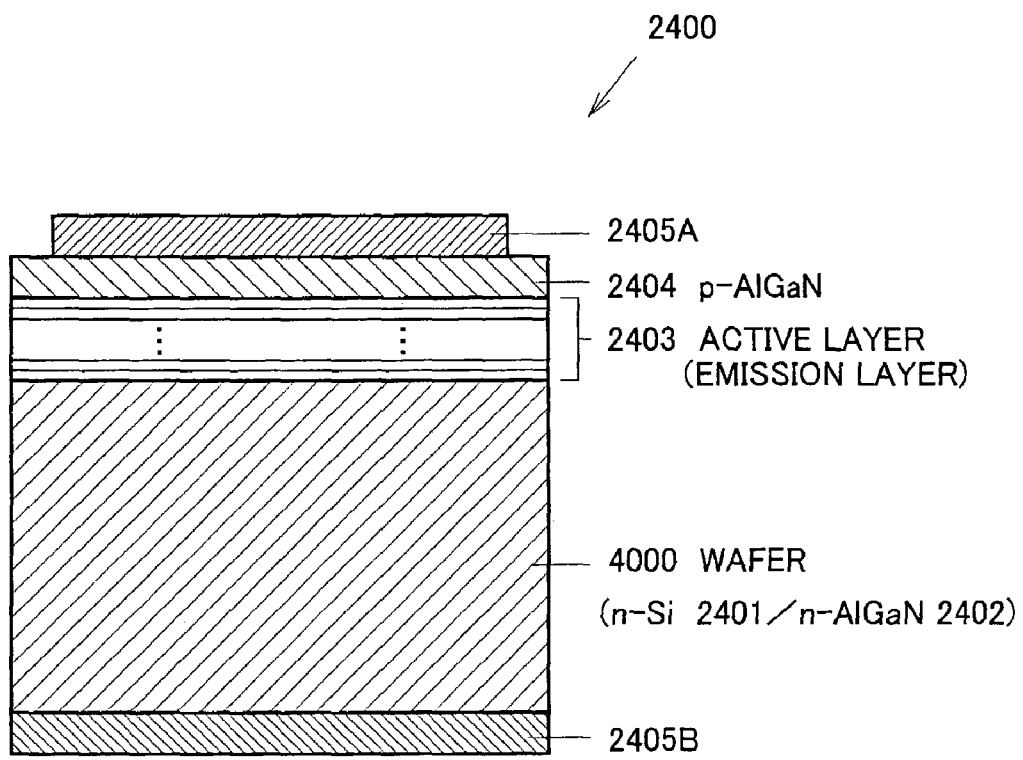
FIG. 18 is a sectional view showing the structure of a Group III nitride compound semiconductor light-emitting device according to a fifteenth embodiment of the present invention.

The present embodiment used a silicon (Si) substrate. As in the fourteenth embodiment which used a wafer comprising the trenched silicon substrate 3301 and the n-$Al_{0.15}Ga_{0.85}N$ layer 3302 formed thereon, the present embodiment used a wafer 4000 comprising a trenched silicon substrate 2401 and an n-$Al_{0.15}Ga_{0.85}N$ layer 2402 formed on the substrate 2401. On the wafer 4000, a light-emitting layer 2403 and a p-clad layer 2404 of magnesium (Mg)-doped $Al_{0.15}Ga_{0.85}N$ were formed. Next, an electrode 2405A of gold (Au) was formed on the p-clad layer 2404, and an electrode 2405B of aluminum (Al) was formed on the back side of the silicon substrate 2401. The thus-formed light-emitting diode (LED) 2400 of FIG. 18 exhibited the significant improvement of device life and light-emitting efficiency.

[Sixteenth Embodiment]

FIG. 19 shows the steps of the present embodiment. A monocrystalline sapphire substrate 3001 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 3001, a buffer layer 3002 of AlN having a thickness of approximately 40 nm. Next, while the temperature of the sapphire substrate 3001 was maintained at 1000° C., $H_2$ (20 L/min), $NH_3$ (10 L/min), and TMG (300 μmol/min) were introduced to thereby form a GaN layer 3031 having a thickness of approximately 1 μm. At this time, TMI was also introduced for doping with indium (In). The dosage of indium was $1\times10^{16} cm^{-3}$.

Next, by use of a hard bake resist mask, stripe-shaped trenches each having a width of 1 μm and a depth of 1 μm were selectively dry-etched at intervals of 1 μm by reactive ion beam etching (RIE). As a result, mesas of the GaN:In layer 3031 each having a width of 1 μm and a height of 1 μm and trenches each having a width of 1 μm and having the substrate 3001 exposed at the bottom thereof were alternatingly formed (FIG. 19A). At this time, the {11-20} planes of the GaN layer 3031 were caused to serve as the sidewalls of the trenches of a depth of 1 μm.

Next, while the temperature of the sapphire substrate 3001 was maintained at 1150° C., $H_2$ (20 L/min), $NH_3$ (10 L/min), and TMG (5 μmol/min) were introduced to thereby form a GaN layer 3032 through lateral epitaxial growth performed while the sidewalls of the trenches of a depth of 1 μm; i.e., the {11-20} planes of the GaN:In layer 3031, serve as nuclei. At this time, vertical epitaxial growth partially took place from the top surfaces of the mesas (FIG. 19B). Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 μmol/min) were introduced to thereby grow the GaN layer 3032 such that the total thickness of the GaN layer 3031 and the GaN layer 3032 becomes 2 μm. In contrast to portions of the GaN layer 3032 formed above the top surfaces of the mesas, portions of the GaN layer 3032 formed above the bottoms of the trenches extending as deep as 1 μm through the GaN layer 3031 exhibited significant suppression of threading dislocation, for the following reason. Since GaN is unlikely to grow on the sapphire substrate 3001 at high temperature, the GaN layer 3032 grows while the GaN:In layer 3031, which forms the mesas and exhibits good crystallinity, primarily serves as a nucleus. Also, the GaN layer 3031, which forms the mesas, can be rendered thin.

[Seventeenth Embodiment]

In a manner substantially similar to that of the sixteenth embodiment, a buffer layer 3002 of AlN having a thickness of 40 nm and a GaN:In layer 3031 doped with indium in an amount of $1 \times 10^{16}$ $cm^{-3}$ and having a thickness of 2 μm were formed on a sapphire substrate 3001. Stripe-shaped trenches each having a width of 1 μm and a depth of 2 μm were selectively dry-etched at intervals of 1 μm by reactive ion beam etching (RIE). As a result, mesas of the GaN:In layer 3031 each having a width of 1 μm and a height of 2 μm and trenches each having a width of 1 μm and having the buffer layer 3002 exposed at the bottom thereof were alternatingly formed (FIG. 20A). At this time, the {11-20} planes of the GaN:In layer 3031 were caused to serve as the sidewalls of the trenches of a depth of 2 μm. Subsequently, lateral epitaxial growth was performed to thereby form a GaN layer 3032 filling the trenches. Notably, vertical epitaxial growth partially took place from the top surfaces of the mesas and from the bottoms of the trenches (FIG. 20B). In this manner, the GaN layer 3032 was grown such that the total thickness of the GaN:In layer 3031 and the GaN layer 3032 becomes 3 μm. As in the case of the sixteenth embodiment, in contrast to portions of the GaN layer 3032 formed above the top surfaces of the mesas, portions of the GaN layer 3032 formed above the bottoms of the trenches extending as deep as 2 μm through the GaN layer 3031 exhibited significant suppression of threading dislocation.

[Eighteenth Embodiment]

In a manner substantially similar to that of the sixteenth and seventeenth embodiments, a buffer layer 3002 of AlN having a thickness of 40 nm and a GaN:In layer 3031 doped with indium in an amount of $1 \times 10^{16}$ $cm^{-3}$ and having a thickness of 3 μm were formed on a sapphire substrate 3001. Stripe-shaped trenches each having a width of 1 μm and a depth of 2 μm were selectively dry-etched at intervals of 1 μm by reactive ion beam etching (RIE). As a result, mesas of the GaN:In layer 3031 each having a width of 1 μm and a height of 2 μm and trenches each having a width of 1 μm were alternatingly formed (FIG. 21A). At this time, the {11-20} planes of the GaN:In layer 3031 were caused to serve as the sidewalls of the trenches of a depth of 2 μm. Subsequently, lateral epitaxial growth was performed to thereby form a GaN layer 3032 filling the trenches. Notably, vertical epitaxial growth partially took place from the top surfaces of the mesas and from the bottoms of the trenches (FIG. 21B). In this manner, the GaN layer 3032 was grown such that the total thickness of the GaN:In layer 3031 and the GaN layer 3032 becomes 4 μm. As in the cases of the sixteenth and seventeenth embodiments, in contrast to portions of the GaN layer 3032 formed above the top surfaces of the mesas, portions of the GaN layer 3032 formed above the bottoms of the trenches extending as deep as 2 μm into the GaN layer 3031 exhibited significant suppression of threading dislocation.

[Nineteenth Embodiment]

An underlying layer 3020 comprising a first AlN layer (first buffer layer) 3021 having a thickness of approximately 40 nm, a GaN layer (intermediate layer) 3022 having a thickness of approximately 0.3 μm, a second AlN layer (second buffer layer) 3023 having a thickness of approximately 40 nm, and a GaN:In layer 3031 having a thickness of approximately 0.5 μm was formed on a sapphire substrate 3001. Subsequently, etching to a depth of approximately 1 μm was performed to thereby alternatingly form mesas whose top layer is the GaN:In layer 3031 exhibiting good crystallinity and which each has a width of 1 μm and a height of 1 μm, and trenches each having a width of 1 μm and having the substrate 3001 exposed at the bottom thereof (FIG. 22). At this time, the {11-20} planes of the GaN:In layer 3031 were caused to serve as the sidewalls of the trenches of a depth of 0.9 μm. Lateral epitaxial growth was performed while the {11-20} planes primarily served as the growth fronts, thereby establishing a flat top surface. Subsequently, the GaN layer 3032 was grown such that the total thickness of the GaN:In layer 3031 and the GaN layer 3032 becomes 3 μm. In contrast to portions of the GaN layer 3032 formed above the top surfaces of the mesas, portions of the GaN layer 3032 formed above the bottoms of the trenches extending as deep as approximately 0.9 μm through the underlying layer 3020 exhibited significant suppression of threading dislocation. Portions of the GaN layer 3032 grown vertically above the GaN:In layer 3031 exhibited threading dislocation reduced to approximately 1/10 that of the sixteenth embodiment.

[Twentieth Embodiment]

Figure 23:
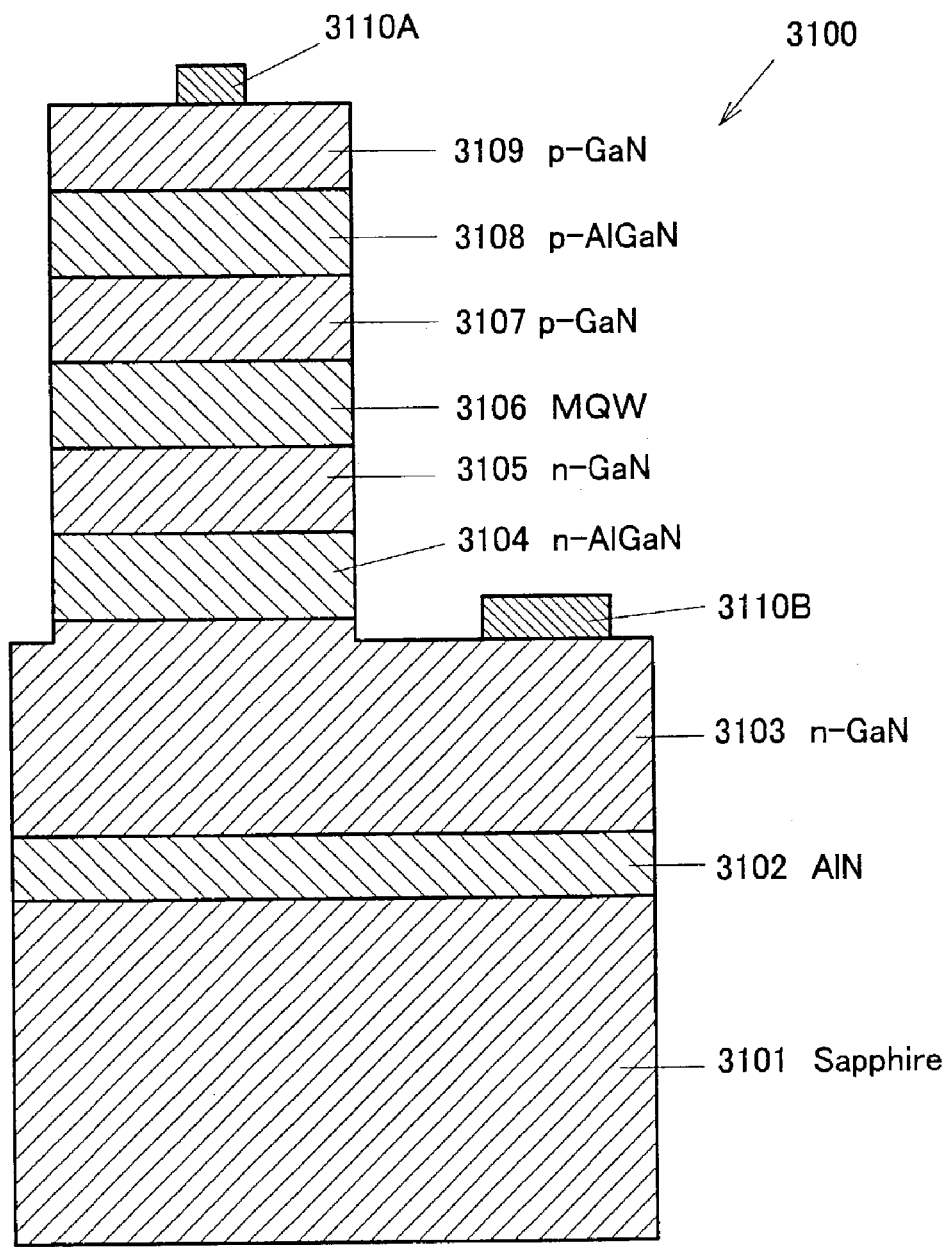
FIG. 23 is a sectional view showing the structure of a Group III nitride compound semiconductor light-emitting device according to a twentieth embodiment of the present invention.

On a wafer formed in a manner similar to that of the sixteenth embodiment, a laser diode (LD) 3100 shown in FIG. 23 was formed in the following manner. Notably, in formation of the GaN layer 3032, silane ($SiH_4$) was introduced so as to form a silicon (Si)-doped n-type GaN layer serving as the GaN layer 3032. For the sake of simplified illustration, the drawing merely illustrates a GaN layer 3103 to inclusively represent the GaN:In layer 3031 and the GaN layer 3032.

On a wafer comprising a sapphire substrate 3101, a buffer layer 3102 of AlN, and the two-layered GaN layer 3103 consisting of a GaN layer and an n-type GaN layer, an n-clad layer 3104 of silicon (Si)-doped $Al_{0.08}Ga_{0.92}N$, an n-guide layer 3105 of silicon (Si)-doped GaN, an MQW-structured light-emitting layer 3106, a p-guide layer 3107 of magnesium (Mg)-doped GaN, a p-clad layer 3108 of magnesium (Mg)-doped $Al_{0.08}Ga_{0.92}N$, and a p-contact layer 3109 of magnesium (Mg)-doped GaN were formed. Next, an electrode 3110A of gold (Au) was formed on the p-contact layer 3109. Etching was partially performed until the two-layered GaN layer 3103 consisting of the GaN layer and the n-type GaN layer was exposed. On the exposed GaN layer 3103, an electrode 3110B of aluminum (Al) was formed. An essential portion of the laser diode (LD) 3100 was formed on the lateral epitaxial growth regions of the GaN layer 3103; i.e., on the regions where threading dislocation is suppressed. The thus-formed laser diode (LD) 3100 exhibited the significant improvement of device life and light-emitting efficiency.

[Twenty-First Embodiment]

On a wafer formed in a manner similar to that of the sixteenth embodiment, a light-emitting diode (LED) 3200 shown in FIG. 24 was formed in the following manner. Notably, in formation of the GaN layer 3032, silane ($SiH_4$) was introduced so as to form a silicon (Si)-doped n-type GaN layer serving as the GaN layer 3032. For the sake of simplified illustration, the drawing merely illustrates a GaN layer 3203 to inclusively represent the GaN:In layer 3031 and the GaN layer 3032.

On a wafer comprising a sapphire substrate 3201, a buffer layer 3202 of AlN, and the two-layered GaN layer 3203 consisting of a GaN:In layer and an n-type GaN layer, an n-clad layer 3204 of silicon (Si)-doped $Al_{0.08}Ga_{0.92}N$, a light-emitting layer 3205, a p-clad layer 3206 of magnesium (Mg)-doped $Al_{0.08}Ga_{0.92}N$, and a p-contact layer 3207 of magnesium (Mg)-doped GaN were formed. Next, an electrode 3208A of gold (Au) was formed on the p-contact layer 3207. Etching was partially performed until the two-layered GaN layer 3203 consisting of the GaN layer and the n-type GaN layer was exposed. On the exposed GaN layer 3203, an electrode 3208B of aluminum (Al) was formed. The thus-formed light-emitting diode (LED) 3200 exhibited the significant improvement of device life and light-emitting efficiency.

[Twenty-Second Embodiment]

Figure 25A:
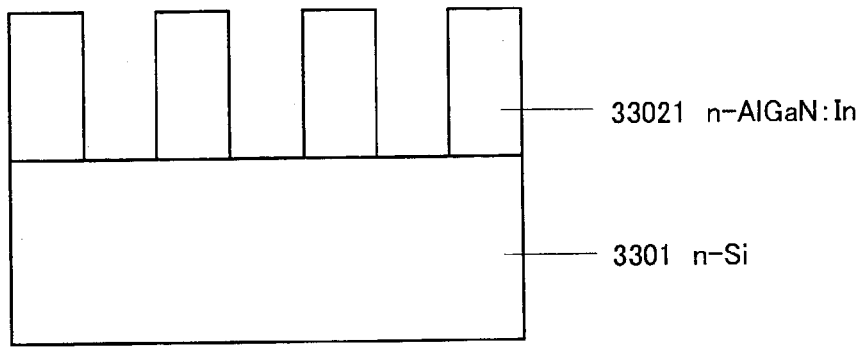
FIG. 25 is a series of sectional views showing the steps of fabricating a Group III nitride compound semiconductor light-emitting device according to a twenty-second embodiment of the present invention.

The present embodiment used an n-type silicon (Si) substrate. On the n-type silicon (Si) substrate 3301, a silicon (Si)- and indium (In)-doped $Al_{0.15}Ga_{0.85}N$:In layer 33021 having a thickness of 1 μm was formed at a temperature of 1150° C. through supply of $H_2$ (10 L/min), $NH_3$ (10 L/min), TMG (100 μmol/min), TMA (10 μmol/min), silane ($SiH_4$) diluted with $H_2$ gas to 0.86 ppm (0.2 μmol/min), and TMI. Next, by use of a hard bake resist mask, stripe-shaped trenches each having a width of 1 μm and a depth of 1 μm were selectively dry-etched at intervals of 1 μm by reactive ion beam etching (RIE). As a result, mesas of the n-$Al_{0.15}Ga_{0.85}N$:In layer 33021 each having a width of 1 μm and a height of 1 μm and trenches each having a width of 1 μm and having the n-type silicon substrate 3301 exposed at the bottom thereof were alternatingly formed (FIG. 25A). At this time, the {11-20} planes of the n-$Al_{0.15}Ga_{0.85}N$:In layer 33021 were caused to serve as the sidewalls of the trenches of a depth of 1 μm.

Figure 25B:
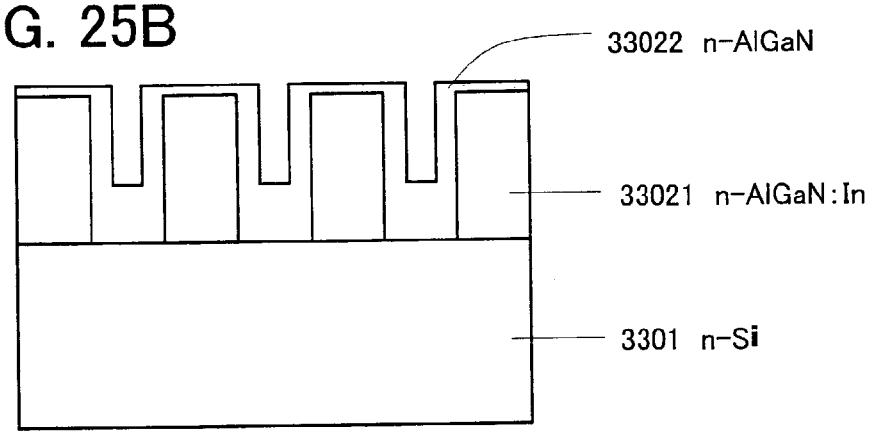
Figure 25C:
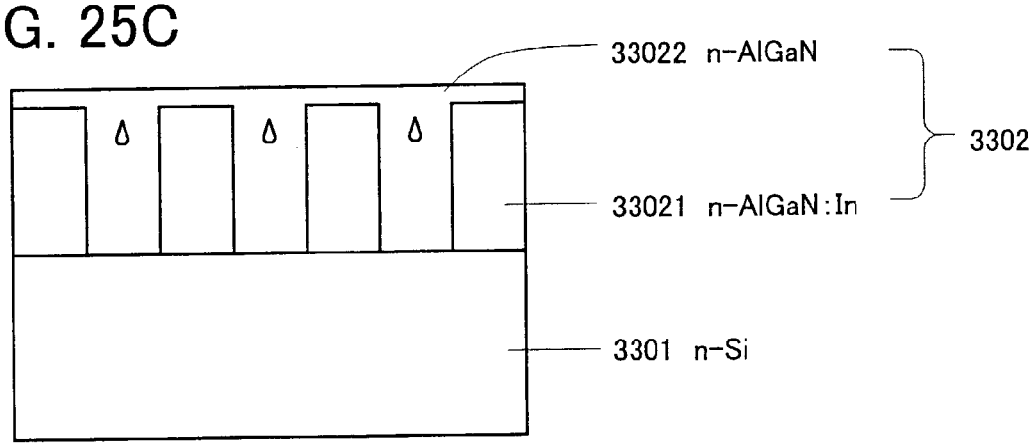

Next, while the temperature of the n-type silicon substrate 3301 was maintained at 1150° C., $H_2$ (20 L/min), $NH_3$ (10 L/min), TMG (5 μmol/min), TMA (0.5 μmol/min), and silane ($SiH_4$) diluted with $H_2$ gas (20 mol/min) were introduced to thereby form an n-$Al_{0.15}Ga_{0.85}N$ layer 33022 through lateral epitaxial growth performed while the sidewalls of the trenches of a depth of 1 μm; i.e., the {11-20} planes of the n-$Al_{0.15}Ga_{0.85}N$:In layer 33021, serve as nuclei. At this time, vertical epitaxial growth partially took place from the top surfaces of the mesas and from the bottoms of the trenches (FIG. 25B). Lateral epitaxial growth was performed while the {11-20} planes primarily served as the growth fronts, thereby filling the trenches and thus establishing a flat top surface. Subsequently, $H_2$ (10 L/min), $NH_3$ (10 L/min), TMG (100 μmol/min), TMA (10 μmol/min), and silane ($SiH_4$) diluted with $H_2$ gas (0.2 μmol/min) were introduced to thereby grow the n-$Al_{0.15}Ga_{0.85}N$ layer 33022 such that the total thickness of the n-$Al_{0.15}Ga_{0.85}N$:In layer 33021 and the n-$Al_{0.15}Ga_{0.85}N$ layer 33022 becomes 2 μm (FIG. 25C). Hereinafter, the n-$Al_{0.15}Ga_{0.85}N$:In layer 33021 and the n-$Al_{0.15}Ga_{0.85}N$ layer 33022 having a total thickness of 2 μm are inclusively represented by an n-$Al_{0.15}Ga_{0.85}N$ layer 3302.

Figure 26:
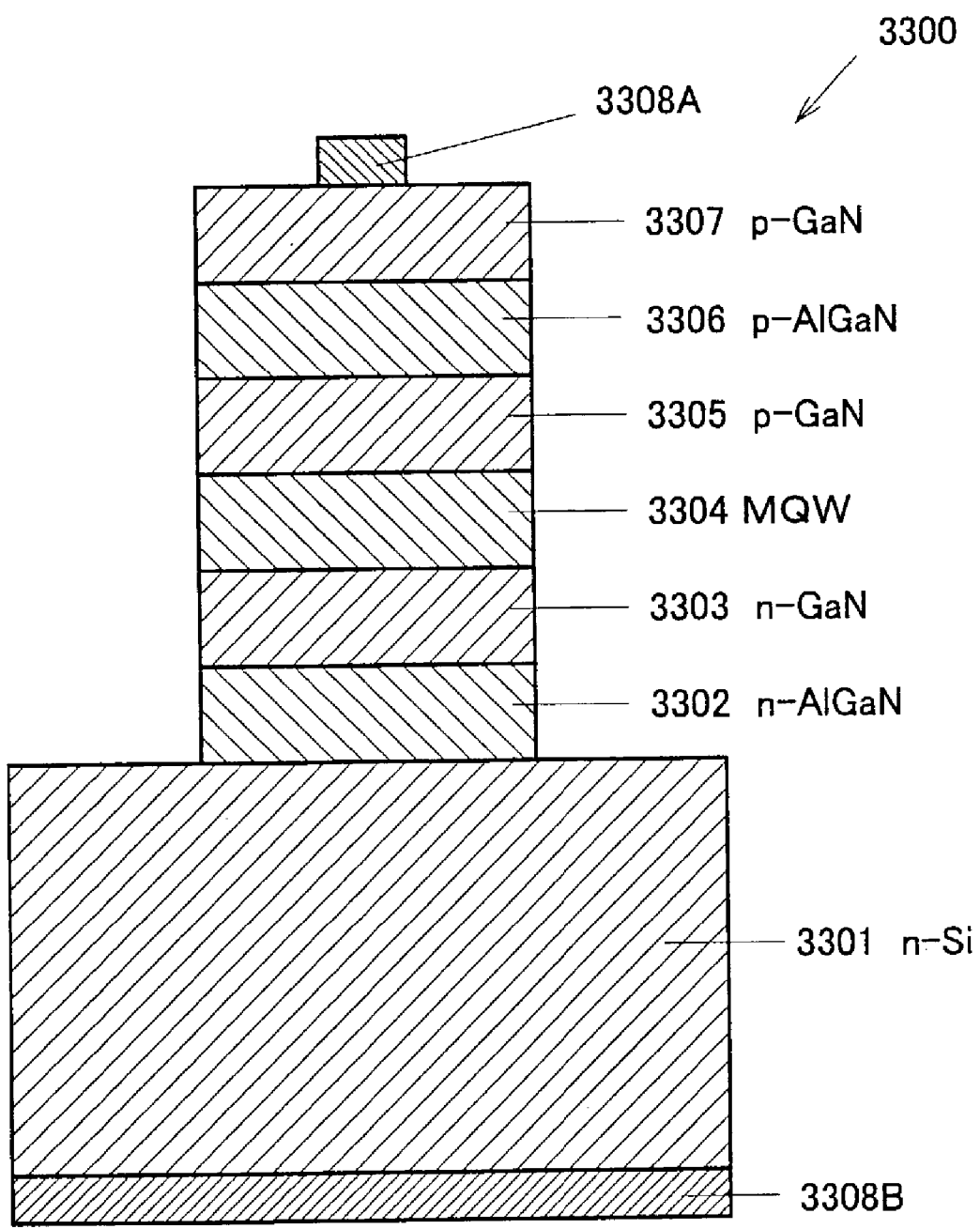
FIG. 26 is a sectional view showing the structure of the Group III nitride compound semiconductor light-emitting device according to the twenty-second embodiment of the present invention.

On the n-$Al_{0.15}Ga_{0.85}N$ layer 3302 formed on the n-type silicon substrate 3301, an n-guide layer 3303 of silicon (Si)-doped GaN, an MQW-structured light-emitting layer 3304, a p-guide layer 3305 of magnesium (Mg)-doped GaN, a p-clad layer 3306 of magnesium (Mg)-doped $Al_{0.08}Ga_{0.92}N$, and a p-contact layer 3307 of magnesium (Mg)-doped GaN were formed. Next, an electrode 3308A of gold (Au) was formed on the p-contact layer 3307, and an electrode 3308B of aluminum (Al) was formed on the back side of the silicon substrate 3301 (FIG. 26). An essential portion of the laser diode (LD) 3300 was formed on the lateral epitaxial growth regions of the n-$Al_{0.15}Ga_{0.85}N$ layer 3302; i.e., on the regions where threading dislocation is suppressed. The thus-formed laser diode (LD) 3300 exhibited the significant improvement of device life and light-emitting efficiency.

[Twenty-Third Embodiment]

Figure 27:
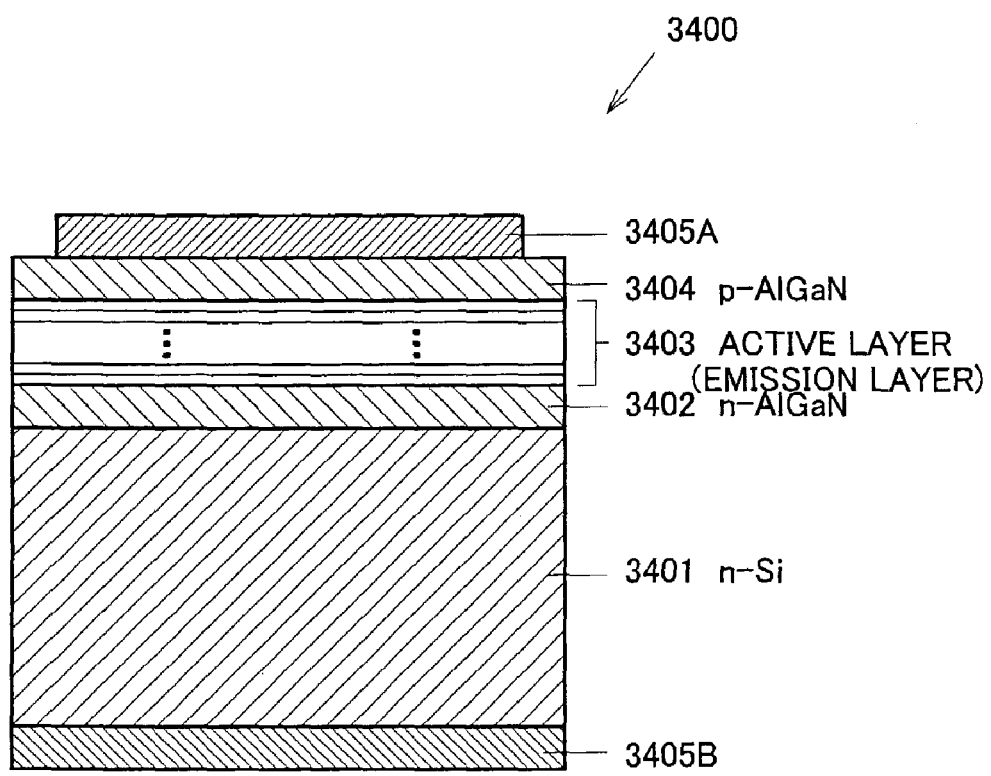
FIG. 27 is a sectional view showing the structure of a Group III nitride compound semiconductor light-emitting device according to a twenty-third embodiment of the present invention.

The present embodiment used an n-type silicon (Si) substrate. As in the twenty-second embodiment which used a wafer comprising the n-type silicon substrate 3301 and the n-$Al_{0.15}Ga_{0.85}N$ layer 3302 formed thereon, the present embodiment prepared a wafer comprising an n-type silicon substrate 3401 and an n-$Al_{0.15}Ga_{0.85}N$ layer 3402 formed on the substrate 3401. On the wafer, a light-emitting layer 3403 and a p-clad layer 3404 of magnesium (Mg)-doped $Al_{0.15}Ga_{0.85}N$ were formed. Next, an electrode 3405A of gold (Au) was formed on the p-clad layer 3404, and an electrode 3405B of aluminum (Al) was formed on the back side of the silicon substrate 3401 (FIG. 27). The thus-formed light-emitting diode (LED) 3400 exhibited the significant improvement of device life and light-emitting efficiency.

[Twenty-Fourth Embodiment]

Figure 28A:
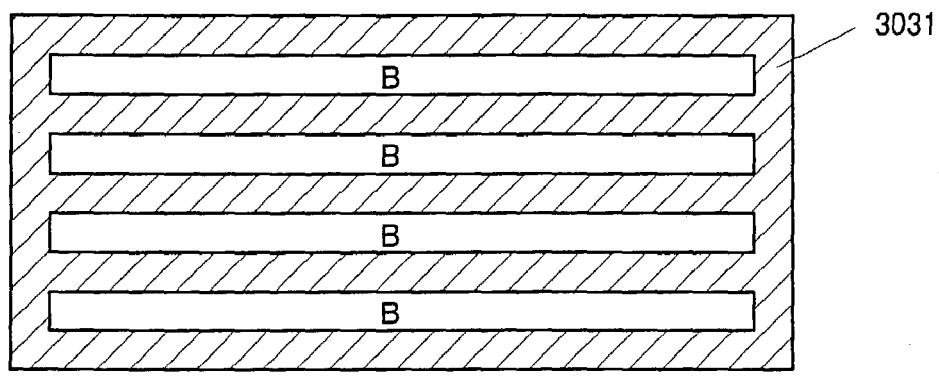
FIG. 28 is a schematic view showing an example of etching of a first Group III nitride compound semiconductor according to twenty-fourth embodiment of the present invention.
Figure 28B:
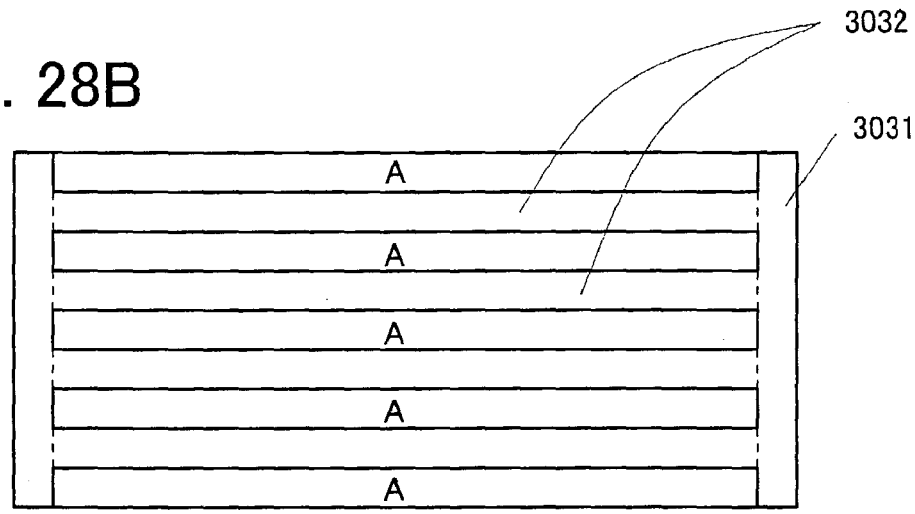
Figure 28C:
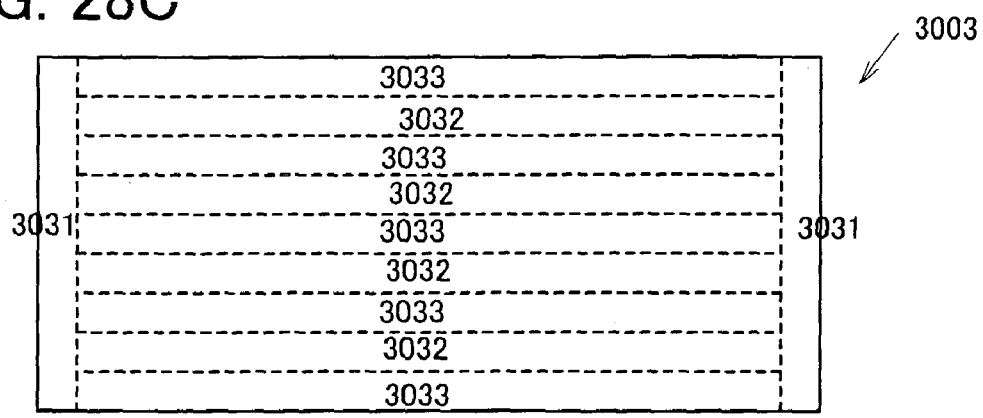
Figure 29A:
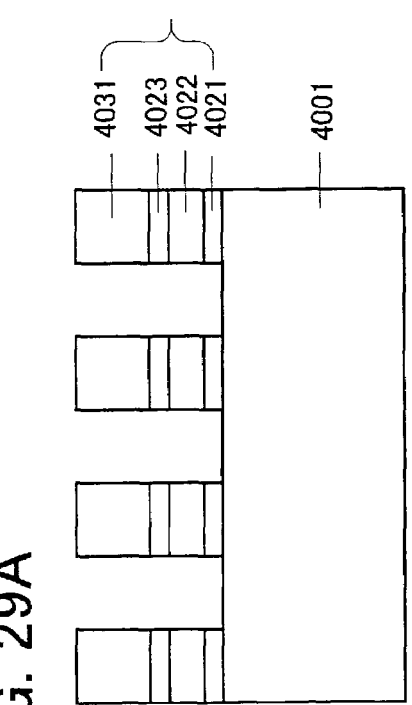
FIG. 29 is a series of sectional views showing the steps of fabricating a Group III nitride compound semiconductor according to a twenty-fifth embodiment of the present invention.
Figure 29C:
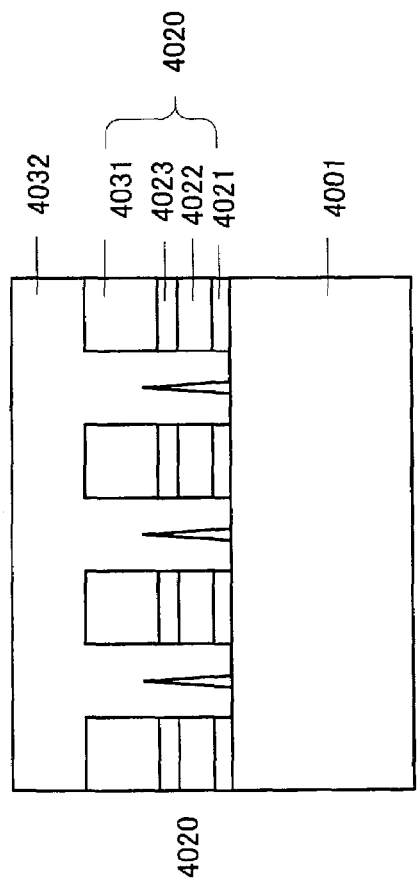
Figure 29B:
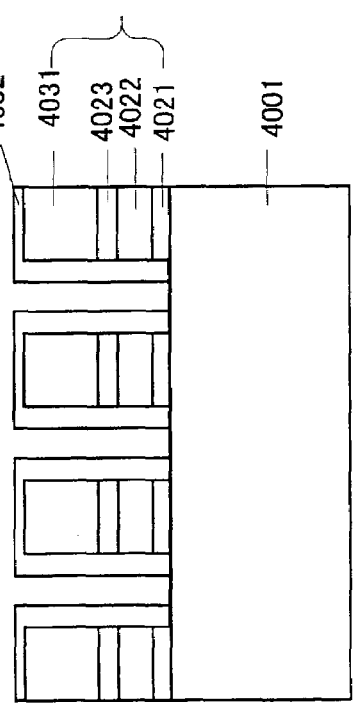
Figure 29D:
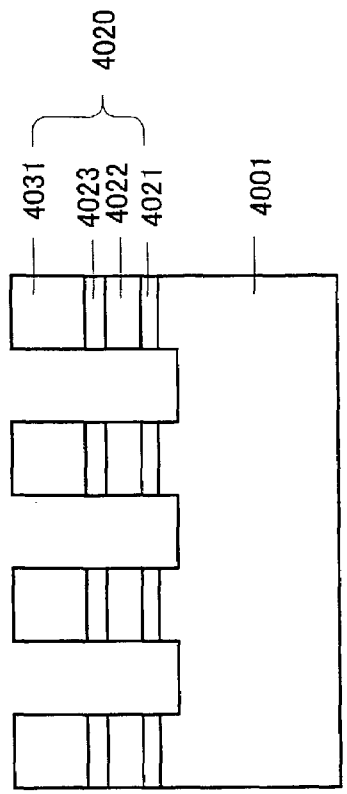

In the sixteenth to twenty-third embodiments, it may be a useful alternative to etch the regions of the second GaN layer 3032 where threading dislocation is not reduced, followed by lateral epitaxial growth of a GaN layer. FIG. 28 schematically shows locations of the first GaN:In layer 3031 and the second GaN layer 3032 to be etched. As shown in FIG. 28A, etching is performed in the form of stripes so as to form mesas of the GaN:In layer 3031 (hatched in FIG. 28) and trenches denoted by letter B. As shown in FIG. 28B, etching is performed in the form of stripes so as to form trenches denoted by letter A and mesas of the GaN layer 3032 which fill the trenches denoted by letter B in FIG. 28A. While the thus-formed mesas of the second GaN layer 3032 serve as nuclei, a GaN layer 3033 is formed through lateral epitaxial growth. As a result, as shown in FIG. 28C, there are formed regions denoted by reference numeral 3031 where threading dislocation is propagated from the GaN:In layer 3031, regions denoted by reference numeral 3032 which are upper portions of the GaN layer 3032 formed through lateral epitaxial growth and where threading dislocation is suppressed, and regions denoted by reference numeral 3033 which are upper portions of the GaN layer 3033 formed through lateral epitaxial growth and where threading dislocation is suppressed. Thus, regions of reduced threading dislocation can be formed over the substantially entire surface of a wafer. Notably, the depth of etching of the GaN layer 3032 is not particularly limited. Similarly, a Group III nitride compound semiconductor substrate in which threading dislocation is suppressed over the entire surface thereof can be obtained. Notably, when the GaN layer 3033 is to be laterally grown while mesas of the GaN layer 3032 formed through etching serve as nuclei, the present invention is not limited to the lateral overgrowth process described herein. For example, a mask may be formed on the bottoms of trenches so as to shut off vertical growth from the bottom, to thereby enhance reliability of lateral overgrowth.

[Twenty-Fifth Embodiment]

FIG. 29 shows the steps of the present embodiment. A monocrystalline sapphire substrate 4001 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 µmol/min) were supplied for approximately 3 minutes to thereby form, on the sapphire substrate 4001, a first AlN layer (first buffer layer) 4021 having a thickness of approximately 40 nm. Next, while the temperature of the sapphire substrate 4001 was maintained at 1000° C., $H_2$ (20 L/min), $NH_3$ (10 L/min), and TMG (300 µmol/min) were introduced to thereby form a GaN layer (intermediate layer) 4022 having a thickness of approximately 0.3 µm. Next, the temperature was dropped to 400° C., and $H_2$ (10 L/min), $NH_3$ (5 L/min), and TMA (20 µmol/min) were supplied for approximately 3 minutes to thereby form a second AlN layer (second buffer layer) 4023 having a thickness of approximately 40 nm. Next, while the temperature of the sapphire substrate 4001 was maintained at 1000° C., $H_2$ (20 L/min), $NH_3$ (10 L/min), and TMG (300 µmol/min) were introduced to thereby form a GaN layer 4031 having a thickness of approximately 1 µm. Thus was formed an underlying layer 4020 comprising the first AlN layer (first buffer layer) 4021 having a thickness of approximately 40 nm, the GaN layer (intermediate layer) 4022 having a thickness of approximately 0.3 µm, the second AlN layer (second buffer layer) 4023 having a thickness of approximately 40 nm, and the GaN layer 4031 having a thickness of approximately 1 µm. Generally, a buffer layer is amorphous and an intermediate layer is monocrystalline. Repetitions of a buffer layer and an intermediate layer may be formed, and the number of repetitions is not particularly limited. The greater the number of repetitions, the greater the improvement in crystallinity.

Next, by use of a hard bake resist mask, stripe-shaped trenches each having a width of 1 µm and a depth of 1.4 µm were selectively dry-etched at intervals of 1 µm by reactive ion beam etching (RIE). As a result, mesas of the underlying layer 4020 each having a width of 1 µm and a height of 1.4 µm and trenches each having a width of 1 µm and having the substrate 4001 exposed at the bottom thereof were alternatingly formed (FIG. 29). At this time, the {11-20} planes of the GaN layer 4031 were caused to serve as the sidewalls of the trenches of a depth of 1.4 µm.

Next, while the temperature of the sapphire substrate 4001 was maintained at 1150° C., $H_2$ (20 L/min), $NH_3$ (10 L/min), and TMG (5 µmol/min) were introduced to thereby form a GaN layer 4032 through lateral epitaxial growth performed while the sidewalls of the trenches of a depth of 1.4 µm; i.e., the {11-20} planes of the underlying layer 4020, serve as nuclei. At this time, vertical epitaxial growth partially took place from the top surfaces of the mesas. Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 µmol/min) were introduced to thereby grow the GaN layer 4032 such that the total thickness of the GaN layer 4031 and the GaN layer 4032 becomes 2 µm. In contrast to portions of the GaN layer 4032 formed above the top surfaces of the mesas, portions of the GaN layer 4032 formed above the bottoms of the trenches extending as deep as 1.4 µm through the GaN layer 4031 exhibited significant suppression of threading dislocation, for the following reason. Since GaN is unlikely to grow on the sapphire substrate 4001 at high temperature, the GaN layer 4032 grows while the underlying layer 4020, particularly the GaN layer 4031, which forms the mesas, primarily serves as a nucleus. Also, the GaN layer 4031, which forms the mesas, can be rendered thin.

[Twenty-Sixth Embodiment]

An underlying layer substantially similar to that of the twenty-fifth embodiment was trenched through etching such that the second AlN layer (second buffer layer) 4023 is exposed at the bottoms of the trenches, followed by lateral epitaxial growth. FIG. 30 shows the steps of the process. As in the case of the twenty-fifth embodiment, a first AlN layer (first buffer layer) 4021 having a thickness of approximately 40 nm, a GaN layer (intermediate layer) 4022 having a thickness of approximately 0.3 µm, a second AlN layer (second buffer layer) 4023 having a thickness of approximately 40 nm, and a GaN layer 4031 having a thickness of approximately 2 µm were formed to thereby constitute an underlying layer 4020.

Next, by use of a hard bake resist mask, stripe-shaped trenches each having a width of 1 µm and a depth of 2 µm were selectively dry-etched at intervals of 1 µm by reactive ion beam etching (RIE). As a result, mesas of the GaN layer 4031 each having a width of 1 µm and a height of 2 µm and trenches each having a width of 1 µm and having the second AlN layer (second buffer layer) exposed at the bottom thereof were alternatingly formed (FIG. 30). At this time, the {11-20} planes of the GaN layer 4031 were caused to serve as the sidewalls of the trenches of a depth of 2 µm.

Next, while the temperature of the sapphire substrate 1 was maintained at 1150° C., $H_2$ (20 L/min), $NH_3$ (10 L/min), and TMG (5 µmol/min) were introduced to thereby form a GaN layer 4032 through lateral epitaxial growth performed while the sidewalls of the trenches of a depth of 2 µm; i.e., the {11-20} planes of the GaN layer 4031, serve as nuclei. At this time, vertical epitaxial growth partially took place from the top surfaces of the mesas and from the bottoms of the trenches. Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 µmol/min) were introduced to thereby grow the GaN layer 4032 such that the total thickness of the GaN layer 4031 and the GaN layer 4032 becomes 3 µm. In contrast to portions of the GaN layer 4032 formed above the top surfaces of the mesas, portions of the GaN layer 4032 formed above the bottoms of the trenches extending as deep as 2 µm through the GaN layer 4031 exhibited significant suppression of threading dislocation.

[Twenty-Seventh Embodiment]

An underlying layer substantially similar to that of the twenty-sixth embodiment was trenched through etching such that the bottoms of the trenches are formed in the GaN layer 4031, followed by lateral epitaxial growth. FIG. 31 shows the steps of the process. As in the case of the twenty-sixth embodiment, a first AlN layer (first buffer layer) 4021 having a thickness of approximately 40 nm, a GaN layer (intermediate layer) 4022 having a thickness of approximately 0.3 µm, a second AlN layer (second buffer layer) 4023 having a thickness of approximately 40 nm, and a GaN layer 4031 having a thickness of approximately 3 µm were formed to thereby constitute an underlying layer 4020.

Next, by use of a hard bake resist mask, stripe-shaped trenches each having a width of 1 µm and a depth of 2 µm were selectively dry-etched at intervals of 1 µm by reactive ion beam etching (RIE). As a result, mesas of the GaN layer 4031 each having a width of 1 µm and a height of 2 µm and trenches each having a width of 1 µm and formed in the GaN layer 4031 were alternatingly formed (FIG. 31). At this time, the {11-20} planes of the GaN layer 4031 were caused to serve as the sidewalls of the trenches of a depth of 2 µm.

Next, while the temperature of the sapphire substrate 4001 was maintained at 1150° C., $H_2$ (20 L/min), $NH_3$ (10 L/min), and TMG (5 µmol/min) were introduced to thereby form a GaN layer 4032 through lateral epitaxial growth performed while the sidewalls of the trenches of a depth of 2.3 µm; i.e., the {11-20} planes of the underlying layer 4020, serve as nuclei. At this time, vertical epitaxial growth partially took place from the top surfaces of the mesas and from the bottoms of the trenches. Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 µmol/min) were introduced to thereby grow the GaN layer 4032 such that the total thickness of the GaN layer 4031 and the GaN layer 4032 becomes 4 µm. In contrast to portions of the GaN layer 4032 formed above the top surfaces of the mesas, portions of the GaN layer 4032 formed above the bottoms of the trenches extending by a depth of 2 µm into the GaN layer 4031 exhibited significant suppression of threading dislocation.

[Twenty-Eighth Embodiment]

Figure 32A:
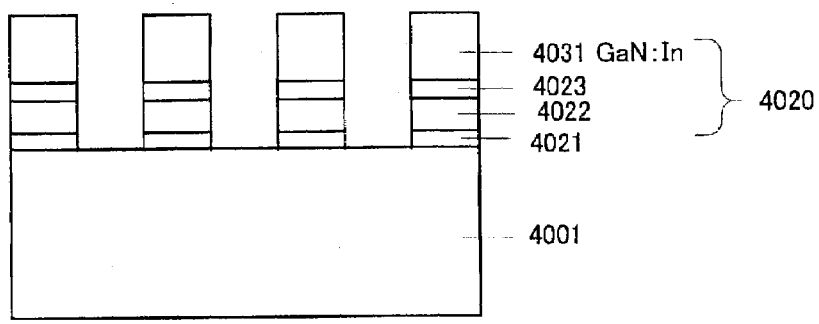
FIG. 32 is a series of sectional views showing the steps of fabricating a Group III nitride compound semiconductor according to a twenty-eighth embodiment of the present invention.
Figure 32B:
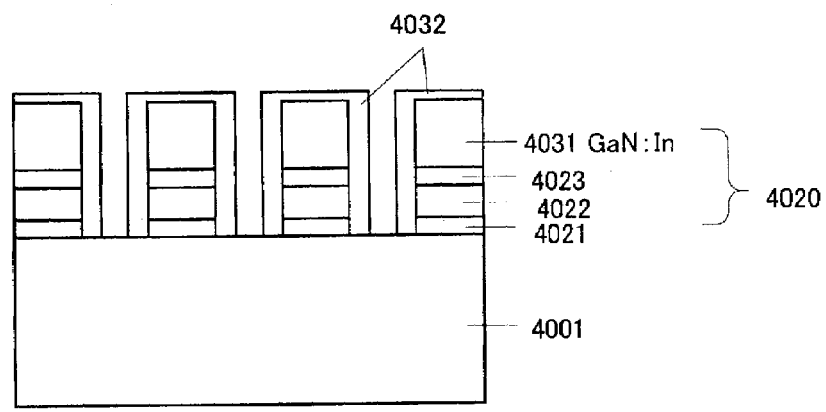
Figure 32C:
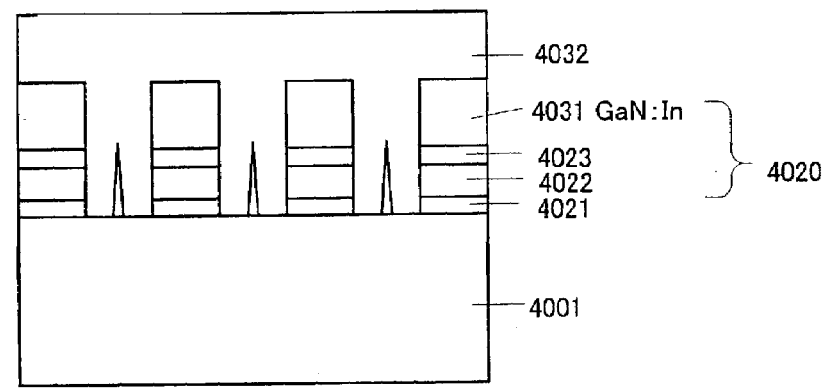

According to the present embodiment, the twenty-fifth embodiment was modified such that, in formation of the GaN layer 4031, the GaN layer 4031 was doped with TMI to become a GaN:In layer 4031. The dosage of indium (In) was approximately $1 \times 10^{16}/cm^3$. Subsequently, etching and lateral epitaxial growth of GaN were performed in a manner substantially similar to that of the twenty-fifth embodiment (FIG. 32). The GaN layer 4032 which was laterally grown while the GaN:In layer 4031 featuring good crystallinity primarily served as a nucleus exhibited a slightly lower degree of threading dislocation than did the twenty-fifth embodiment. Portions of the GaN layer 4032 grown vertically above the GaN:In layer 4031 exhibited threading dislocation reduced to approximately 1/100 that of the twenty-fifth embodiment.

[Twenty-Ninth Embodiment]

Figure 33:
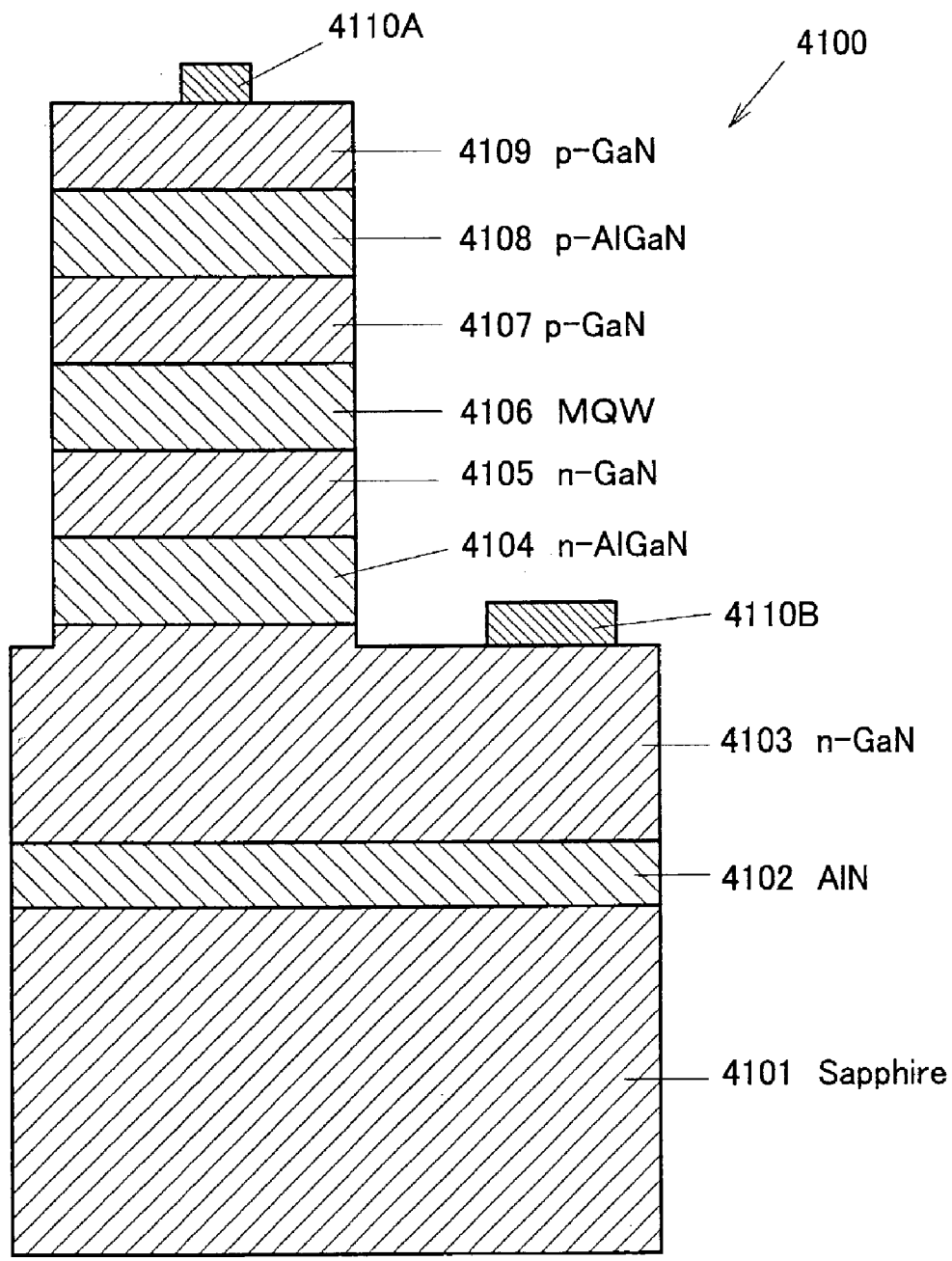
FIG. 33 is a sectional view showing the structure of a Group III nitride compound semiconductor light-emitting device according to a twenty-ninth embodiment of the present invention.

On a wafer formed in a manner similar to that of the twenty-fifth embodiment, a laser diode (LD) 4100 shown in FIG. 33 was formed in the following manner. Notably, in formation of the GaN layer 4032, silane ($SiH_4$) was introduced so as to form a silicon (Si)-doped n-type GaN layer serving as the GaN layer 4032. For the sake of simplified illustration, the drawing merely illustrates a GaN layer 4103 to inclusively represent the GaN layer 4031 and the GaN layer 4032.

On a wafer comprising a sapphire substrate 4101, a buffer layer 4102 of AlN, and the two-layered GaN layer 4103 consisting of a GaN layer and an n-type GaN layer, an n-clad layer 4104 of silicon (Si)-doped $Al_{0.08}Ga_{0.92}N$, an n-guide layer 4105 of silicon (Si)-doped GaN, an MQW-structured light-emitting layer 4106, a p-guide layer 4107 of magnesium (Mg)-doped GaN, a p-clad layer 4108 of magnesium (Mg)-doped $Al_{0.08}Ga_{0.92}N$, and a p-contact layer 4109 of magnesium (Mg)-doped GaN were formed. Next, an electrode 4110A of gold (Au) was formed on the p-contact layer 4109. Etching was partially performed until the two-layered GaN layer 4103 consisting of the GaN layer and the n-type GaN layer was exposed. On the exposed GaN layer 4103, an electrode 4110B of aluminum (Al) was formed. The thus-formed laser diode (LD) 4100 exhibited the significant improvement of device life and light-emitting efficiency.

[Thirtieth Embodiment]

Figure 34:
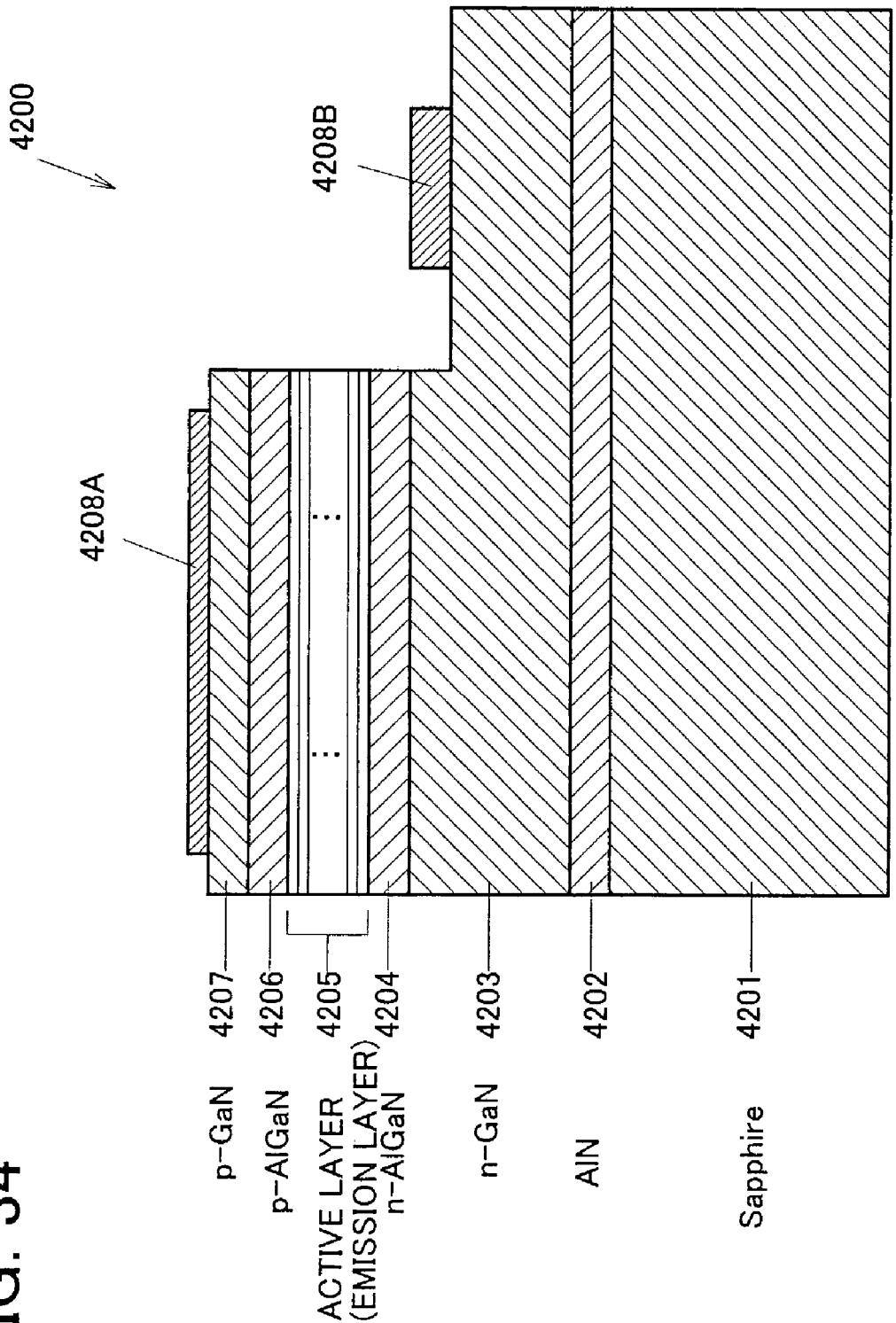
FIG. 34 is a sectional view showing the structure of a Group III nitride compound semiconductor light-emitting device according to a thirtieth embodiment of the present invention.

On a wafer formed in a manner similar to that of the twenty-fifth embodiment, a light-emitting diode (LED) 4200 shown in FIG. 34 was formed in the following manner. Notably, in formation of the GaN layer 4032, silane ($SiH_4$) was introduced so as to form a silicon (Si)-doped n-type GaN layer serving as the GaN layer 4032. For the sake of simplified illustration, the drawing merely illustrates a GaN layer 4203 to inclusively represent the GaN layer 4031 and the GaN layer 4032.

On a wafer comprising a sapphire substrate 4201, a buffer layer 4202 of AlN, and the two-layered GaN layer 4203 consisting of a GaN layer and an n-type GaN layer, an n-clad layer 4204 of silicon (Si)-doped $Al_{0.08}Ga_{0.92}N$, a light-emitting layer 4205, a p-clad layer 4206 of magnesium (Mg)-doped $Al_{0.08}Ga_{0.92}N$, and a p-contact layer 4207 of magnesium (Mg)-doped GaN were formed. Next, an electrode 4208A of gold (Au) was formed on the p-contact layer 4207. Etching was partially performed until the two-layered GaN layer 4203 consisting of the GaN layer and the n-type GaN layer was exposed. On the exposed GaN layer 4203, an electrode 4208B of aluminum (Al) was formed. The thus-formed light-emitting diode (LED) 4200 exhibited the significant improvement of device life and light-emitting efficiency.

[Thirty-First Embodiment]

Figure 35A:
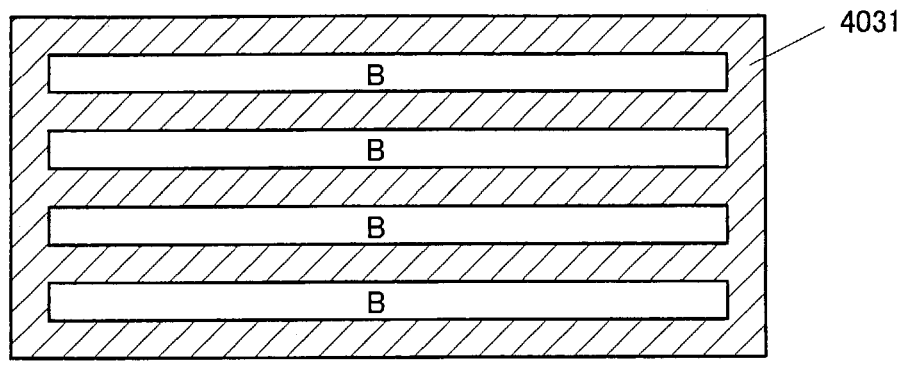
FIG. 35 is a schematic view showing an example of etching of a first Group III nitride compound semiconductor according to a thirty-first embodiment of the present invention.
Figure 35B:
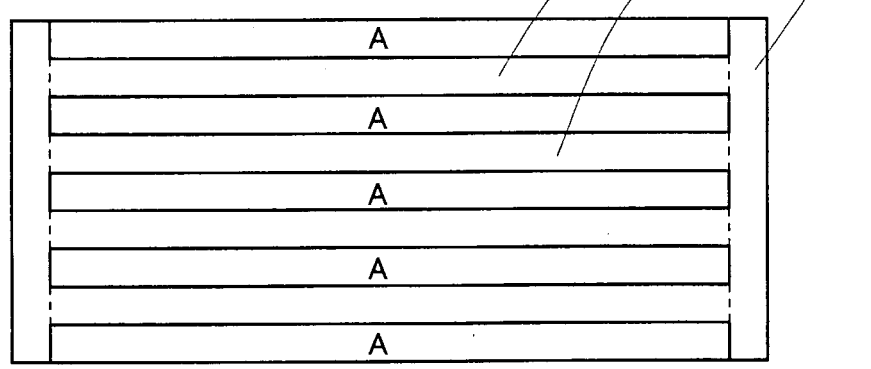
Figure 35C:
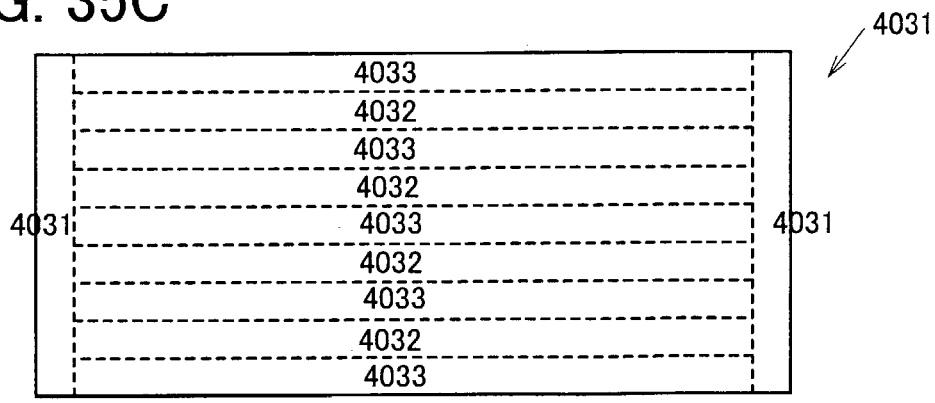
Figure 36:
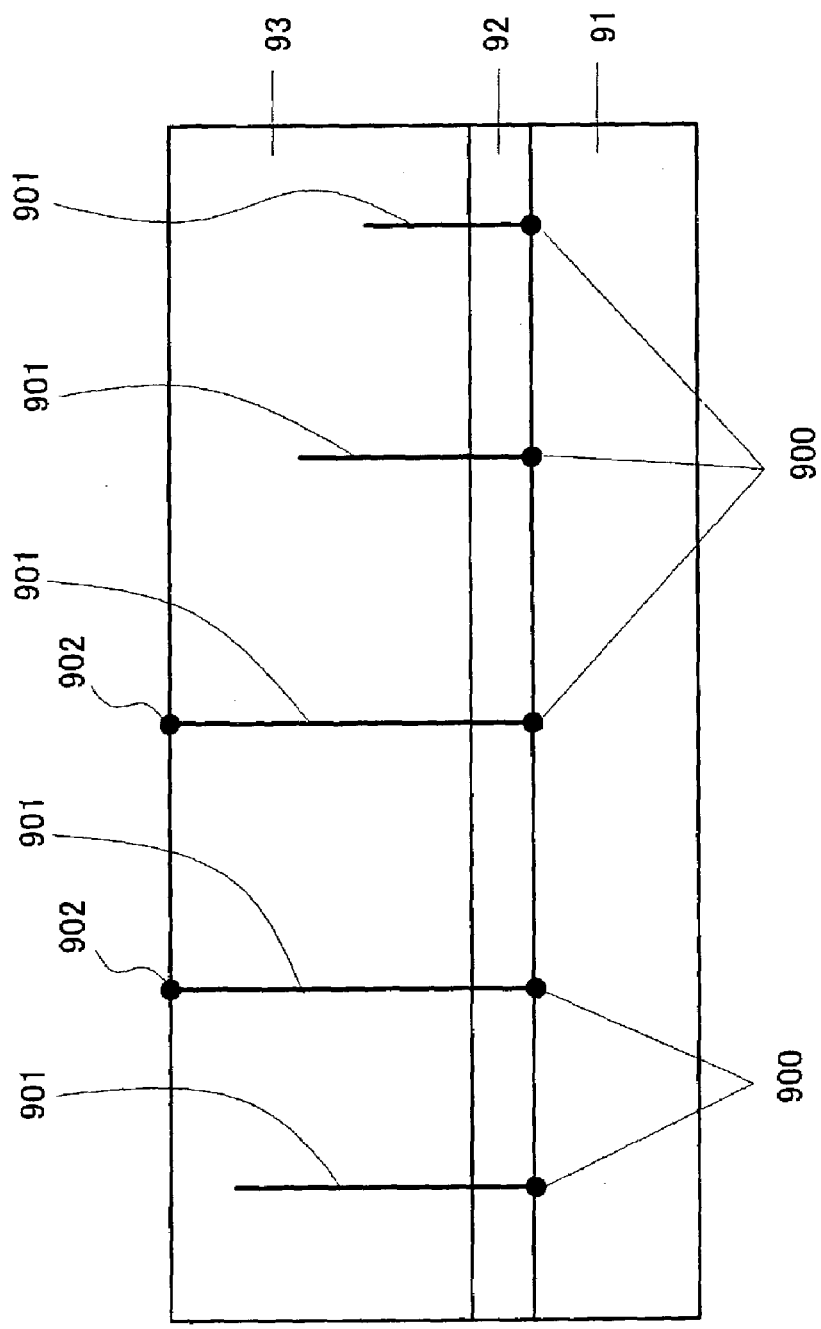
FIG. 36 is a sectional view showing threading dislocations propagating in a Group III nitride compound semiconductor fabricated according to a conventional fabrication method.

It may be useful to further etch the regions of the second GaN layer 4032 where threading dislocation is not reduced, followed by lateral epitaxial growth of a GaN layer. FIG. 35 schematically shows locations of the first GaN:In layer 4031 and the second GaN layer 4032 to be etched. As shown in FIG. 35A, etching is performed in the form of stripes so as to form mesas of the GaN layer 4031 (hatched in FIG. 35) and trenches denoted by letter B. As shown in FIG. 35B, etching is performed in the form of stripes so as to form trenches denoted by letter A and mesas of the GaN layer 4032 which fill the trenches denoted by letter B in FIG. 35A. While the thus-formed mesas of the second GaN layer 4032 serve as nuclei, a GaN layer 4033 is formed through lateral epitaxial growth. As a result, as shown in FIG. 35C, there are formed regions denoted by reference numeral 4031 where threading dislocation is propagated from the GaN layer 4031, regions denoted by reference numeral 4032 which are upper portions of the GaN layer 4032 formed through lateral epitaxial growth and where threading dislocation is suppressed, and regions denoted by reference numeral 4033 which are upper portions of the GaN layer 4033 formed through lateral epitaxial growth and where threading dislocation is suppressed. Thus, regions of reduced threading dislocation can be formed over the substantially entire surface of a wafer. Notably, the depth of etching of the GaN layer 4032 is not particularly limited. The underlying layer having threading dislocation may be etched partially or entirely. When the GaN layer 4032 is formed on the substrate surface through lateral epitaxial growth as in the twenty-fifth embodiment; the underlying layer 4020 which has served as a nucleus during the lateral epitaxial growth is etched; and then the GaN layer 4033 is laterally grown through lateral epitaxial growth performed while regions of suppressed threading dislocation serve as nuclei, the substrate 4001 becomes readily removable, thereby enabling formation of a GaN substrate in which threading dislocation is entirely suppressed. In this manner, a Group III nitride compound semiconductor substrate in which threading dislocation is suppressed over the entire surface thereof can be obtained. Notably, when the GaN layer 4033 is to be laterally grown while mesas of the GaN layer 4032 formed through etching serve as nuclei, the present invention is not limited to the lateral overgrowth process described herein. For example, a mask may be formed on the bottoms of trenches so as to shut off vertical growth from the bottom, to thereby enhance reliability of lateral overgrowth.

The tenth to twenty-fifth embodiments allow formation of island-like mesas by means of three groups of {11-20} planes as shown in FIG. 11. To facilitate understanding, the schematic view of FIG. 11A includes a peripheral region formed by means of three groups of {11-20} planes. In actuality, tens of millions of island-like mesas may be formed per wafer. In FIG. 11A, the area of the bottoms of the trenches B is 3 times the area of the top surfaces of the island-like mesas. In FIG. 11B, the area of the bottoms of the trenches B is 8 times the area of the top surfaces of the island-like mesas.

While the present invention has been described with reference to the above embodiments, the present invention is not limited thereto, but may be modified as appropriate without departing from the spirit of the invention.

The entire disclosures and contents of Japanese Patent Application Nos. 2000-71351, 2000-71352, 2000-71353, and 2000-99950, from which the present invention claims convention priority, are incorporated herein by reference.

The invention claimed is:

1. A method for fabricating a Group III nitride compound semiconductor through epitaxial growth thereof on a main plane of a substrate, which comprises:
    etching a base layer which comprises at least one layer of a Group III nitride compound semiconductor, an uppermost layer of the base layer comprising a first Group III nitride compound semiconductor, to thereby form an island-like structure having at least one of a dot-like structure, a stripe-shaped structure, and a grid-like structure, so as to provide a trench and a mesa such that a plane of a different layer, from first Group III nitride compound semiconductor, parallel to said main plane of said substrate, the different layer being formed of a third Group III nitride compound semiconductor having a composition different from that of the first Group III nitride compound semiconductor, is exposed at a bottom portion of the trench; and
    epitaxially growing, vertically and laterally, above said base layer, a second Group III nitride compound semiconductor, with a top surface of the mesa and at least one sidewall of the trench each serving as a nucleus, the mesa and the trench being formed by etching the first Group III nitride compound semiconductor so as to form an island-like structure having at least one of a dot-like structure, a stripe-shaped structure, and a grid-like structure.

2. A method for fabricating a Group III nitride compound semiconductor according to claim 1, wherein the width of the bottom portion of the trench is determined such that lateral growth from the at least one sidewall proceeds faster than vertical growth at the surface of the different layer.

3. A method for fabricating a Group III nitride compound semiconductor according to claim 1, wherein substantially all of the at least one sidewall of the trench assume a {11-20} plane.

4. A method for fabricating a Group III nitride compound semiconductor according to claim 1, wherein the first Group III nitride compound semiconductor and the second Group III nitride compound semiconductor have the same composition.

5. A method for fabricating a Group III nitride compound semiconductor according to claim 1, wherein said different layer comprises a Group III nitride compound semiconductor having a general formula of $Al_xGa_yIn_{1-x-y}N$ ($0 \leq x \leq 1$, $0 \leq y \leq 1$, $0 \leq x+y \leq 1$).

6. A method for fabricating a Group III nitride compound semiconductor according to claim 1, wherein said different layer comprises a Group III nitride compound semiconductor having a general formula of $Al_xGa_{1-x}N$ ($0 \leq x \leq 1$).

7. A method for fabricating a Group III nitride compound semiconductor according to claim 1, wherein said different layer comprises a multi-component layer.

8. A method for fabricating a Group III nitride compound semiconductor according to claim 7, wherein said different layer comprises alternating layers of $Al_xGa_{1-x}N$ ($0 \leq x \leq 1$) layers and GaN layers.

9. A method for fabricating a Group III nitride compound semiconductor according to claim 7, wherein said multi-component layer comprises at least three different types of Group III nitride compound semiconductors.

10. A method for fabricating a Group III nitride compound semiconductor according to claim 1, wherein at least one of said different layer and said Group III nitride compound semiconductor is doped with indium (In).

* * * * *

UNITED STATES PATENT AND TRADEMARK OFFICE
CERTIFICATE OF CORRECTION

PATENT NO.        : 7,141,444 B2
APPLICATION NO.   : 10/221486
DATED             : November 28, 2006
INVENTOR(S)       : Masayoshi Koike et al.

It is certified that error appears in the above-identified patent and that said Letters Patent is hereby corrected as shown below:

On Title page and Col. 1, Line 1 should read
METHOD FOR FABRICATING GROUP III NITRIDE COMPOUND SEMICONDUCTORS AND GROUP III NITRIDE COMPOUND SEMICONDUCTOR DEVICES Signed and Sealed this Sixth Day of March, 2007

JON W. DUDAS
*Director of the United States Patent and Trademark Office*